US012035534B2

(12) United States Patent
Wu et al.

(10) Patent No.: US 12,035,534 B2
(45) Date of Patent: Jul. 9, 2024

(54) THREE-DIMENSIONAL MEMORY ARRAY WITH LOCAL LINE SELECTOR

(71) Applicant: Taiwan Semiconductor Manufacturing Company, Ltd., Hsinchu (TW)

(72) Inventors: Chen-Jun Wu, Hsinchu (TW); Yu-Wei Jiang, Hsinchu (TW); Sheng-Chih Lai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/308,031

(22) Filed: Apr. 27, 2023

(65) Prior Publication Data
US 2023/0262985 A1   Aug. 17, 2023

Related U.S. Application Data

(62) Division of application No. 17/168,317, filed on Feb. 5, 2021, now Pat. No. 11,672,123.

(51) Int. Cl.
*H10B 43/35*    (2023.01)
*H01L 23/522*   (2006.01)
*H10B 41/27*    (2023.01)
*H10B 41/35*    (2023.01)
*H10B 43/27*    (2023.01)

(52) U.S. Cl.
CPC ......... *H10B 43/35* (2023.02); *H01L 23/5226* (2013.01); *H10B 41/27* (2023.02); *H10B 41/35* (2023.02); *H10B 43/27* (2023.02)

(58) Field of Classification Search
None
See application file for complete search history.

(56) References Cited

U.S. PATENT DOCUMENTS 8,630,114 B2   1/2014  Lue
9,905,307 B1*  2/2018  Ghai ..................... H10B 63/84
(Continued)

OTHER PUBLICATIONS

Micheloni et al. "Architectural and Integration Options for 3D NAND Flash Memories" Computers 2017, 6, 27; doi:10.3390/computers6030027. Published on Aug. 10, 2017.
(Continued)

*Primary Examiner* — Hsien Ming Lee
(74) *Attorney, Agent, or Firm* — Eschweiler & Potashnik, LLC

(57) ABSTRACT

The present disclosure relates to an integrated chip including a three-dimensional memory array. The three-dimensional memory array includes a first local line and a second local line that are elongated vertically, a first memory cell extending between the first local line and the second local line, and a second memory cell directly under the first memory cell, extending between the first local line and the second local line, and coupled in parallel with the first memory cell. The first memory cell is coupled to a first word line and the second memory cell is coupled to a second word line. The first word line and the second word line are elongated horizontally. A first global line is disposed at a first height and is elongated horizontally. A first selector extends vertically from the first local line to the first global line.

20 Claims, 41 Drawing Sheets

(56) References Cited

U.S. PATENT DOCUMENTS

| 10,014,318 B2 | 7/2018 | Or-Bach et al. |
| 2021/0226027 A1 | 7/2021 | Huang et al. |

OTHER PUBLICATIONS

Ex-Parte Quayle Office Action dated Dec. 16, 2022 for U.S. Appl. No. 17/168,317.
Notice of Allowance dated Feb. 1, 2023 for U.S. Appl. No. 17/168,317.

* cited by examiner

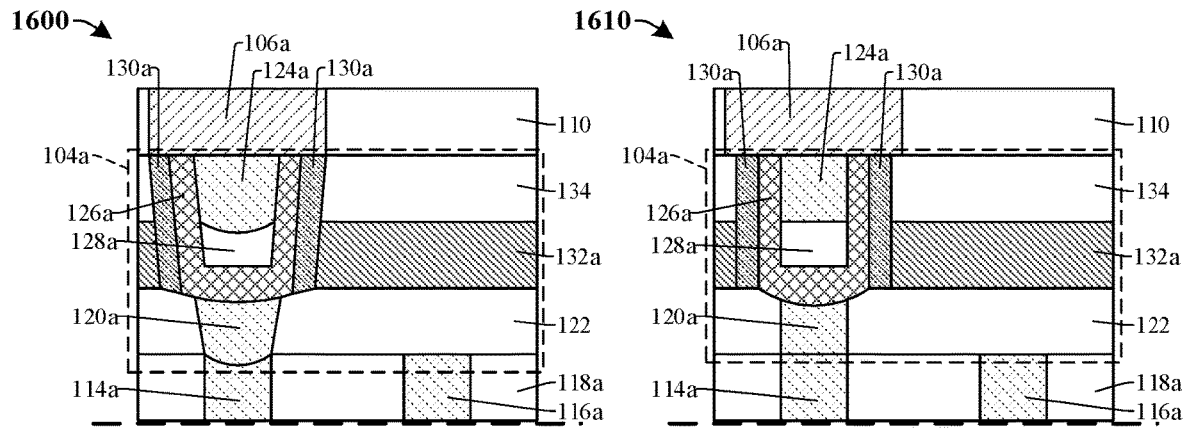
Fig. 16A  Fig. 16B
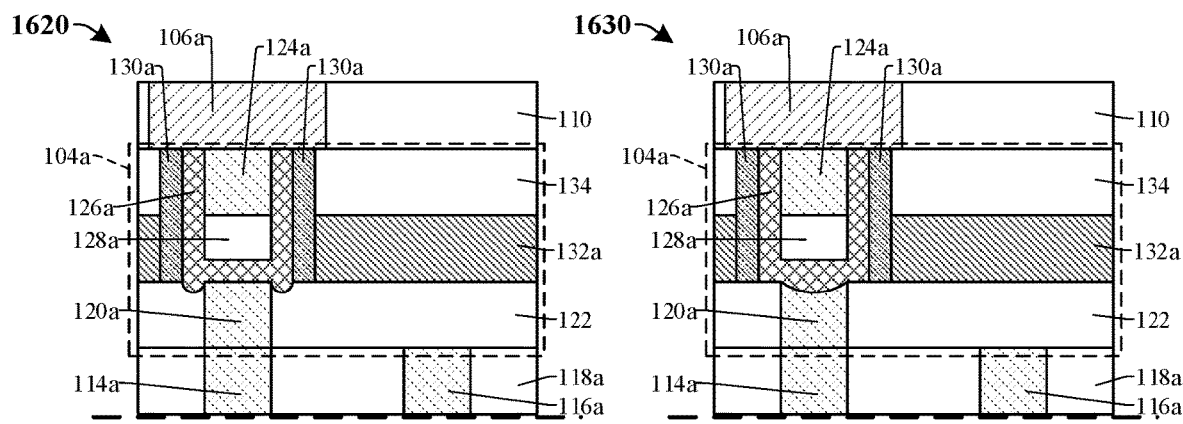
Fig. 16C  Fig. 16D

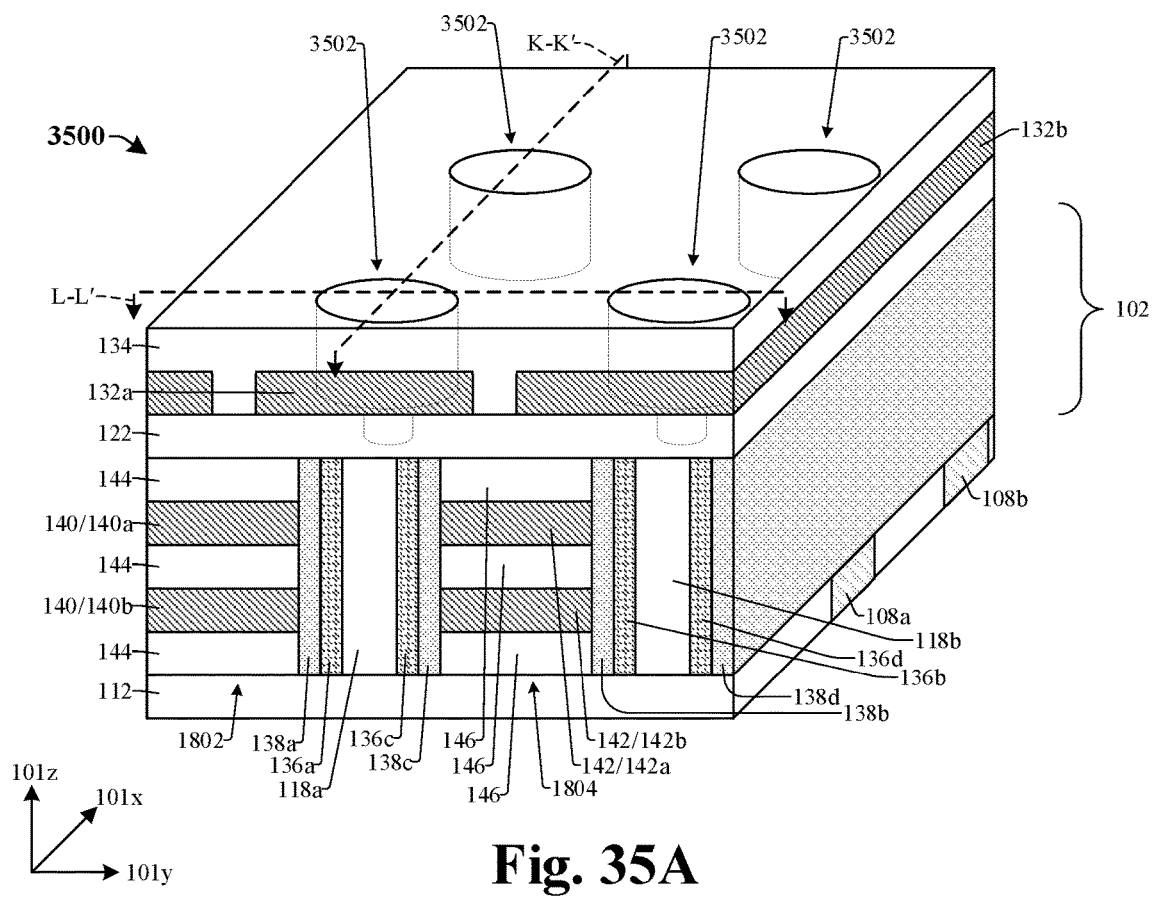
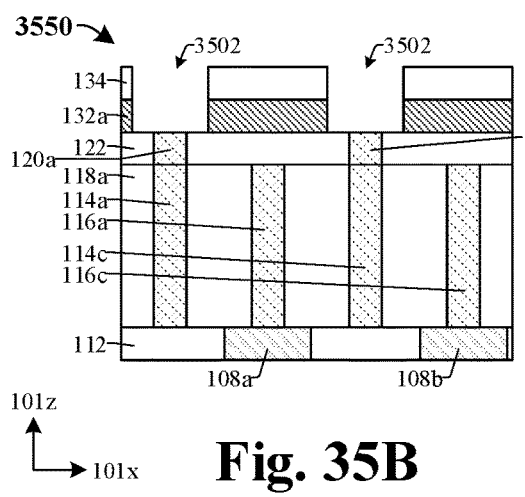
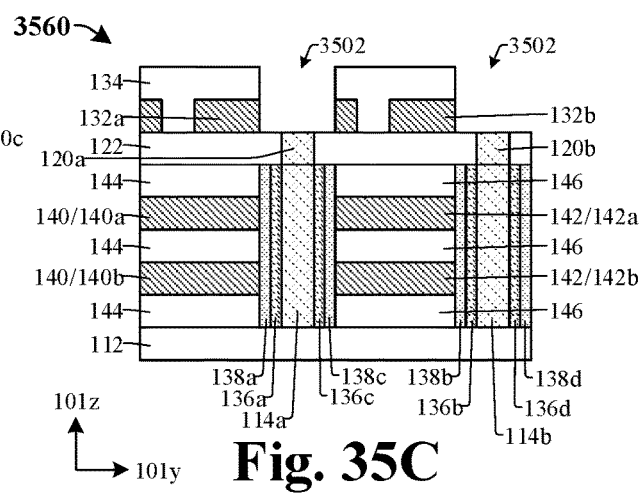
Fig. 35A
Fig. 35B
Fig. 35C

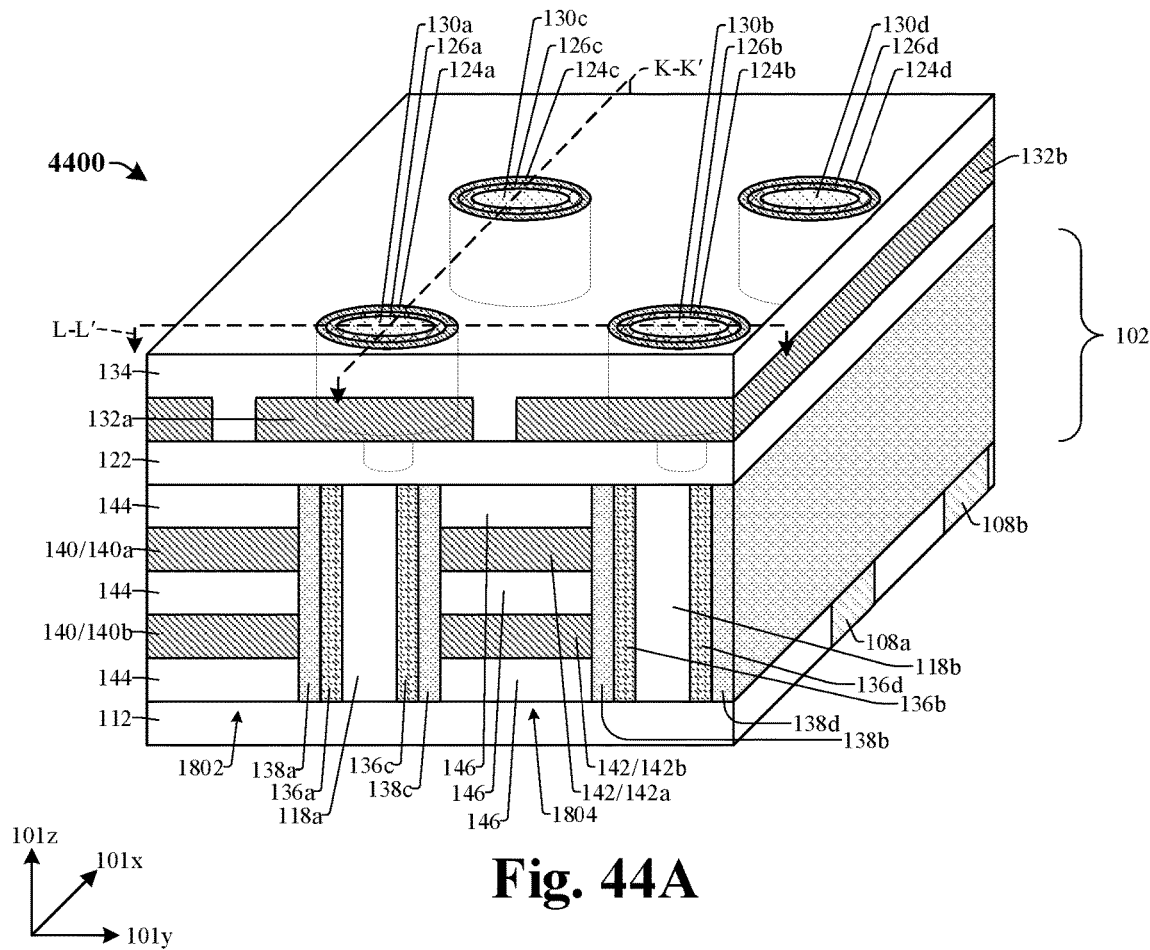
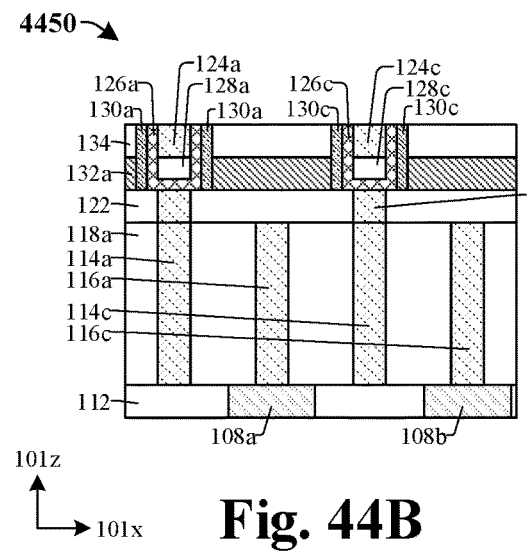 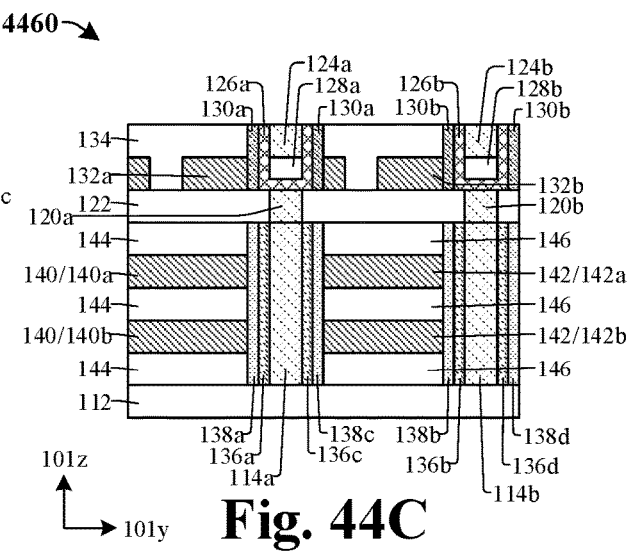
Fig. 44A
Fig. 44B  Fig. 44C

THREE-DIMENSIONAL MEMORY ARRAY WITH LOCAL LINE SELECTOR

REFERENCE TO RELATED APPLICATION

This Application is a Divisional of U.S. application Ser. No. 17/168,317, now U.S. Pat. No. 11,672,123, filed on Feb. 5, 2021, the contents of which are hereby incorporated by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16A-D illustrate cross-sectional views of some alternative embodiments of the first bit line selector of FIG. 2.

DETAILED DESCRIPTION

Figure 1A:
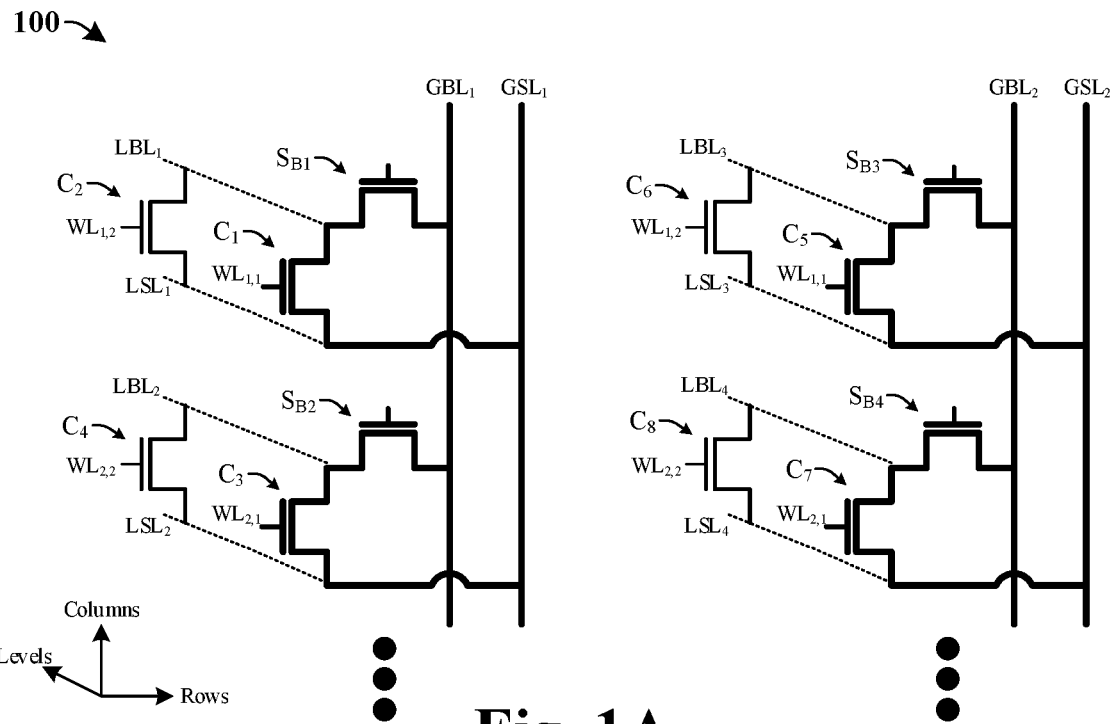
FIG. 1A illustrates a diagram of some embodiments of an integrated chip comprising a three-dimensional memory array and a first bit line selector that extends between a first local bit line and a first global bit line.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include three-dimensional memory arrays. A three-dimensional memory array may include a plurality of memory cells arranged in a plurality of rows, a plurality of columns, and a plurality of levels. For example, the memory array may include a first stack of memory cell devices arranged across the plurality of levels and coupled in parallel. Memory cells of the first stack of memory cells may extend between a first local bit line and a first local source line. The memory array may also include a second stack of memory cells arranged across the plurality of levels and coupled in parallel. Memory cells of the second stack of memory cells may extend between a second local bit line and a second local source line. The first local bit line and the second local bit line may both be coupled to a global bit line. The first local source line and the second local source line may both be coupled to a global source line.

A challenge with the three-dimensional memory array is that a global bit line and a global source line may be connected to large numbers of local bit lines and local source lines, respectively. As a result, the global bit line and the global source line may collect capacitance and/or leakage current from a large number of local bit lines and a large number of local source lines, respectively, even when the local bit lines and/or local source lines are not in use (e.g., not being used to perform a read operation, a write operation, or the like). As a result, performance (e.g., speed, power consumption, etc.) of the three-dimensional memory may be reduced.

Various embodiments of the present disclosure are related to an integrated chip comprising a first bit line selector arranged over a first local bit line of a three-dimensional memory array for improving performance of the integrated chip. The three-dimensional memory array comprises a first stack of memory cells arranged across a plurality of levels and coupled in parallel. Memory cells of the first stack of memory cells extend between a first local bit line and a first local source line. The first bit line selector extends vertically between the first local bit line and a first global bit line.

By including the selector in the integrated chip between the first global bit line and the first local bit line, the first local bit line may be selectively decoupled from the first global bit line. Thus, the first bit line selector may prevent capacitance and/or leakage current of the first local bit line from collecting at and affecting the first global bit line when the first local bit line is not in use. For example, a leakage current at the first local bit line may be isolated from the first global line when the first local bit line is not in use by setting the first bit line selector to an "OFF" state. As a result, performance of the integrated chip may be improved.

FIG. 1A illustrates a diagram 100 of some embodiments of an integrated chip comprising a three-dimensional memory array and a first bit line selector $S_{B1}$ that extends between a first local bit line $LBL_1$ and a first global bit line $GBL_1$.

The three-dimensional memory array comprises a plurality of memory cells (e.g., $C_1$, $C_2$, etc.) arranged in rows and columns on a plurality of levels. In other words, the three-dimensional memory array comprises an array of a first plurality of rows and a first plurality of columns on a first level of the plurality of levels, a second plurality of rows and a second plurality of columns on a second level of the plurality of levels, and so on.

For example, a first memory cell $C_1$ is in a first row and a first column of a first level, and a second memory cell $C_2$ is in a first row and a first column of a second level. The first memory cell $C_1$ and the second memory cell $C_2$ are coupled in parallel between the first local bit line $LBL_1$ and a first local source line $LSL_1$.

A third memory cell $C_3$ is in a second row and the first column of the first level, and a fourth memory cell $C_4$ is in a second row and the first column of the second level. The third memory cell $C_3$ and the fourth memory cell $C_4$ are coupled in parallel between a second local bit line $LBL_2$ and a second local source line $LSL_2$.

A fifth memory cell $C_5$ is in the first row and a second column of the first level, and a sixth memory cell $C_6$ is in the first row and a second column of the second level. The fifth memory cell $C_5$ and the sixth memory cell $C_6$ are coupled in parallel between a third local bit line $LBL_3$ and a third local source line $LSL_3$.

A seventh memory cell $C_7$ is in the second row and the second column of the first level, and an eighth memory cell $C_8$ is in the second row and the second column of the second level. The seventh memory cell $C_7$ and the eighth memory cell $C_8$ are coupled in parallel between a fourth local bit line $LBL_4$ and a fourth local source line $LSL_4$.

A first word line of the first level $WL_{1,1}$ extends along the first row of the first level from a gate of the first cell $C_1$ to a gate of the fifth cell $C_5$. A second word line of the first level $WL_{2,1}$ extends along the second row of the first level from a gate of the third cell $C_3$ to a gate of the seventh cell $C_7$. A first word line of the second level $WL_{1,2}$ extends along the first row of the second level from a gate of the second cell $C_2$ to a gate of the sixth cell $C_6$. A second word line of the second level $WL_{2,2}$ extends along the second row of the second level from a gate of the fourth cell $C_4$ to a gate of the eighth cell $C_8$. In other words, the gate of the first cell $C_1$ is coupled to the gate of the fifth cell $C_5$, the gate of the second cell is coupled to the gate of the sixth cell $C_6$, the gate of the third cell $C_3$ is coupled to the gate of the seventh cell $C_7$, and the gate of the fourth cell $C_4$ is coupled to the gate of the eighth cell $C_8$.

The first bit line selector $S_{B1}$ extends between the first local bit line $LBL_1$ and the first global bit line $GBL_1$. A second bit line selector $S_{B2}$ extends between the second local bit line $LBL_2$ and the first global bit line $GBL_1$. A third bit line selector $S_{B3}$ extends between the third local bit line $LBL_3$ and a second global bit line $GBL_2$. A fourth bit line selector $S_{B4}$ extends between the fourth local bit line $LBL_4$ and the second global bit line $GBL_2$.

The bit line selectors (e.g., $S_{B1}$-$S_{B4}$) are configured to selectively decouple (i.e., isolate) their respective local bit lines from their respective global bit lines. Thus, the bit line selectors may prevent capacitance and/or leakage current of the local bit lines from collecting at and affecting the global bit lines when the local bit lines are not in use. For example, a leakage current of the first local bit line $LBL_1$ may be isolated from the first global bit line $GBL_1$ when the first local bit line $LBL_1$ is not in use by setting the first bit line selector $S_{B1}$ to an "OFF" state. Likewise, a leakage current of the second local bit line $LBL_2$ may be isolated from the first global bit line $GBL_1$ when the second local bit line $LBL_2$ is not in use by setting the second bit line selector $S_{B2}$ to an "OFF" state, and so on. As a result, performance of the integrated chip may be improved.

In some embodiments, the local source lines (e.g., $LSL_1$-$LSL_4$) are directly coupled to their respective global source lines (e.g., $GSL_1$ and $GSL_2$), as illustrated in FIG. 1.

Further, in some embodiments, a gate of the first bit line selector $S_{B1}$ is coupled to a gate of the third bit line selector $S_{B3}$, and a gate of the second bit line selector $S_{B2}$ is coupled to a gate of the fourth bit line selector $S_{B4}$.

In some embodiments, the first level is directly over the second level. Although FIG. 1A illustrates the three-dimensional memory array as having two rows and two columns on two levels, it will be appreciated that in some embodiments, some other number of rows, columns, and levels may be feasible. For example, in some embodiments, the array may alternatively comprise eight rows and eight columns on eight levels.

In some embodiments, the three-dimensional memory array may, for example, be or comprise a three-dimensional NOR memory array or the like. In some embodiments, the selectors may, for example, be or comprise gate-all-around transistors or some other suitable type of selector devices.

Although selectors $S_{B1}$-$S_{B4}$ are referred to as bit line selectors and extend between the local bit lines and the global bit lines, it will be appreciated that in some alternative embodiments, the selectors $S_{B1}$-$S_{B4}$ may alternatively be source line selectors that extend between the local source lines and the global source lines.

Figure 1B:
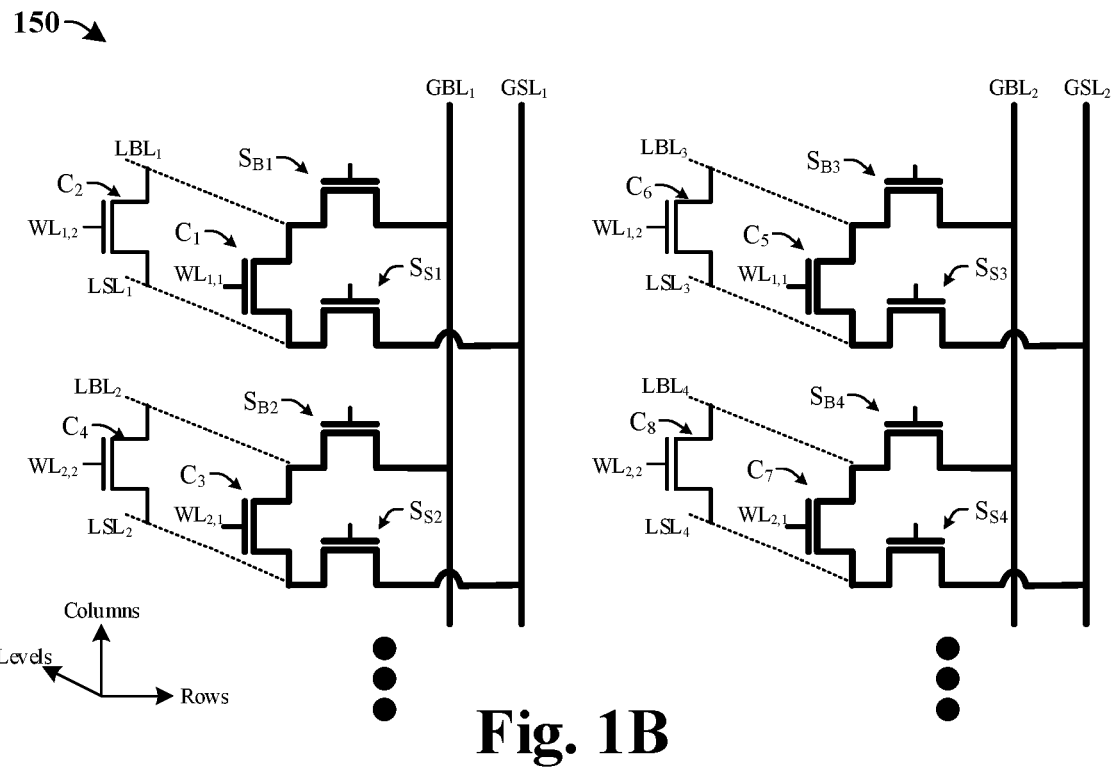
FIG. 1B illustrates a diagram of some embodiments of the integrated chip of FIG. 1A in which a first source line selector extends between a first local source line and a first global source line.

FIG. 1B illustrates a diagram 150 of some embodiments of the integrated chip of FIG. 1A in which a first source line selector $S_{S1}$ extends between the first local source line $LSL_1$ and the first global source line $GSL_1$.

In such embodiments, source line selectors (e.g., $S_{S1}$-$S_{S4}$) may be arranged between the local source lines (e.g., $LSL_1$-$LSL_4$) and the global source lines (e.g., $GSL_1$ and $GSL_2$). For example, the first source line selector $S_{S1}$ extends between the first local source line $LSL_1$ and the first global source line $GSL_1$, a second source line selector $S_{S2}$ extends between the second local source line $LSL_2$ and the first global source line $GSL_1$, a third source line selector $S_{S3}$ extends between the third local source line $LSL_3$ and the second global source line $GSL_2$, and a fourth source line selector $S_{S4}$ extends between the fourth local source line $LSL_4$ and the second global source line $GSL_2$.

The source line selectors (e.g., $S_{S1}$-$S_{S4}$) are configured to selectively decouple (i.e., isolate) their respective local source lines from their respective global source lines. Thus, the source line selectors may prevent capacitance and/or leakage current of the local bit lines from collecting at and affecting the global bit lines when the local bit lines are not in use. For example, a leakage current of the first local source line $LSL_1$ may be isolated from the first global source line $GSL_1$ when the first local source line $LSL_1$ is not in use by setting the first source line selector $S_{S1}$ to an "OFF" state. As a result, performance of the integrated chip may be improved.

Figure 2:
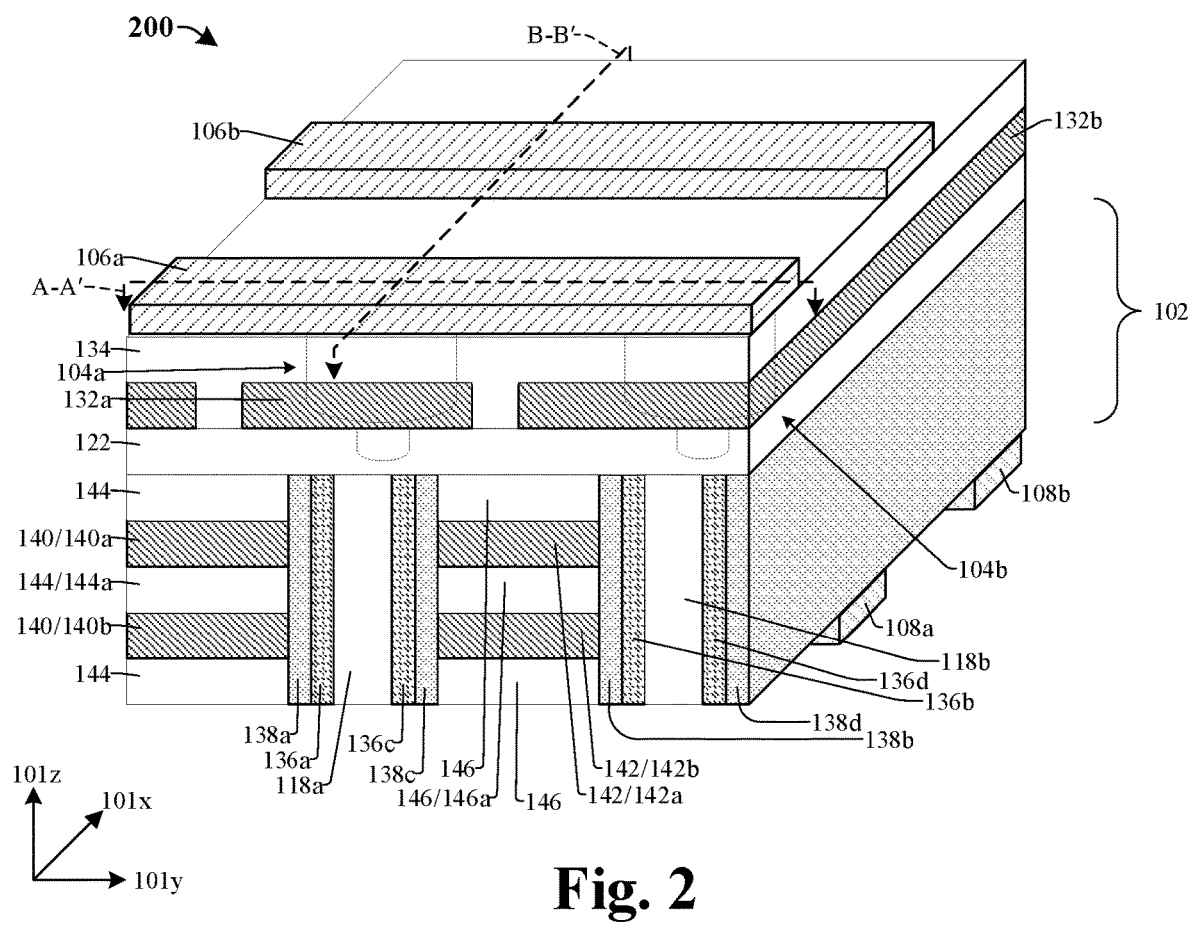
FIG. 2 illustrates a three-dimensional view of some embodiments of an integrated chip comprising a first bit line selector arranged over a first local bit line of a three-dimensional memory array.
Figure 3:
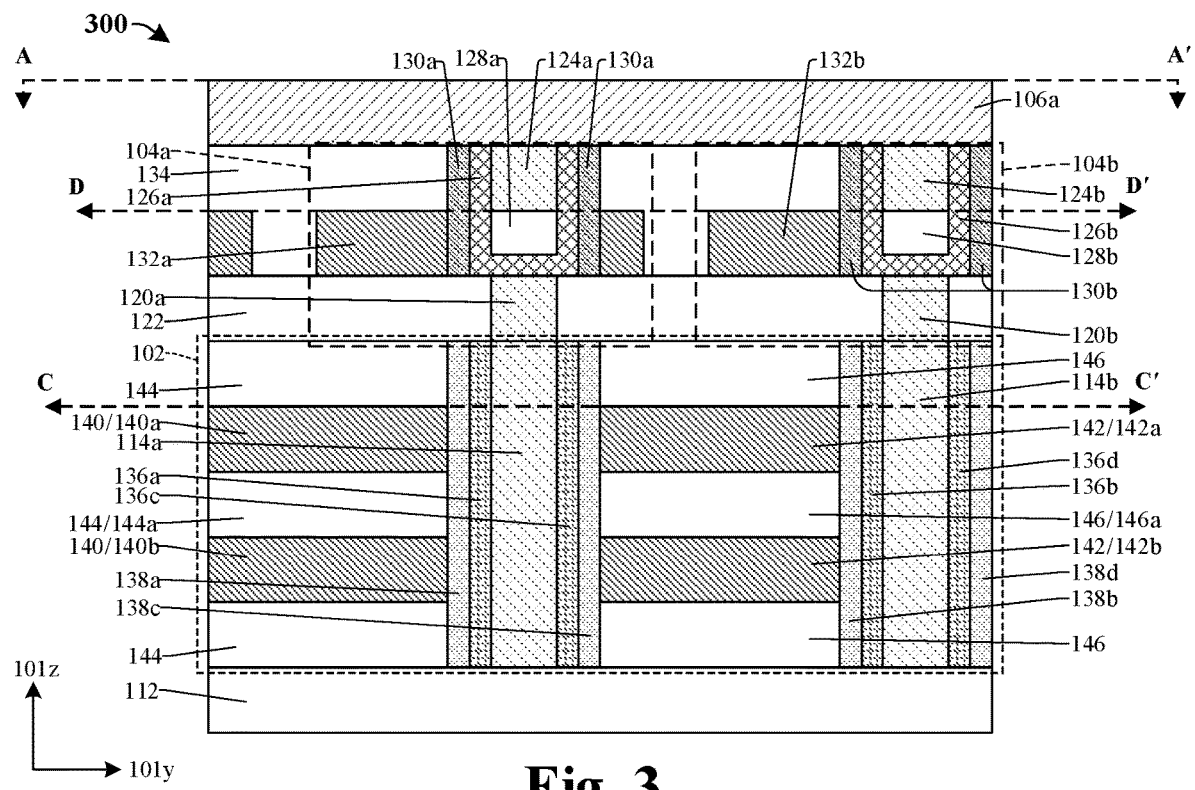
FIGS. 3 and 4 illustrate cross-sectional views of some embodiments of the integrated chip of FIG. 2.
Figure 4:
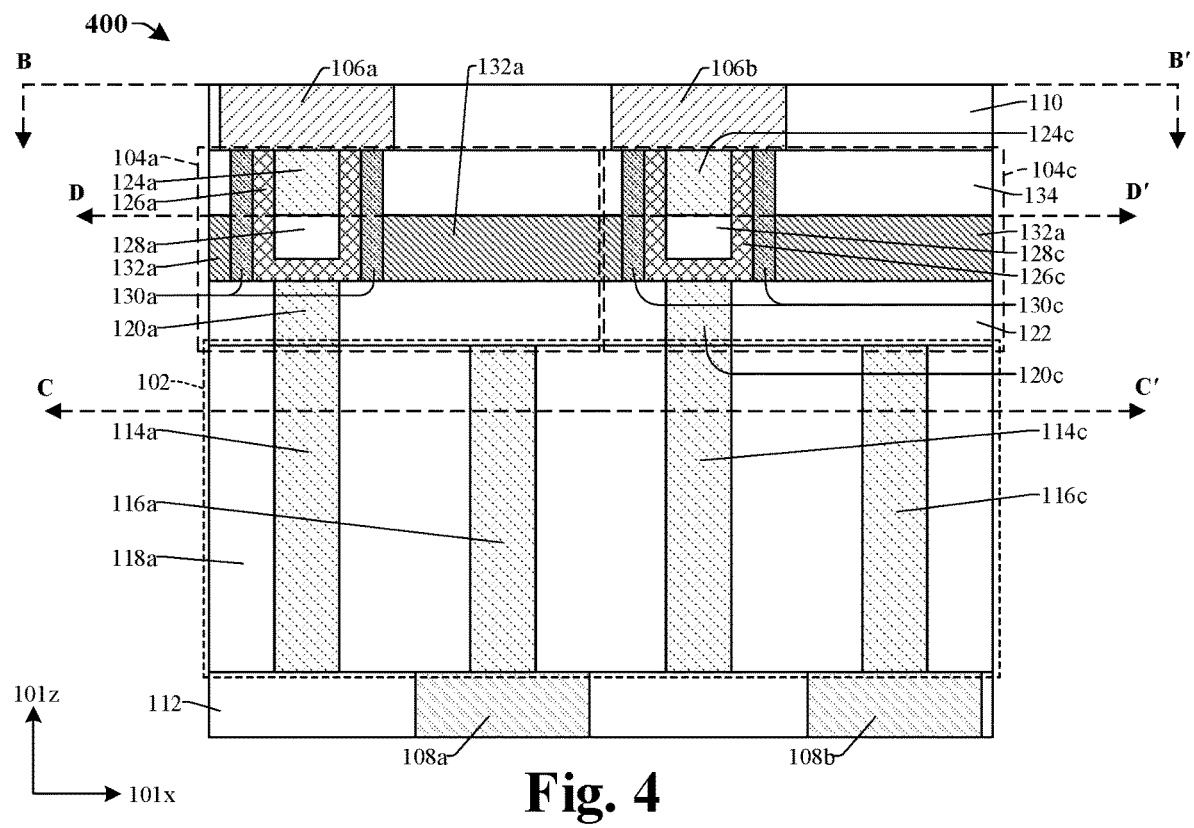
Figure 5:
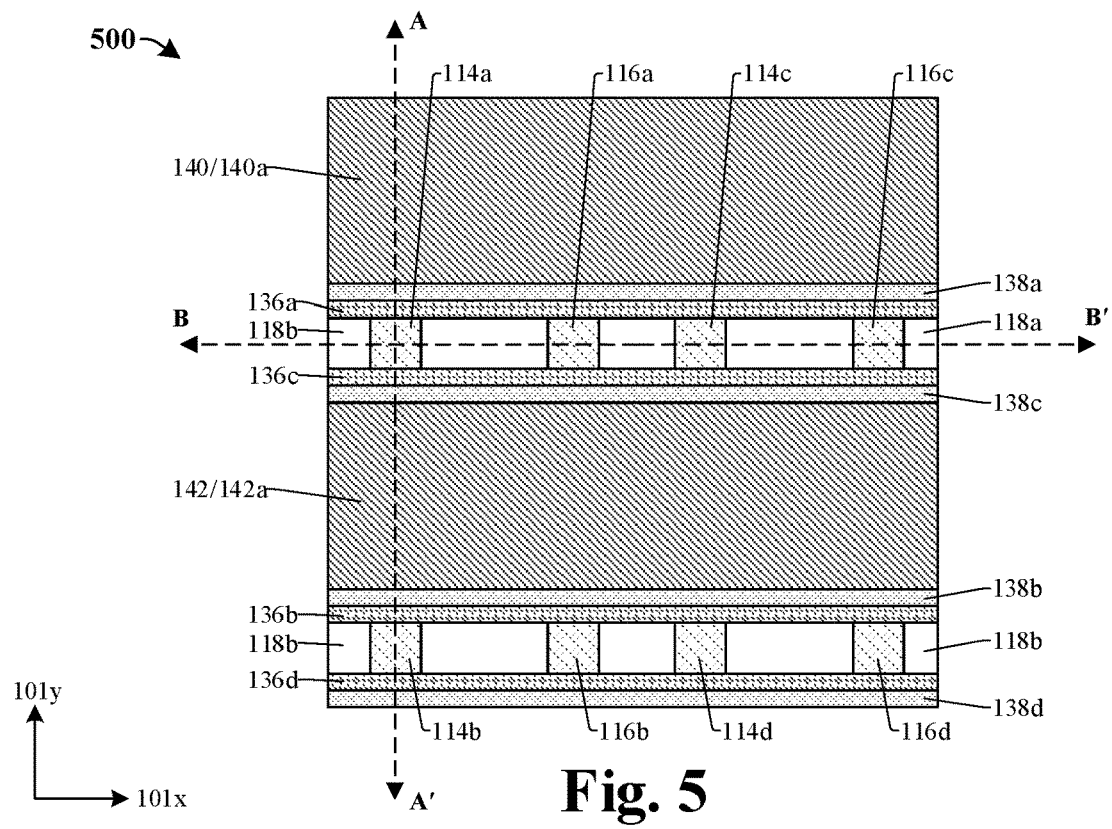
FIGS. 5 and 6 illustrate top views of some embodiments of the integrated chip of FIG. 2.
Figure 6:
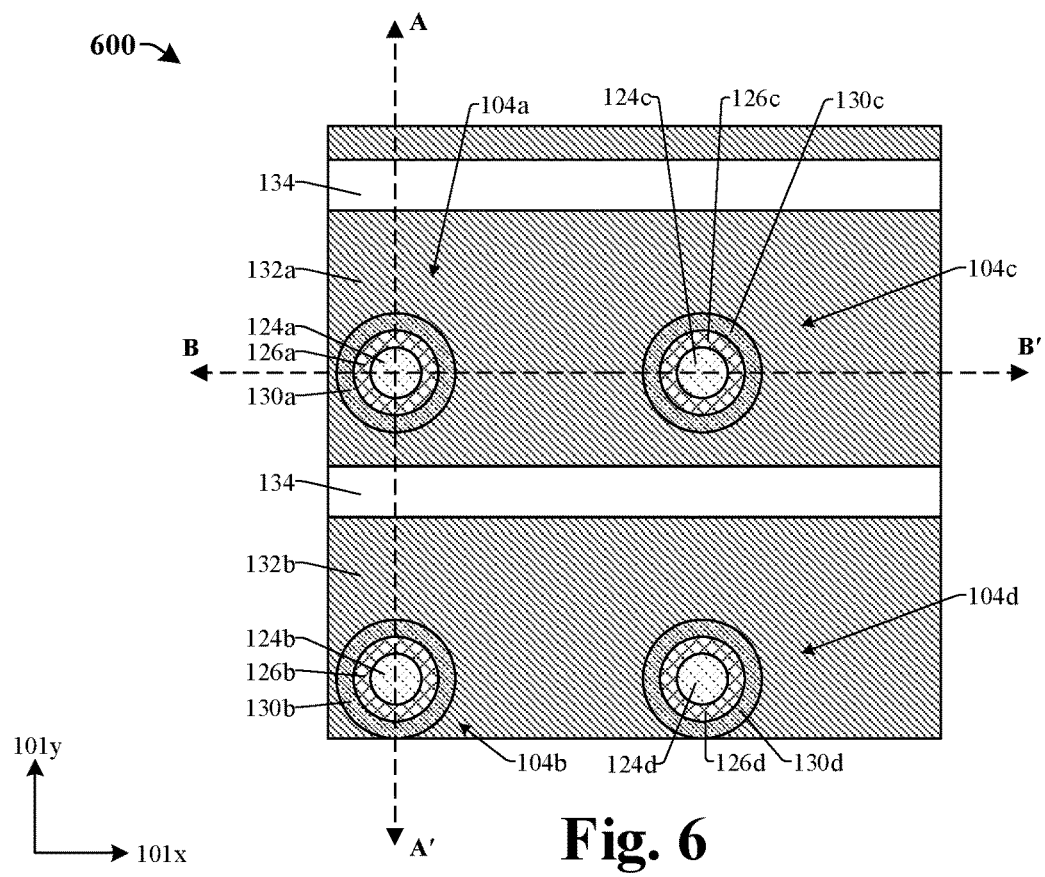

Referring to FIGS. 2-6, FIG. 2 illustrates a three-dimensional view 200 of some embodiments of an integrated chip comprising a first bit line selector 104a arranged over a first local bit line 114a of a three-dimensional memory array 102, FIGS. 3 and 4 illustrate cross-sectional views 300 and 400 of some embodiments of the integrated chip of FIG. 2, and FIGS. 5 and 6 illustrate top views 500 and 600 of some embodiments of the integrated chip of FIG. 2.

In some embodiments, the cross-sectional view 300 may, for example, be taken across line A-A' of FIGS. 2, 5, and 6. In some embodiments, the cross-sectional view 400 may, for example, be taken across line B-B' of FIGS. 2, 5, and 6. In some embodiments, FIG. 5 illustrates the top view 500 of the integrated chip as seen from line C-C' of FIGS. 3 and 4. In some embodiments, FIG. 6 illustrates the top view 600 of the integrated chip as seen from line D-D' of FIGS. 3 and 4.

A first global source line 108a and a second global source line 108b are disposed at a first height and are within a lower global line dielectric layer 112. The first global source line 108a and the second global source line 108b are elongated (i.e., extend) along a y-axis 101y and are laterally separated by the lower global line dielectric layer 112.

The memory array 102 includes the first local bit line 114a and a first local source line 116a that is laterally separated from the first local bit line 114a by a first local line dielectric layer 118a. The first local bit line 114a and the first local source line 116a are elongated (i.e., extend) along a z-axis 101z. A second local bit line 114b and a second local source line 116b are disposed within a second local line dielectric layer 118b and are elongated along the z-axis 101z. A third local bit line 114c and a third local source line 116c are disposed within the first local line dielectric layer 118a and are elongated along the z-axis 101z. A fourth local bit line 114d and a fourth local source line 116d are disposed within the second local line dielectric layer 118b and are elongated along the z-axis 101z. In some embodiments, the first local source line 116a and the second local source line 116b are directly over the first global source line 108a and are coupled to the first global source line 108a, while the third local source line 116c and the fourth local source line 116d are directly over the second global source line 108b and are coupled to the second global source line 108b.

A first memory channel layer 136a and a third memory channel layer 136c continuously extend along an x-axis 101x from the first local bit line 114a to the first local source line 116a. In some embodiments, the first memory channel layer 136a and the third memory channel layer 136c also continuously extend to the third local bit line 114c and further to the third local source line 116c.

A second memory channel layer 136b and a fourth memory channel layer 136d continuously extend along the x-axis 101x from the second local bit line 114b to the second local source line 116b. In some embodiments, the second memory channel layer 136b and the fourth memory channel layer 136d also continuously extend to the fourth local bit line 114d and further to the fourth local source line 116d.

A first memory film 138a extends along the x-axis 101x on a sidewall of the first memory channel layer 136a. A second memory film 138b extends along the x-axis 101x on a sidewall of the second memory channel layer 136b. A third memory film 138c extends along the x-axis 101x on a sidewall of the third memory channel layer 136c. A fourth memory film 138d extends along the x-axis 101x on a sidewall of the fourth memory channel layer 136d.

A first stack of memory gates extends along the first memory channel layer 136a and the first memory film 138a. The first stack of memory gates comprises a first plurality of memory gates 140 (e.g., a first memory gate 140a and a second memory gate 140b) that are vertically separated by a first plurality of inter-gate dielectric layers 144. In other words, the first plurality of memory gates 140 and the first plurality of inter-gate dielectric layers 144 are alternatingly stacked. For example, the first memory gate 140a is directly over the second memory gate 140b and is vertically separated from the second memory gate 140b by a first inter-gate dielectric layer 144a of the first plurality of inter-gate dielectric layers 144.

The first memory gate 140a, the second memory gate 140b, and the first inter-gate dielectric layer 144a are elongated along the x-axis 101x. The first memory gate 140a, the second memory gate 140b, and the first inter-gate dielectric layer 144a continuously extend along the first memory channel layer 136a and the first memory film 138a from alongside the first local bit line 114a to alongside the first local source line 116a, and further to alongside the third local bit line 114c and to alongside the third local source line 116c. The first memory channel layer 136a and the first memory film 138a separate both the first memory gate 140a and the second memory gate 140b from the first local bit line 114a, the first local source line 116a, the third local bit line 114c, and the third local source line 116c.

A second stack of memory gates extends along the second memory channel layer 136b and the second memory film 138b. The second stack of memory gates comprises a second plurality of memory gates 142 (e.g., a third memory gate 142a and a fourth memory gate 142b) that are vertically separated by a second plurality of inter-gate dielectric layers 146. In other words, the second plurality of memory gates 142 and the second plurality of inter-gate dielectric layers 146 are alternatingly stacked. For example, the third memory gate 142a is directly over the fourth memory gate 142b and is vertically separated from the fourth memory gate 142b by a second inter-gate dielectric layer 146a of the second plurality of inter-gate dielectric layers 146.

The third memory gate 142a, the fourth memory gate 142b, and the second inter-gate dielectric layer 146a are elongated along the x-axis 101x. The third memory gate 142a, the fourth memory gate 142b, and the second inter-gate dielectric layer 146a continuously extend along the second memory channel layer 136b and the second memory film 138b from the second local bit line 114b to the second local source line 116b, and further to the fourth local bit line 114d and the fourth local source line 116d. The second memory channel layer 136b and the second memory film 138b separate both the third memory gate 142a and the fourth memory gate 142b from the second local bit line 114b, the second local source line 116b, the fourth local bit line 114d, and the fourth local source line 116d.

In some embodiments, the first memory gate 140a forms a first word line of a first level (e.g., similar to $WL_{1,1}$ of FIGS. 1A and 1B), the second memory gate 140b forms a first word line of a second level (e.g., similar to $WL_{1,2}$ of FIGS. 1A and 1B), the third memory gate 142a forms a second word line of the first level (e.g., similar to $WL_{2,1}$ of FIGS. 1A and 1B), and the fourth memory gate 142b forms a second word line of the second level (e.g., similar to $WL_{2,2}$ of FIGS. 1A and 1B).

In some embodiments, the first local bit line 114a, the first local source line 116a, the first memory channel layer 136a, the first memory film 138a, and the first memory gate 140a form a first memory cell, while the first local bit line 114a, the first local source line 116a, the first memory channel layer 136a, the first memory film 138a, and the second memory gate 140b form a second memory cell that is coupled in parallel with the first memory cell.

In some embodiments, the second local bit line 114b, the second local source line 116b, the second memory channel layer 136b, the second memory film 138b, and the third memory gate 142a form a third memory cell, while the second local bit line 114b, the second local source line 116b, the second memory channel layer 136b, the second memory film 138b, and the fourth memory gate 142b form a fourth memory cell that is coupled in parallel with the third memory cell.

In some embodiments, the third local bit line 114c, the third local source line 116c, the first memory channel layer 136a, the first memory film 138a, and the first memory gate 140a form a fifth memory cell, while the third local bit line 114c, the third local source line 116c, the first memory channel layer 136a, the first memory film 138a, and the second memory gate 140b form a sixth memory cell that is coupled in parallel with the fifth memory cell.

In some embodiments, the fourth local bit line 114d, the fourth local source line 116d, the second memory channel layer 136b, the second memory film 138b, and the third memory gate 142a form a seventh memory cell, while the fourth local bit line 114d, the fourth local source line 116d, the second memory channel layer 136b, the second memory film 138b, and the fourth memory gate 142b form an eighth memory cell that is coupled in parallel with the seventh memory cell.

The first bit line selector 104a is directly over the first local bit line 114a. The first bit line selector 104a comprises a first lower source/drain electrode 120a, a first upper source/drain electrode 124a, a first selector channel layer 126a, a first selector gate dielectric layer 130a, a first selector gate 132a, and a first selector spacer 128a.

The first lower source/drain electrode 120a is within a lower selector dielectric layer 122. The first upper source/drain electrode 124a is directly over, and vertically separated from, the first lower source/drain electrode 120a.

The first selector channel layer 126a extends vertically from a top surface of the first lower source/drain electrode 120a to sidewalls of the first upper source/drain electrode 124a. The first selector channel layer 126a laterally surrounds the first upper source/drain electrode 124a in a closed loop. In some embodiments, a region of the first selector channel layer 126a that laterally surrounds the first upper source/drain electrode 124a (e.g., the portion of the first selector channel layer 126a that is above the top surface the first selector gate 132a) forms an upper source/drain region (not labeled) of the first selector channel layer 126a, a region of the first selector channel layer 126a that is on the top surface of the first lower source/drain electrode 120a forms a lower source/drain region (not labeled) of the first selector channel layer 126a, and a region of the first selector channel layer 126a that extends along the first selector gate 132a forms a channel region (not labeled) of the first selector channel layer 126a.

The first selector gate dielectric layer 130a is on sidewalls of the first selector channel layer 126a and laterally surrounds the first selector channel layer 126a in a closed loop. In some embodiments, the first selector channel layer 126a and the first selector gate dielectric layer 130a are ring shaped. The first selector gate 132a laterally surrounds the first selector gate dielectric layer 130a in a closed loop. An upper selector dielectric layer 134 is over the first selector gate 132a and laterally surrounds the first selector gate dielectric layer 130a.

A second bit line selector 104b is directly over the second local bit line 114b. The second bit line selector 104b comprises a second lower source/drain electrode 120b, a second upper source/drain electrode 124b, a second selector channel layer 126b, a second selector gate dielectric layer 130b, a second selector gate 132b, and a second selector spacer 128b. The first selector gate 132a and the second selector gate 132b are separated by the upper selector dielectric layer 134.

A third bit line selector 104c is directly over the third local bit line 114c. The third bit line selector 104c comprises a third lower source/drain electrode 120c, a third upper source/drain electrode 124c, a third selector channel layer 126c, a third selector gate dielectric layer 130c, a third selector spacer 128c, and the first selector gate 132a. The first selector gate 132a extends along the x-axis 101x from the first bit line selector 104a to the third bit line selector 104c and the first selector gate 132a surrounds both the first selector gate dielectric layer 130a and the third selector gate dielectric layer 130c. In other words, the first bit line selector 104a and the third bit line selector 104c share (e.g., are commonly coupled to) the first selector gate 132a.

A fourth bit line selector 104d is directly over the fourth local bit line 114d. The fourth bit line selector 104d comprises a fourth lower source/drain electrode 120d, a fourth upper source/drain electrode 124d, a fourth selector channel layer 126d, a fourth selector gate dielectric layer 130d, a fourth selector spacer 128d, and the second selector gate 132b. The second selector gate 132b extends along the x-axis 101x from the second bit line selector 104b to the fourth bit line selector 104d and the second selector gate 132b surrounds both the second selector gate dielectric layer 130b and the fourth selector gate dielectric layer 130d. In other words, the second bit line selector 104b and the fourth bit line selector 104d share (e.g., are commonly coupled to) the second selector gate 132b.

A first global bit line 106a is directly over the first local bit line 114a and the second local bit line 114b. The first global bit line 106a is elongated along the y-axis 101y. The first local bit line 114a and the second local bit line 114b are both selectively coupled to the first global bit line 106a through the first bit line selector 104a and the second bit line selector 104b, respectively. A second global bit line 106b is directly over the third local bit line 114c and the fourth local bit line 114d. The second global bit line 106b is elongated along the y-axis 101y and is adjacent to the first global bit line 106a. The third local bit line 114c and the fourth local bit line 114d are both selectively coupled to the second global bit line 106b through the third bit line selector 104c and the fourth bit line selector 104d, respectively. The first global bit line 106a and the second global bit line 106b are disposed at a second height different from the first height, are within an upper global line dielectric layer 110, and are separated by the upper global line dielectric layer 110.

In some embodiments, the inter-gate dielectric layers (e.g., 144 and 146), the local line dielectric layers (e.g., 118a and 118b), the lower selector dielectric layer 122, the upper selector dielectric layer 134, the lower global line dielectric layer 112, the upper global line dielectric layer 110, and the selector spacers (e.g., 128a-d) may, for example, comprise silicon dioxide, silicon nitride, silicon oxynitride, or some other suitable material.

In some embodiments, the memory gates (e.g., 140 and 142) and the selector gates (e.g., 132a and 132b) may, for example, comprise tungsten or some other suitable material.

In some embodiments, the memory channel layers (e.g., 136a-d) and the selector channel layers (e.g., 126a-d) may, for example, comprise silicon, germanium, silicon germanium, gallium arsenide, or some other suitable material. In some embodiments, the upper source/drain regions (not labeled) and the lower source/drain regions (not labeled) of the selector channel layers have higher doing concentrations than the channel regions (not labeled) of the selector channel layers.

In some embodiments, the memory films (e.g., 138a-d) may, for example, comprise a number of different materials. For example, the memory films may, for example, comprise a gate dielectric layer (e.g., a layer of silicon dioxide, hafnium oxide, aluminum oxide, zirconium oxide, or some other suitable dielectric), a floating gate and one or more dielectric layers (e.g., like that of a flash memory cell), an oxide-nitride-oxide layer, or some other suitable layer(s) and/or material(s).

In some embodiments, the local lines (e.g., 114a-d and 116a-d), the lower source/drain electrodes (e.g., 120a-d), and the upper source/drain electrodes (e.g., 124a-d) may, for example, comprise tungsten, copper, some other suitable metal, doped silicon, some other suitable doped semiconductor, or some other suitable material.

In some embodiments, the global lines (e.g., 106a, 106b, 108a, and 108d) may, for example, comprise tungsten, copper, or some other suitable material.

In some embodiments, the selector gate dielectric layers (e.g., 130a-d) may, for example, comprise silicon dioxide, aluminum oxide, hafnium oxide, or some other suitable material.

In some embodiments, the three-dimensional memory array 102 is a NOR-type three-dimensional memory array or some other suitable memory array. In some embodiments, the bit line selectors (e.g., 104a-d) are gate-all-around transistor devices or some other suitable devices. In some embodiments, gate all-around transistors may provide added performance enhancement because they may exhibit high currents when "ON" and low leakage currents when "OFF".

It should be noted that the upper global line dielectric layer 110 and the lower global line dielectric layer 112 are not illustrated in FIGS. 2, 7, 10, and 13 for the sake of clarity.

Although items 114a-d are referred to as local bit lines and items 116a-d are referred to as local source lines, it will be appreciated in some embodiments, that items 114a-d may alternatively be local source lines and items 116a-d may alternatively be local bit lines. Likewise, it will be appreciated that in some embodiments, items 106a and 106b may alternatively be global source lines and items 108a and 108b may alternatively be global source bit lines.

Figure 7:
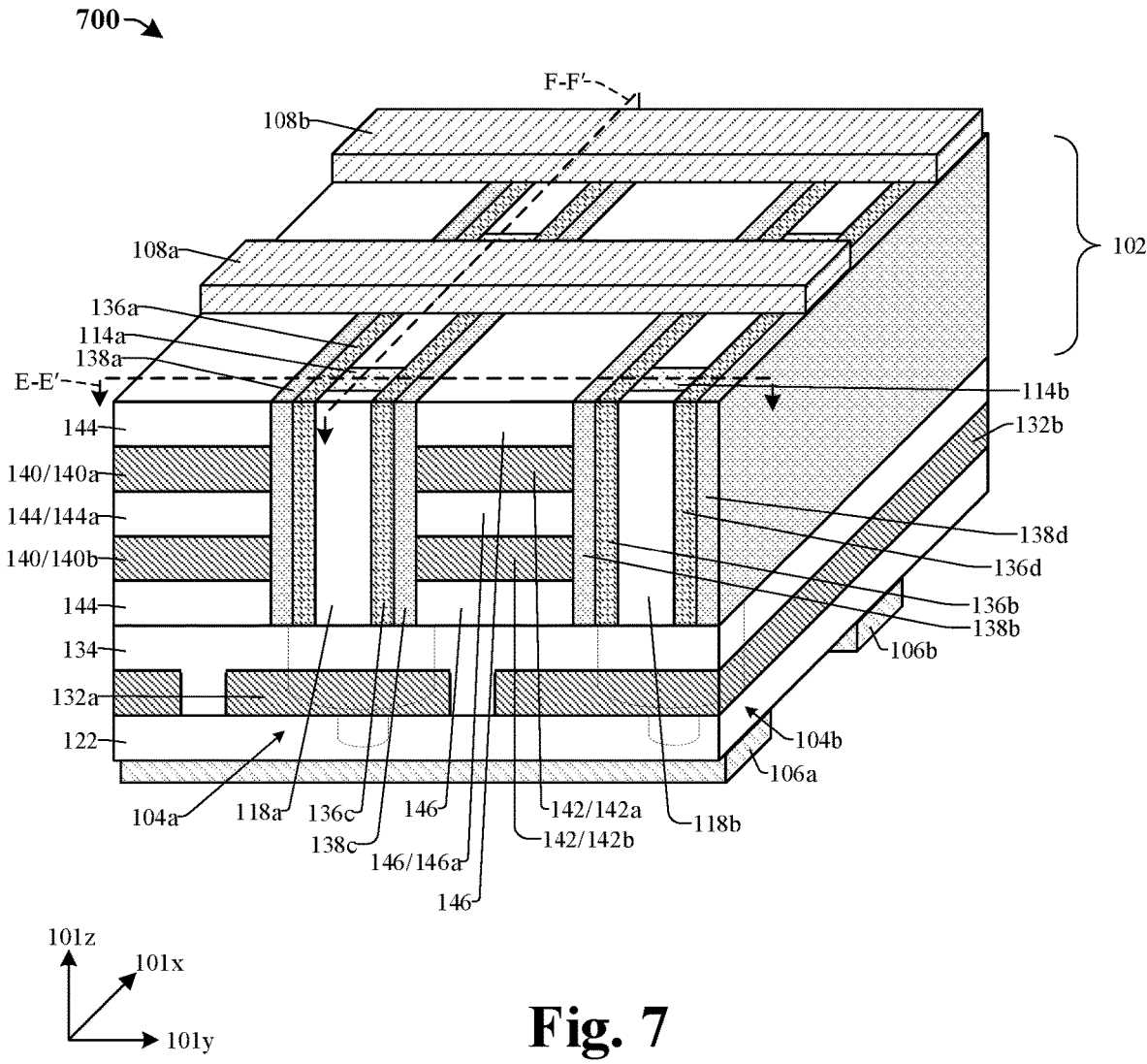
FIG. 7 illustrates a three-dimensional view of some embodiments of the integrated chip of FIG. 2 in which the first bit line selector is arranged under the first local bit line of the three-dimensional memory array.
Figure 8:
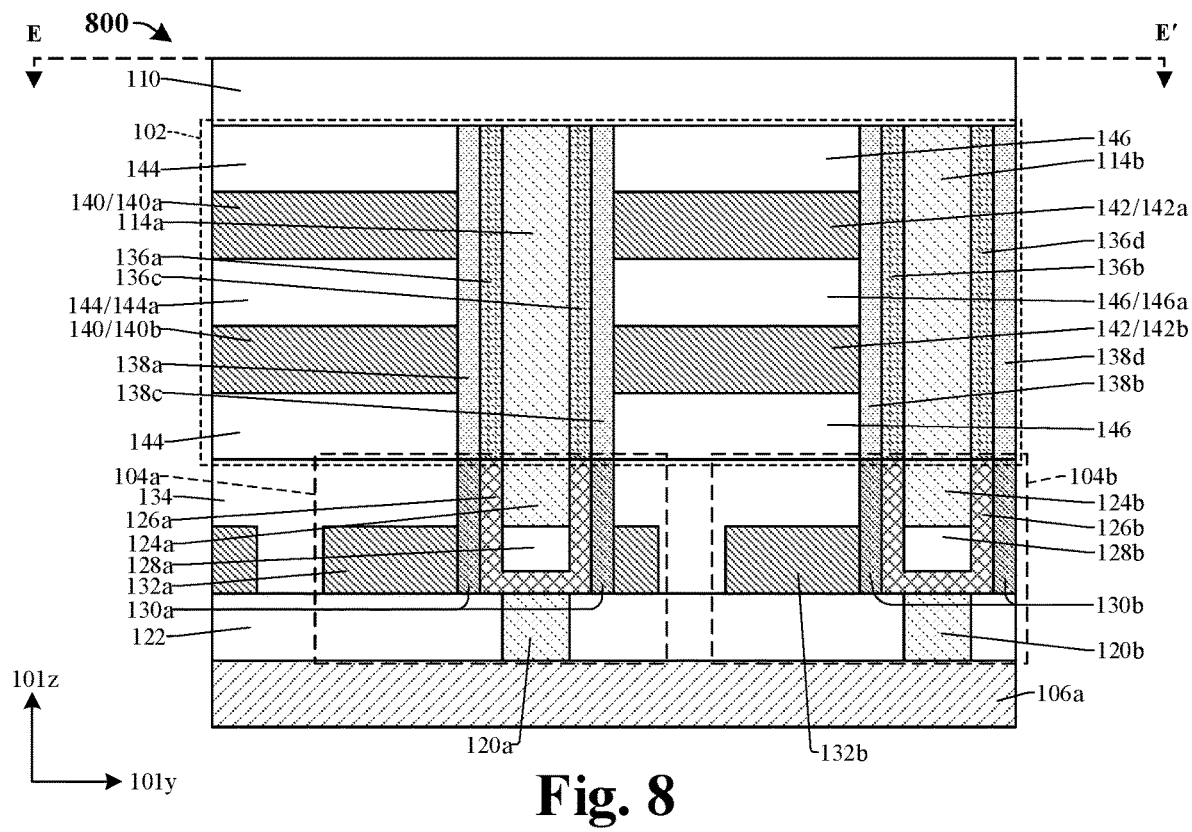
FIGS. 8 and 9 illustrate cross-sectional views of some embodiments of the integrated chip of FIG. 7.
Figure 9:
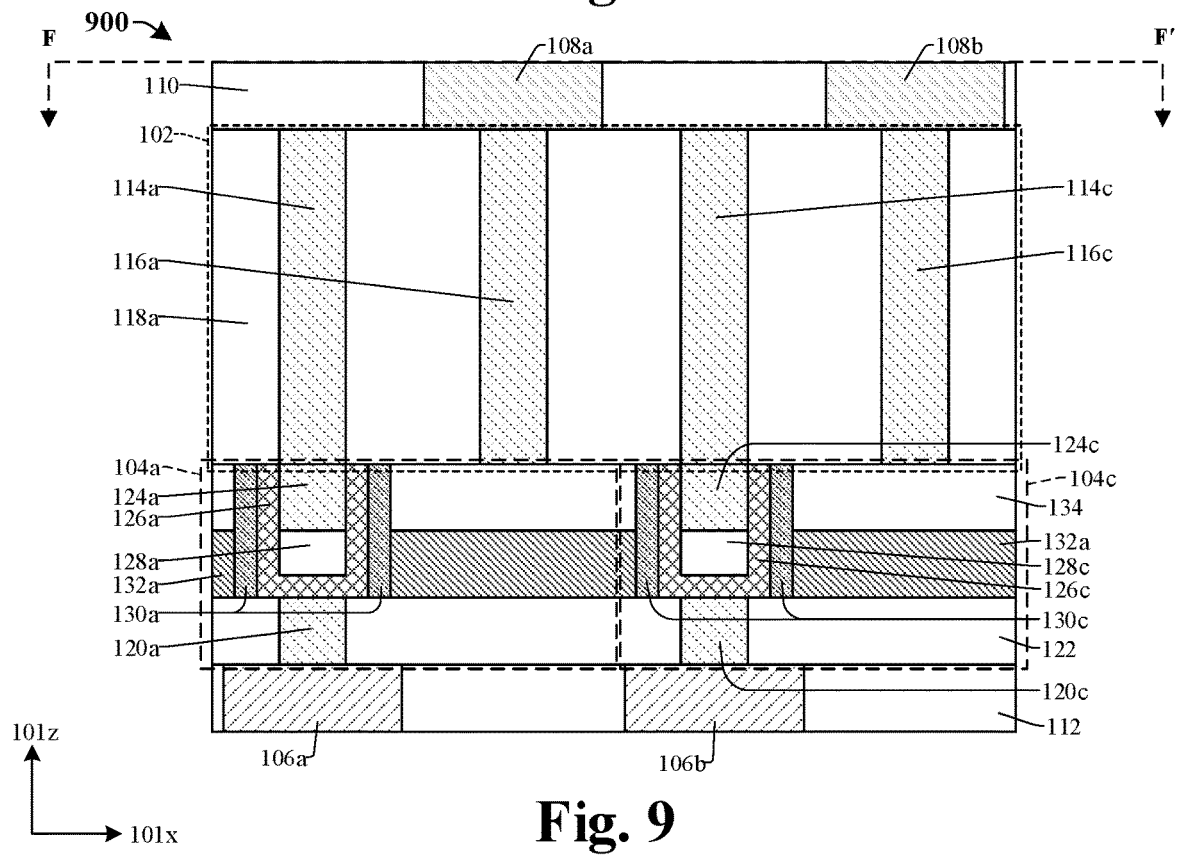

Referring to FIGS. 7-9, FIG. 7 illustrates a three-dimensional view 700 of some embodiments of the integrated chip of FIG. 2 in which the first bit line selector 104a is arranged under the first local bit line 114a of the three-dimensional memory array 102, and FIGS. 8 and 9 illustrate cross-sectional views 800 and 900 of some embodiments of the integrated chip of FIG. 7. In some embodiments, the cross-sectional view 800 may, for example, be taken across line E-E' of FIG. 7. In some embodiments, the cross-sectional view 900 may, for example, be taken across line F-F' of FIG. 7.

In such embodiments, the first bit line selector 104a and the second bit line selector 104b are directly under the first local bit line 114a and the second local bit line 114b, respectively. Further, the first global bit line 106a is within the lower global line dielectric layer 112 and is directly under both the first bit line selector 104a and the second bit line selector 104b. In addition, the third bit line selector 104c and the fourth bit line selector (not shown) are directly under the third local bit line 114c and the fourth local bit line (not labeled), respectively. Further, the second global bit line 106b is within the lower global line dielectric layer 112 and is directly under both the third bit line selector 104c and the fourth bit line selector (not shown).

The first global source line 108a is within the upper global line dielectric layer 110 and is directly over both the first local source line 116a and the second local source line (not labeled). The second global source line 108b is within the upper global line dielectric layer 110 and is directly over both the third local source line 116c and the fourth local source line (not labeled).

In some embodiments, the upper source/drain electrodes (e.g., 124a 124b, etc.) are in direct contact with the local bit lines (e.g., 114a, 114b, etc.), respectively. For example, the first upper source/drain electrode 124a may be on a bottom surface of the first local bit line 114a. In some embodiments, the first lower source/drain electrode 120a and the second lower source/drain electrode 120b are both in direct contact with the first global bit line 106a, while the third lower source/drain electrode 120c and the fourth lower source/drain electrode (not shown) are both in direct contact with the second global bit line 106b.

In some embodiments, first selector channel layer 126a and the third selector channel layer 126c are in direct contact with the first memory channel layer 136a and the third memory channel layer 136c. In some embodiments, the second selector channel layer 126b and the fourth selector channel layer (not shown) are in direct contact with the second memory channel layer 136b and the fourth memory channel layer 136d. In some embodiments, the first selector gate dielectric layer 130a and the third selector gate dielectric layer 130c are in direct contact with the first memory film 138a and the third memory film 138c. In some embodiments, the second selector gate dielectric layer 130b and the fourth selector gate dielectric layer (not shown) are in direct contact with the second memory film 138b and the fourth memory film 138d.

Figure 10:
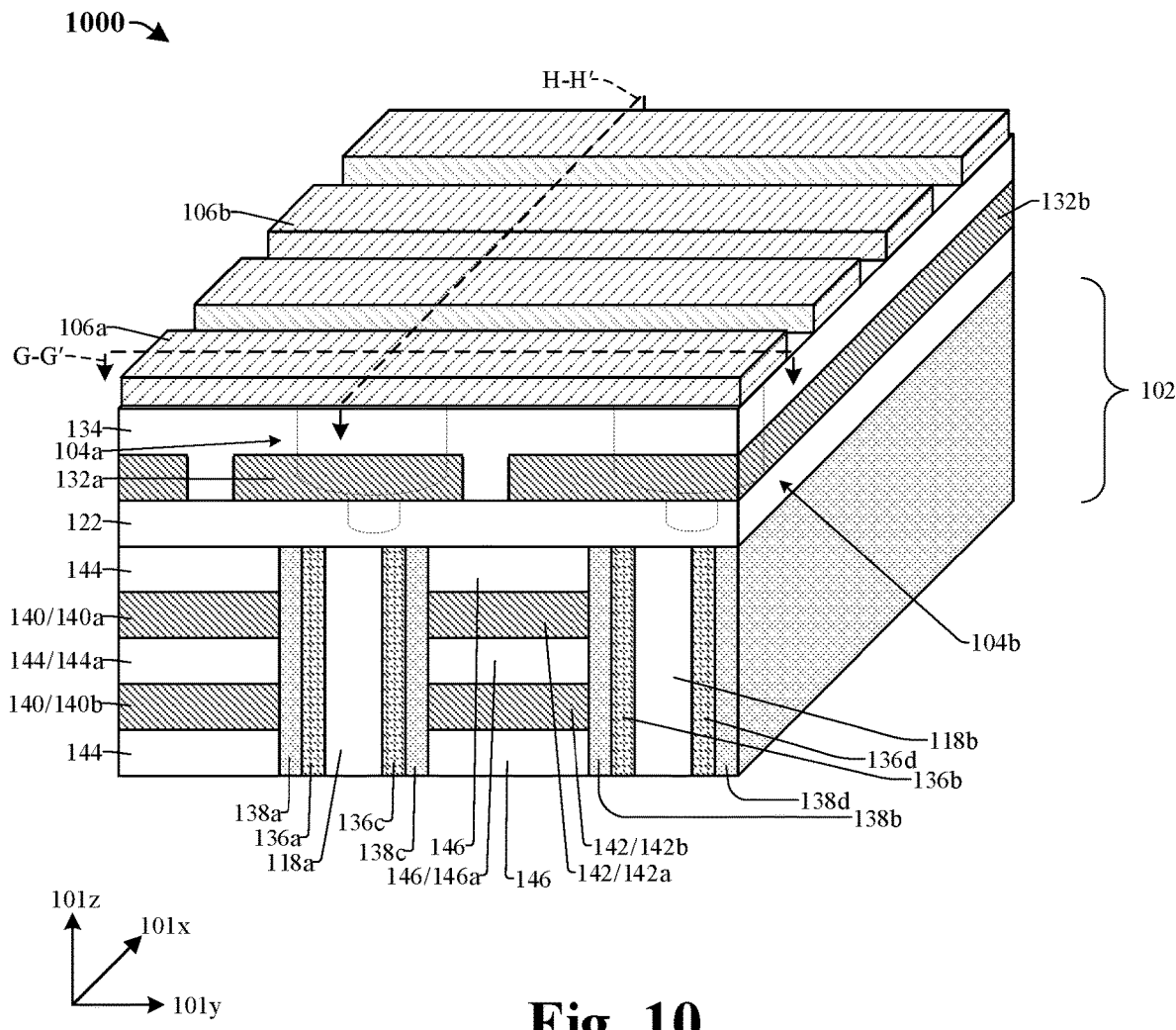
FIG. 10 illustrates a three-dimensional view of some embodiments of the integrated chip of FIG. 2 in which the first bit line selector is arranged over the first local bit line of the three-dimensional memory array and a first source line selector is arranged over a first local source line of the three-dimensional memory array.
Figure 11:
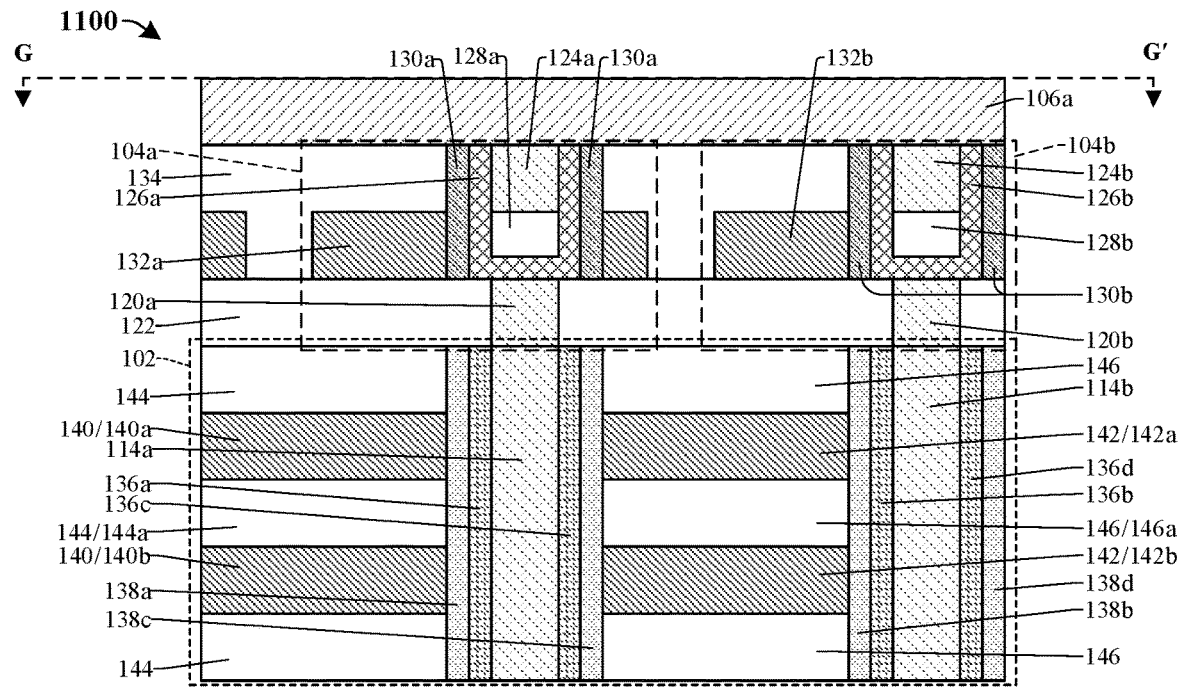
FIGS. 11 and 12 illustrate cross-sectional views of some embodiments of the integrated chip of FIG. 10.
Figure 12:
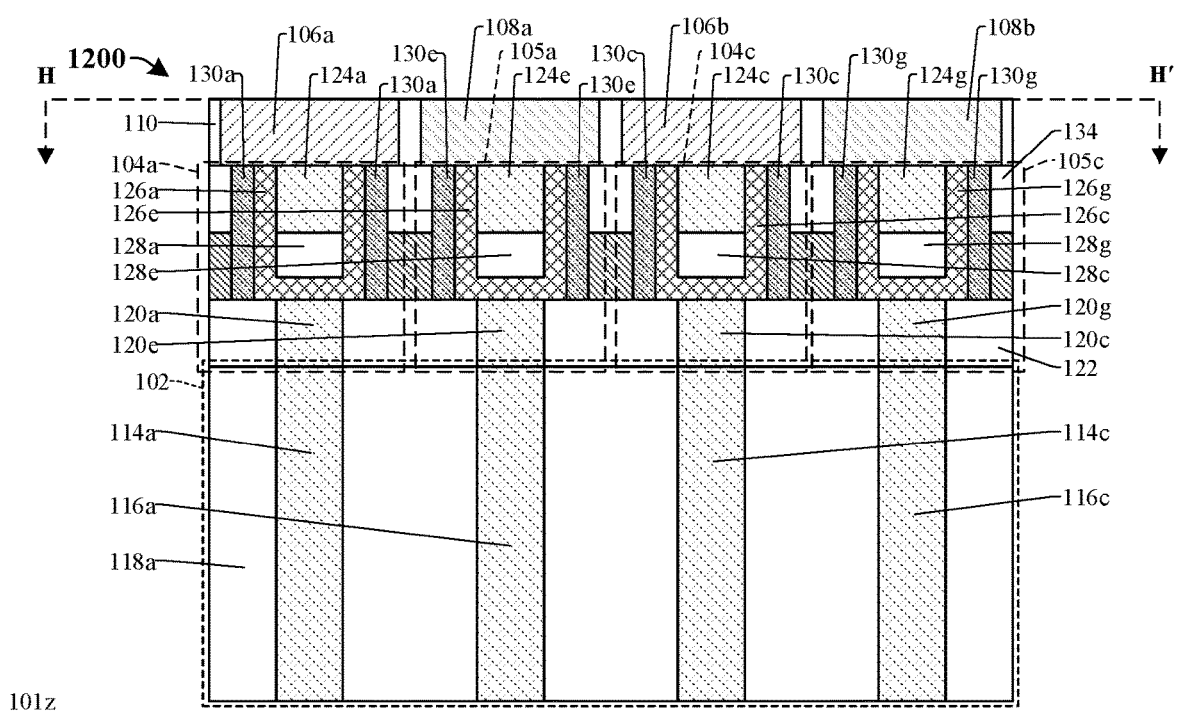

Referring to FIGS. 10-12, FIG. 10 illustrates a three-dimensional view 1000 of some embodiments of the integrated chip of FIG. 2 in which the first bit line selector 104a is arranged over the first local bit line 114a of the three-dimensional memory array 102 and a first source line selector 105a is arranged over the first local source line 116a of the three-dimensional memory array 102, and FIGS. 11 and 12 illustrate cross-sectional views 1100 and 1200 of some embodiments of the integrated chip of FIG. 10. In some embodiments, the cross-sectional view 1100 may, for example, be taken across line G-G' of FIG. 10. In some embodiments, the cross-sectional view 1200 may, for example, be taken across line H-H' of FIG. 10.

In such embodiments, the first global bit line 106a, the second global bit line 106b, the first global source line 108a, and the second global source line 108b are disposed at a same height (e.g., a first height), are within the upper global line dielectric layer 110, and extend over the three-dimensional memory array 102.

The first bit line selector 104a, the second bit line selector 104b, the third bit line selector 104c, and the fourth bit line selector (not shown) are directly over the first local bit line 114a, the second local bit line 114b, the third local bit line 114c, and the fourth local bit line (not shown), respectively. The first bit line selector 104a and the second bit line selector 104b extend vertically from the first local bit line 114a and the second local bit line 114b, respectively, to the first global bit line 106a. The third bit line selector 104c and the fourth bit line selector (not shown) extend vertically from the third local bit line 114c and the fourth local bit line (not shown), respectively, to the second global bit line 106b.

In addition, the first source line selector 105a, a second source line selector (not shown), a third source line selector 105c, and a fourth source line selector (not shown) are directly over the first local source line 116a, the second local source line (not shown), the third local source line 116c, and the fourth local source line (not shown), respectively. The first source line selector 105a and the second source line selector (not shown) extend vertically from the first local source line 116a and the second local source line (not shown), respectively, to the first global source line 108a. The third source line selector 105c and the fourth source line selector (not shown) extend vertically from the third local source line 116c and the fourth local source line (not shown), respectively, to the second global source line 108b.

Each of the selectors (e.g., 104a, 105a, etc.) comprise a lower source/drain electrode (e.g., 120a, 120b, etc.), a selector channel layer (e.g., 126a, 126b, etc.), a selector spacer (e.g., 128a, 128b, etc.), a selector gate dielectric layer (e.g., 130a, 130b, etc.), an upper source/drain electrode (e.g., 124a, 124b, etc.), and a selector gate (e.g., 132a and 132b). For example, the first source line selector 105a comprises a fifth lower source/drain electrode 120e, a fifth selector channel layer 126e, a fifth selector spacer 128e, a fifth selector gate dielectric layer 130e, and a fifth upper source/drain electrode 124e, and the third source line selector 105c comprises a seventh lower source/drain electrode 120g, a seventh selector channel layer 126g, a seventh selector spacer 128g, a seventh selector gate dielectric layer 130g, and a seventh upper source/drain electrode 124g.

The first bit line selector 104a, the third bit line selector 104c, the first source line selector 105a, and the third source line selector 105c comprise the first selector gate 132a while the second bit line selector 104b, the fourth bit line selector (not shown), the second source line selector (not shown), and the fourth source line selector (not shown) comprise the second selector gate 132b. In other words, the first bit line selector 104a, the third bit line selector 104c, the first source line selector 105a, and the third source line selector 105c share the first selector gate 132a while the second bit line selector 104b, the fourth bit line selector (not shown), the second source line selector (not shown), and the fourth source line selector (not shown) share the second selector gate 132b.

By additionally including the source line selectors between the local source lines and the global source lines, the global source lines may be selectively isolated from the local source lines. Thus, the source line selectors may prevent capacitance and/or leakage currents of the local source lines from affecting the global source lines when the local source lines are not in use.

Although FIGS. 10-12 illustrate the selectors (e.g., the bit line selectors and the source line selectors) directly over the three-dimensional memory array 102, it will be appreciated that in some other embodiments, the selectors may alternatively be directly under the three-dimensional memory array 102.

Figure 13:
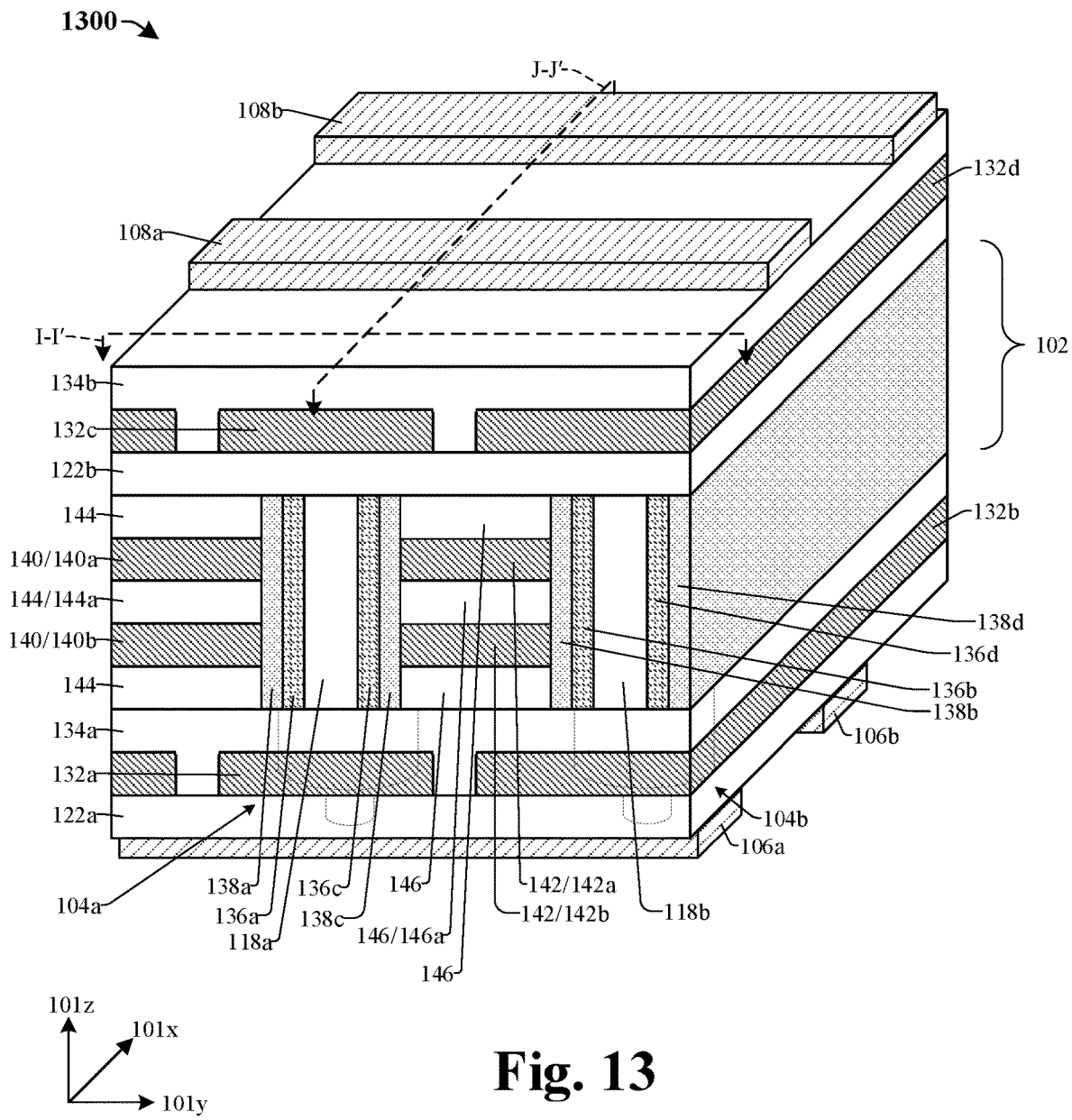
FIG. 13 illustrates a three-dimensional view of some embodiments of the integrated chip of FIG. 2 in which the first bit line selector is arranged under the first local bit line of the three-dimensional memory array and the first source line selector is arranged over the first local source line of the three-dimensional memory array.
Figure 14:
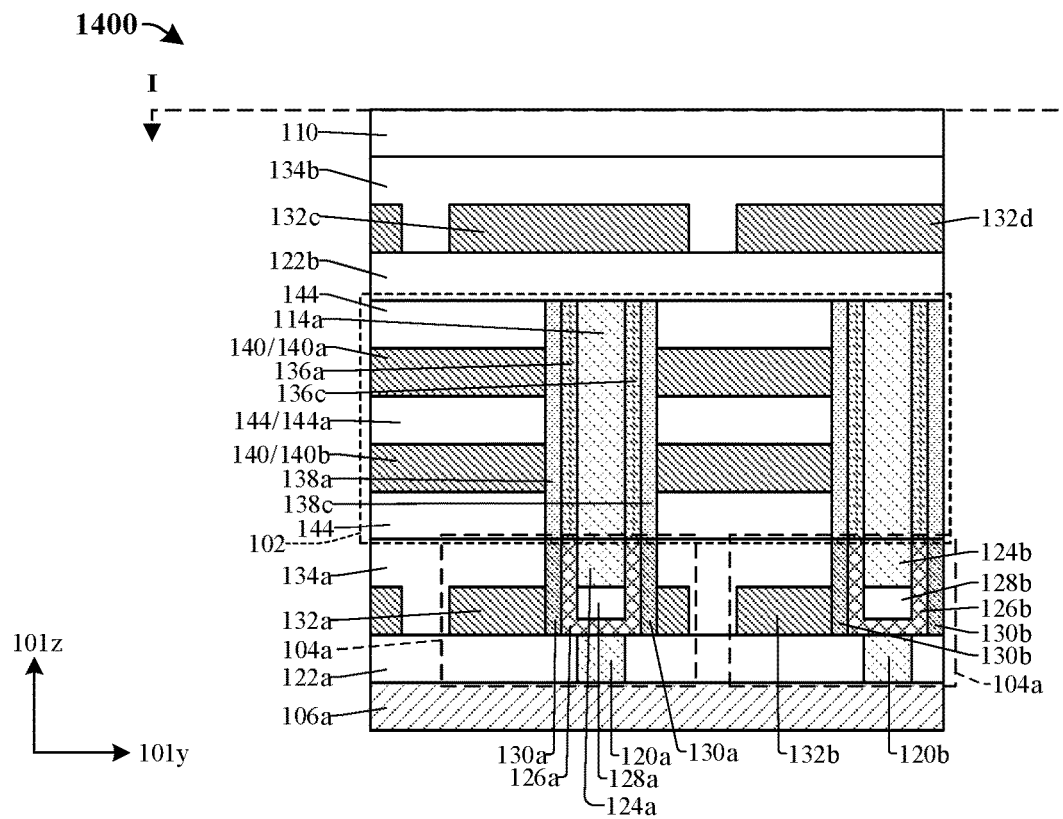
FIGS. 14 and 15 illustrate cross-sectional views of some embodiments of the integrated chip of FIG. 13.
Figure 15:
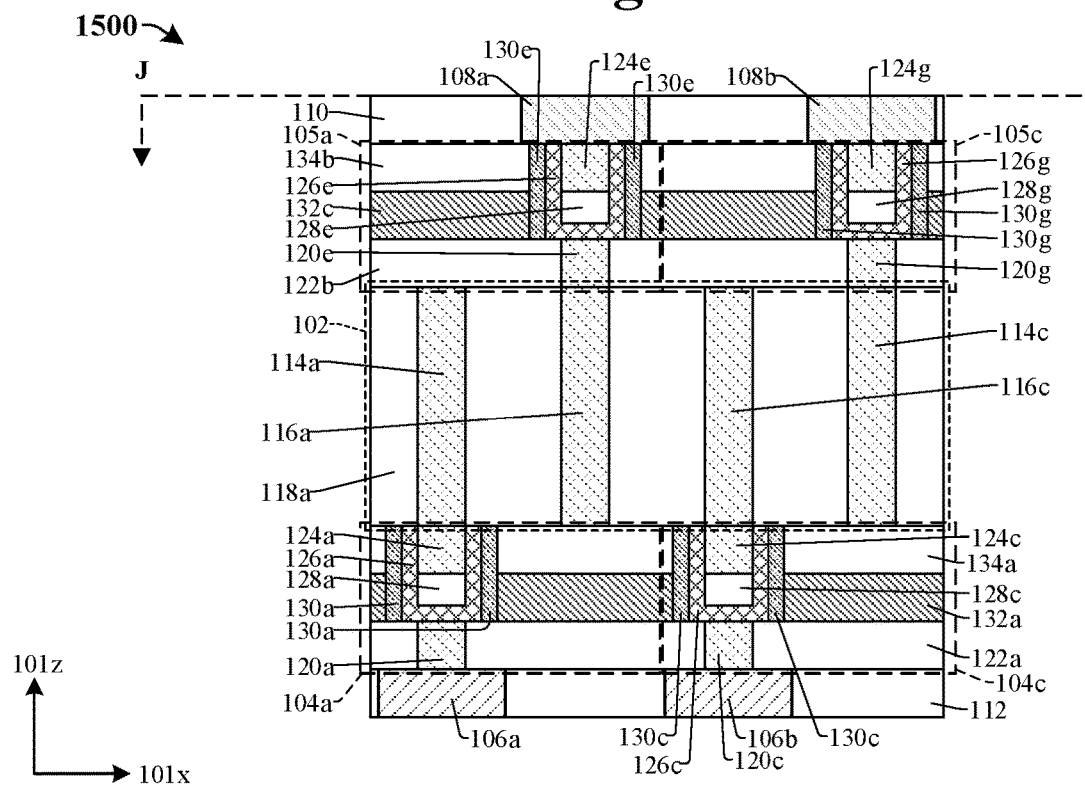

Referring to FIGS. 13-15, FIG. 13 illustrates a three-dimensional view 1300 of some embodiments of the integrated chip of FIG. 2 in which the first bit line selector 104a is arranged under the first local bit line 114a of the three-dimensional memory array 102 and the first source line selector 105a is arranged over the first local source line 116a of the three-dimensional memory array 102, and FIGS. 14 and 15 illustrate cross-sectional views 1400 and 1500 of some embodiments of the integrated chip of FIG. 13. In some embodiments, the cross-sectional view 1400 may, for example, be taken across line I-I' of FIG. 13. In some embodiments, the cross-sectional view 1500 may, for example, be taken across line J-J' of FIG. 13.

In such embodiments, the first global bit line 106a and the second global bit line 106b are within the lower global line dielectric layer 112 while the first global source line 108a and the second global source line 108b are within the upper global line dielectric layer 110.

The first bit line selector 104a, the second bit line selector 104b, the third bit line selector 104c, and the fourth bit line selector (not shown) are directly under the first local bit line 114a, the second local bit line 114b, the third local bit line 114c, and the fourth local bit line (not shown), respectively. The first bit line selector 104a, the second bit line selector 104b, the third bit line selector 104c, and the fourth bit line selector (not shown) are within a first lower selector dielectric layer 122a and a first upper selector dielectric layer 134a.

The first source line selector 105a, the second source line selector (not shown), the third source line selector 105c, and the fourth source line selector (not shown) are directly over the first local source line 116a, the second local source line (not shown), the third local source line 116c, and the fourth local source line (not shown), respectively. The first source line selector 105a and the third source line selector 105c comprise a third selector gate 132c. In other words, the first source line selector 105a and the third source line selector 105c share the third selector gate 132c. The second source line selector (not shown) and the fourth source line selector (not shown) comprise a fourth selector gate 132d. Further, the first source line selector 105a, the second source line selector (not shown), the third source line selector 105c, and the fourth source line selector (not shown) are within a second lower selector dielectric layer 122b and a second upper selector dielectric layer 134b.

Although FIGS. 13-15 illustrate the global bit lines (e.g., 106a and 106b) under the three-dimensional memory array 102 and the global source lines (e.g., 108a and 108b) over the three-dimensional memory array 102, it will be appreciated that in some other embodiments, the global bit lines may alternatively be over the three-dimensional memory array 102 while the global source lines are under the three-dimensional memory array 102.

FIGS. 16A-D illustrate cross-sectional views 1600, 1610, 1620, and 1630 of some alternative embodiments of the first bit line selector 104a of FIG. 2.

In some embodiments, the first lower source/drain electrode 120a has a curved lower surface, as illustrated in FIG. 16A. This may be the result of an etch (see, for example, FIGS. 29A-C) that forms a lower source/drain opening (e.g., 2902 of FIGS. 29A-C) extending into a top surface of first local bit line 114a, thereby removing a portion of the first local bit line 114a.

In some embodiments, the first selector channel layer 126a and the first selector gate dielectric layer 130a may have curved lower surfaces, as illustrated in FIG. 16A. This may be the result of an etch (see, for example, FIGS. 35A-C) that forms a channel opening (e.g., 3502 of FIGS. 35A-C) extending into the first lower source/drain electrode 120a and/or into the lower selector dielectric layer 122.

In some embodiments, the first upper source/drain electrode 124a has a curved lower surface, as illustrated in FIG. 16A. This may be the result of an etch (see, for example, FIGS. 42A-C) that recesses the first selector spacer 128a removing the center of the first selector spacer 128a at a faster rate than the perimeter of the of the first selector spacer 128a.

In some embodiments, the first selector channel layer 126a has a curved lower surface, as illustrated in FIG. 16B. This may be the result of an etch (see, for example, FIGS. 37A-C) that is performed on a dielectric layer (e.g., 3602 of FIGS. 36A-C) extending into the first lower source/drain electrode 120a and into the lower selector dielectric layer 122.

In some embodiments, the first selector channel layer 126a has a curved lower surface, as illustrated in FIG. 16C. This may be the result of an etch (see, for example, FIGS. 37A-C) that is performed on a dielectric layer (e.g., 3602 of FIGS. 36A-C) extending into the lower selector dielectric layer 122 at a substantially faster rate than the etch extends into the first lower source/drain electrode 120a.

In some embodiments, the first selector channel layer 126a has a curved lower surface, as illustrated in FIG. 16D. This may be the result of an etch (see, for example, FIGS. 37A-C) that is performed on a dielectric layer (e.g., 3602 of FIGS. 36A-C) extending into the first lower source/drain electrode 120a at a substantially faster rate than the etch extends into the lower selector dielectric layer 122.

Although FIGS. 16A-D illustrate the first bit line selector 104a, it will be appreciated that any other selector of the integrated chip may exhibit similar features.

FIGS. 17A-C through FIGS. 45A-C illustrate views 1700, 1750, and 1760 through 4500, 4550, and 4560 of some embodiments of a method for forming an integrated chip comprising a first bit line selector 104a arranged over a first local bit line 114a of a three-dimensional memory array 102. Although FIGS. 17A-C through 45A-C are described in relation to a method, it will be appreciated that the structures disclosed in FIGS. 17A-C through 45A-C are not limited to such a method, but instead may stand alone as structures independent of the method.

Figure 17A:
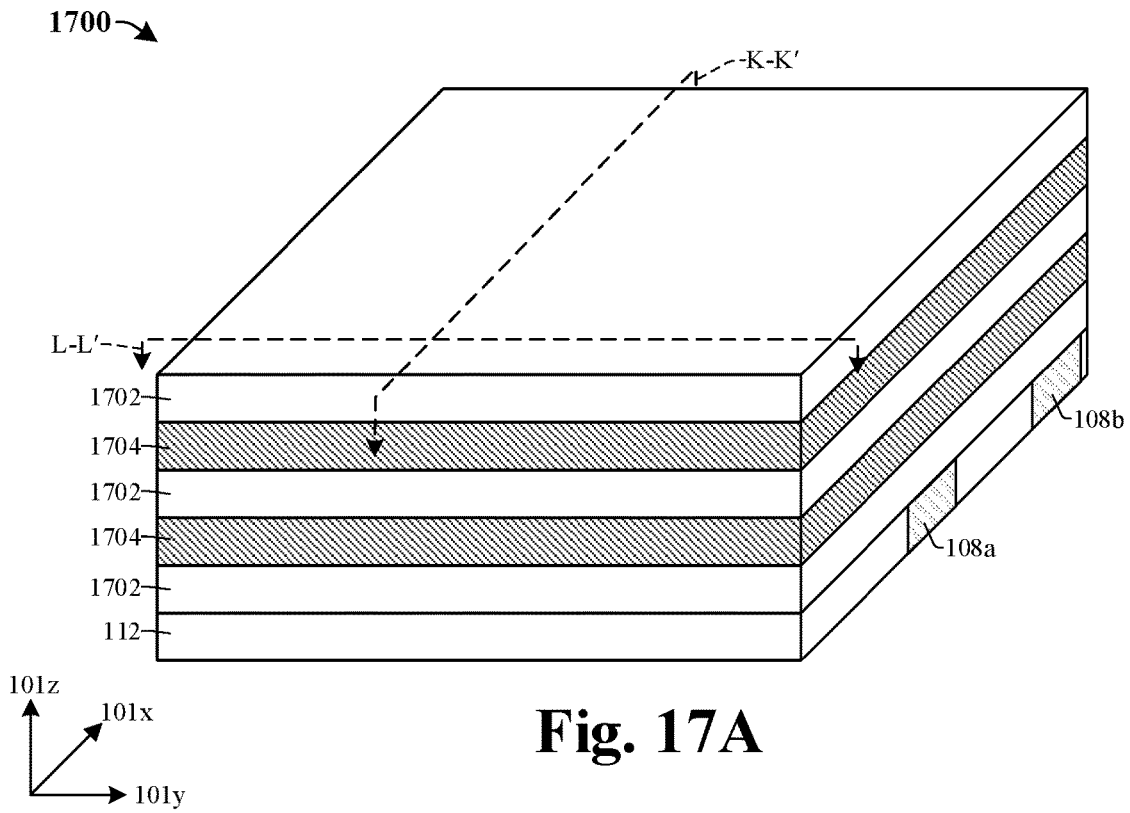
FIGS. 17A-C through 45A-C illustrate views of some embodiments of a method for forming an integrated chip comprising a first bit line selector arranged over a first local bit line of a three-dimensional memory array.
Figure 17B:
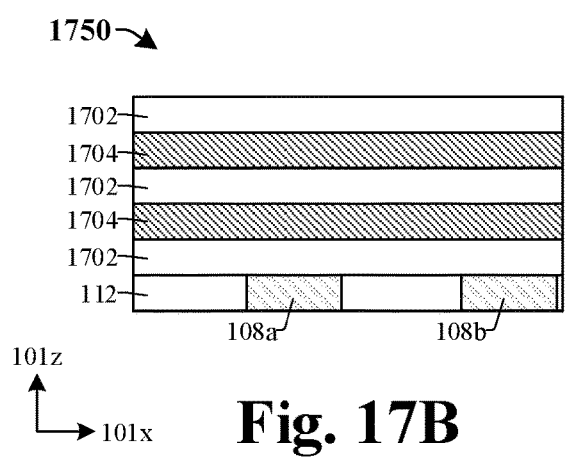
Figure 17C:
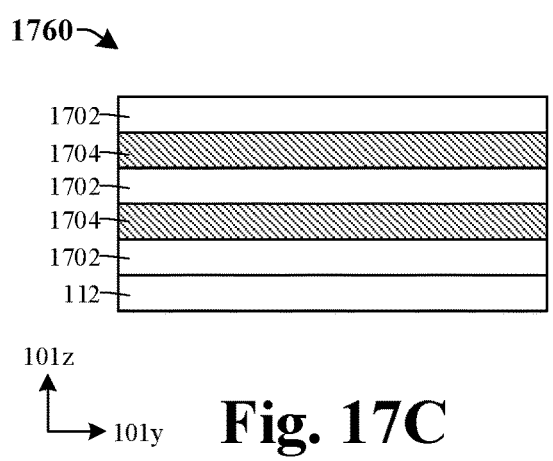
Figure 18A:
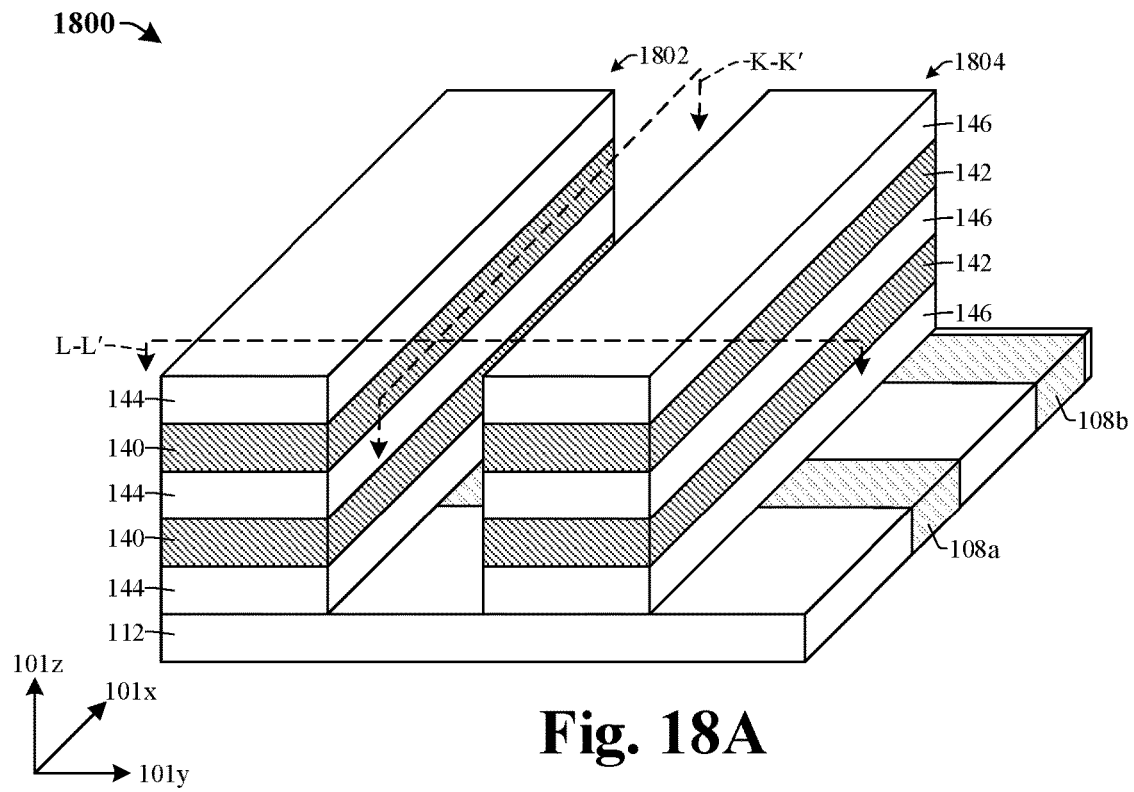
Figure 18B:
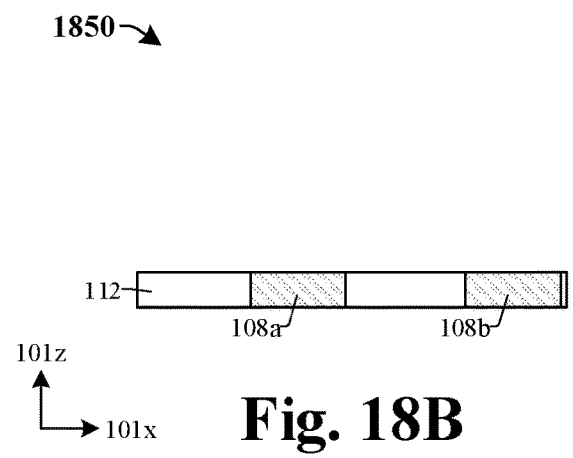
Figure 18C:
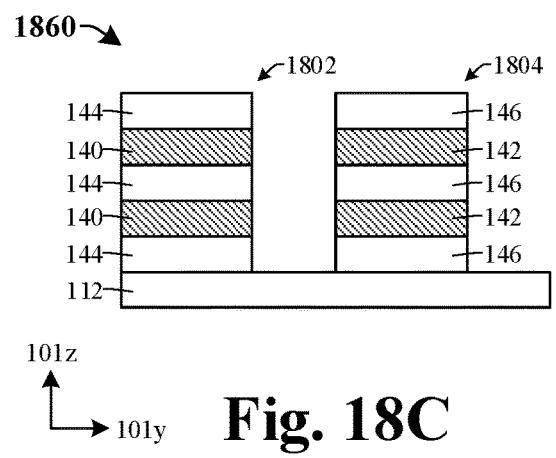
Figure 45A:
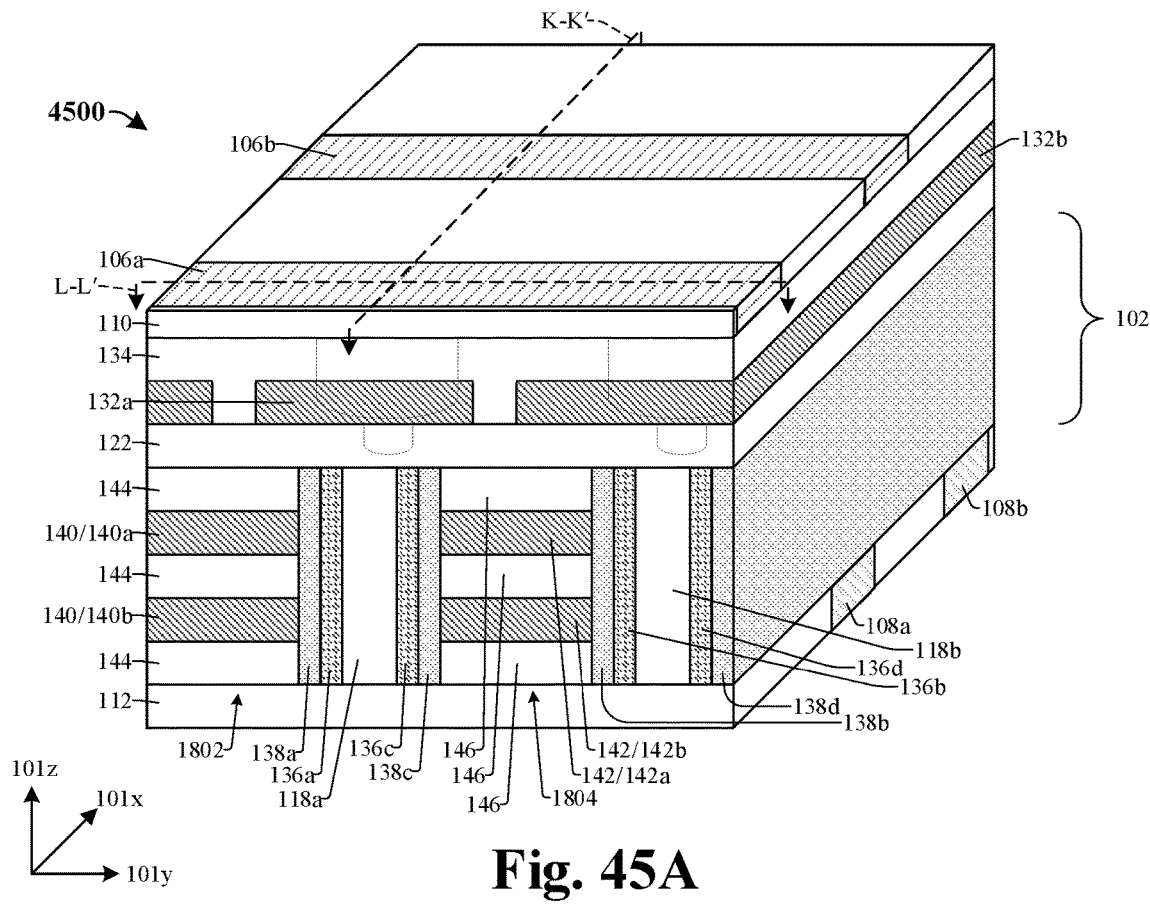
Figure 45B:
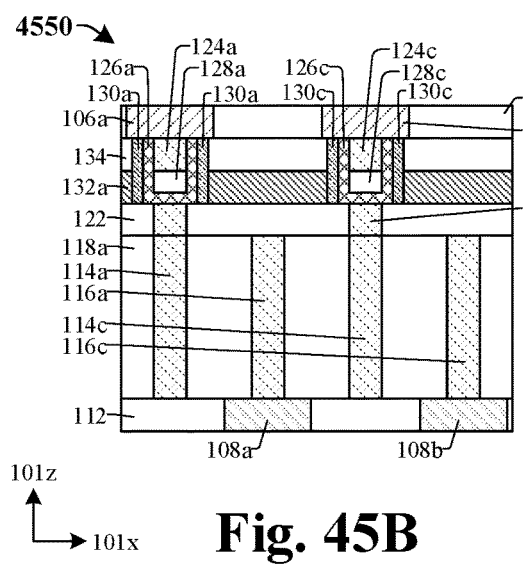
Figure 45C:
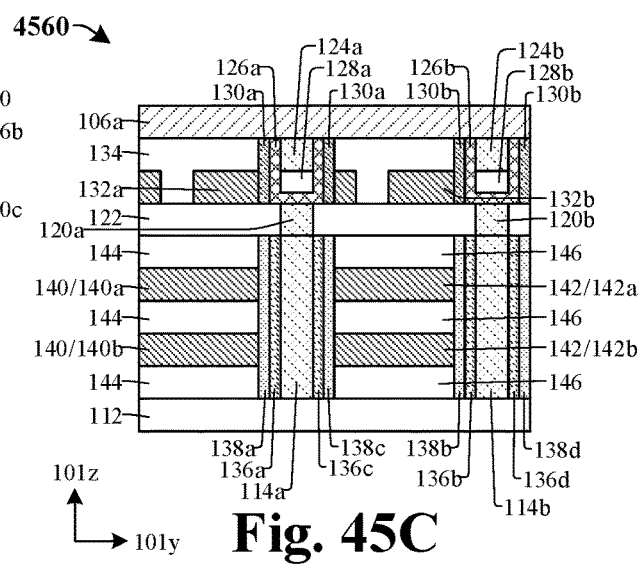

In some embodiments, cross-sectional view 1750 of FIG. 17B may, for example, be taken across line K-K' of FIG. 17A, cross-sectional view 1760 of FIG. 17C may, for example, be taken across line L-L' of FIG. 17A, cross-sectional view 1850 of FIG. 18B may, for example, be taken across line K-K' of FIG. 18A, cross-sectional view 1860 of FIG. 18C may, for example, be taken across line L-L' of FIG. 18A, and so on (e.g., through FIGS. 45A-45C).

As shown in three-dimensional view 1700 of FIG. 17A, cross-sectional view 1750 of FIG. 17B, and cross-sectional view 1760 of FIG. 17C, a plurality of first dielectric layers 1702 and a plurality of first conductive layers 1704 are formed over a first global source line 108a and a second global source line 108b in an alternating fashion. Further, the plurality of first dielectric layers 1702 and the plurality of first conductive layers 1704 are formed over a lower global line dielectric layer 112 within which the first and second global source lines 108a, 108b are arranged.

In some embodiments, the plurality of first dielectric layers 1702 may, for example, be formed by depositing silicon dioxide, silicon nitride, silicon oxynitride, or some other suitable material by a chemical vapor deposition (CVD) process, a physical vapor deposition (PVD) process, an atomic layer deposition (ALD) process, or some other suitable process. In some embodiments, the plurality of first conductive layers 1704 may, for example, be formed by depositing tungsten, copper, or some other suitable material by a sputtering process, an electroless deposition (ELD) process, an electrochemical plating (ECP) process, or some other suitable process.

As shown in three-dimensional view 1800 of FIG. 18A, cross-sectional view 1850 of FIG. 18B, and cross-sectional view 1860 of FIG. 18C, the plurality of first dielectric layers (e.g., 1702 of FIGS. 17A-C) and the plurality of first conductive layers (e.g., 1704 of FIGS. 17A-C) are patterned to form a first memory gate stack 1802 and a second memory gate stack 1804 from the plurality of first dielectric layers and the plurality of first conductive layers. The second memory gate stack 1804 is adjacent to the first memory gate stack 1802 and is laterally separated from the first memory gate stack 1802. In some embodiments, the first memory gate stack 1802 comprises a first plurality of memory gates 140 and a first plurality of inter-gate dielectric layers 144, and the second memory gate stack 1804 comprises a second plurality of memory gates 142 and a second plurality of inter-gate dielectric layers 146.

In some embodiments, the patterning may, for example, comprise forming a masking layer (not shown) over the plurality of first dielectric layers and the plurality of first conductive layers, and by subsequently etching the plurality of first dielectric layers and the plurality of first conductive layers according to the masking layer. The masking layer may, for example, be or comprise a photoresist mask, a hard mask, or some other suitable layer. The etching may, for example, comprise a dry etching process (e.g., a reactive ion etching (RIE) process, an ion beam etching (IBE) process, some plasma etching process, or the like) or some other suitable process.

Figure 19A:
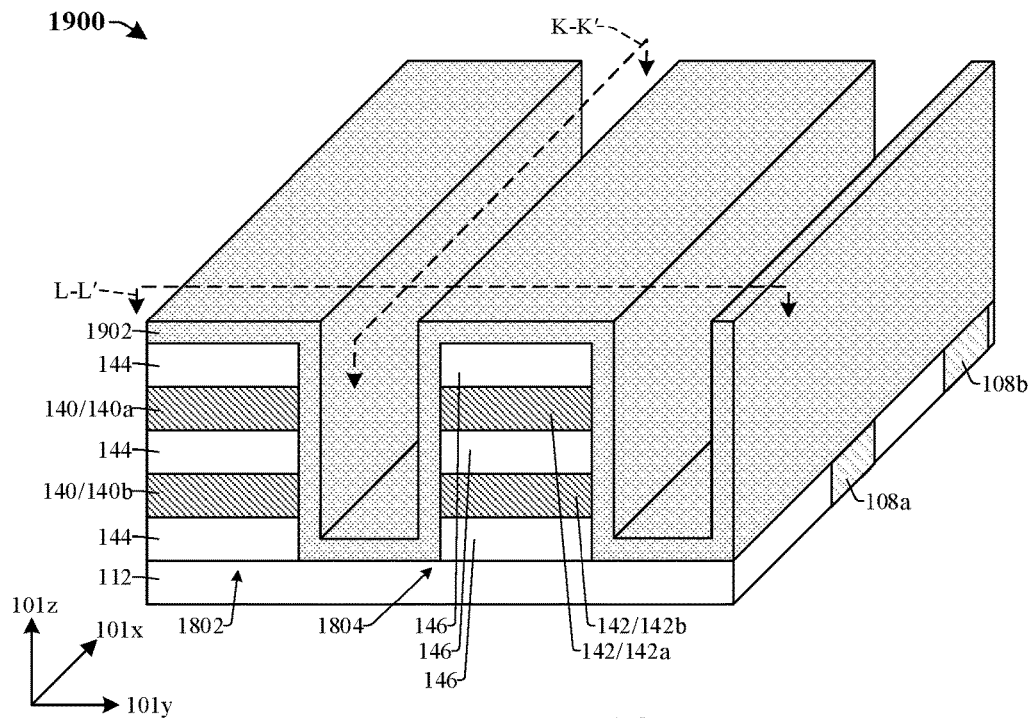
Figure 19B:
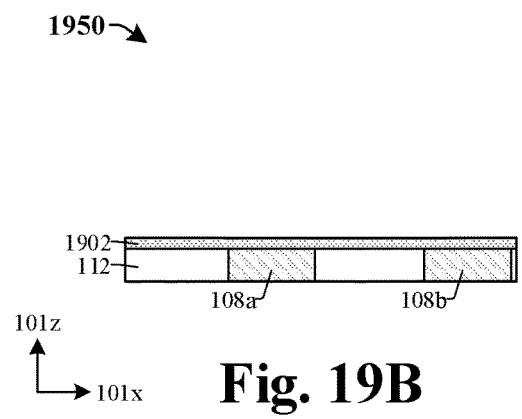
Figure 19C:
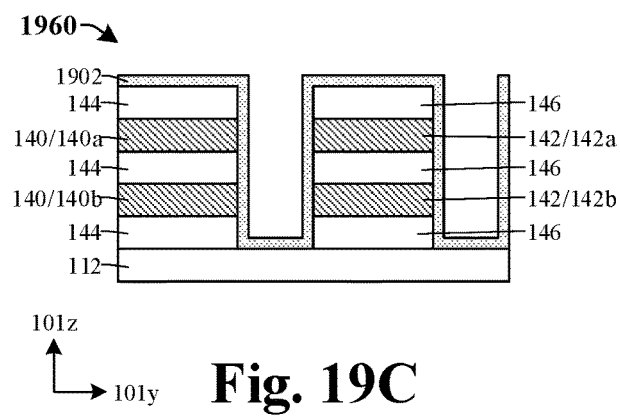

As shown in three-dimensional view 1900 of FIG. 19A, cross-sectional view 1950 of FIG. 19B, and cross-sectional view 1960 of FIG. 19C, a first memory layer 1902 is conformally formed over the first memory gate stack 1802, over the second memory gate stack 1804, and on sidewalls of the first and second memory gate stacks 1802, 1804.

In some embodiments, the first memory layer 1902 may, for example, be formed by depositing one or more dielectric layers, one or more conductive layers, or any combination of the foregoing by a CVD process, a PVD process, an ALD process, or some other suitable process.

Figure 20A:
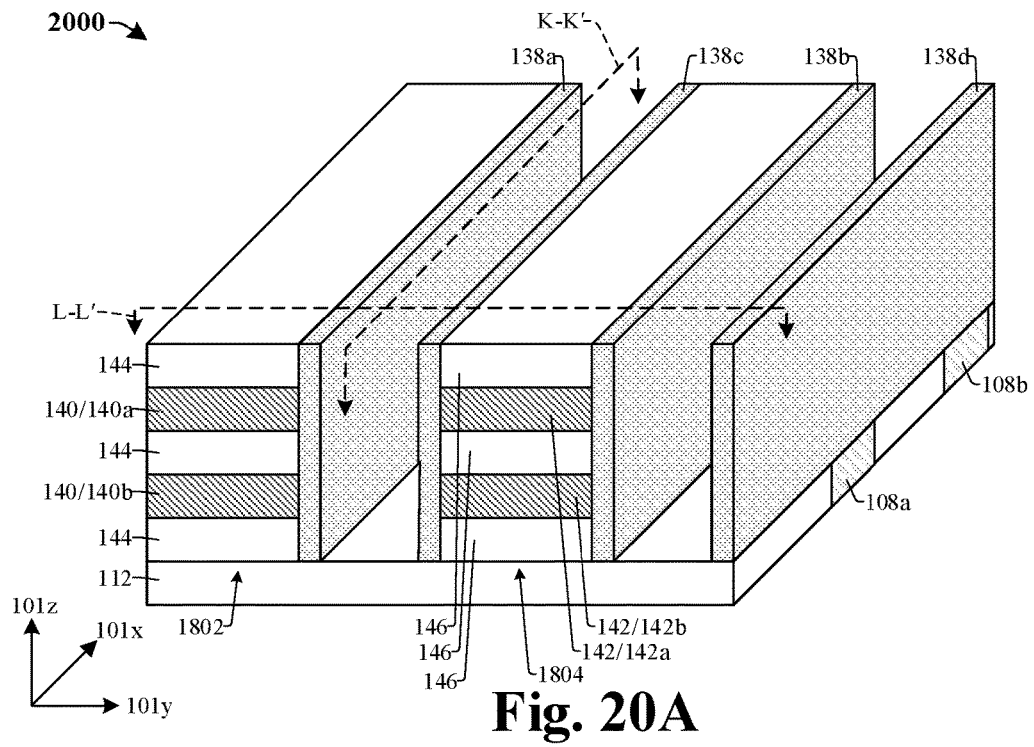
Figure 20B:
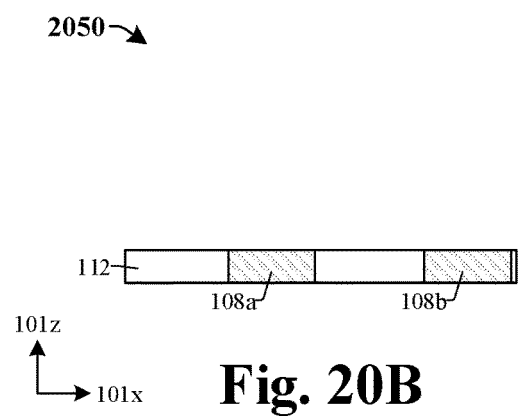
Figure 20C:
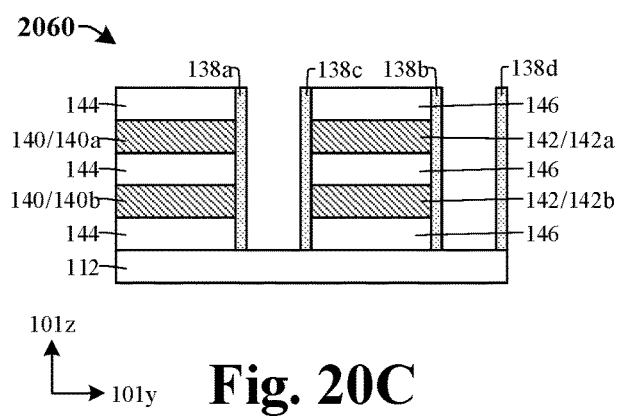

As shown in three-dimensional view 2000 of FIG. 20A, cross-sectional view 2050 of FIG. 20B, and cross-sectional view 2060 of FIG. 20C, the first memory layer (e.g., 1902 of FIGS. 19A-C) is etched to form a first memory film 138a, a second memory film 138*b*, a third memory film 138*c*, and a fourth memory film 138*d* from the first memory layer. The etching removes the first memory layer from top surfaces of the lower global line dielectric layer 112, the first global source line 108*a*, the second global source line 108*b*, the first memory gate stack 1802, and the second memory gate stack 1804.

In some embodiments, the etching may, for example, comprise a dry etching process or some other suitable process.

Figure 21A:
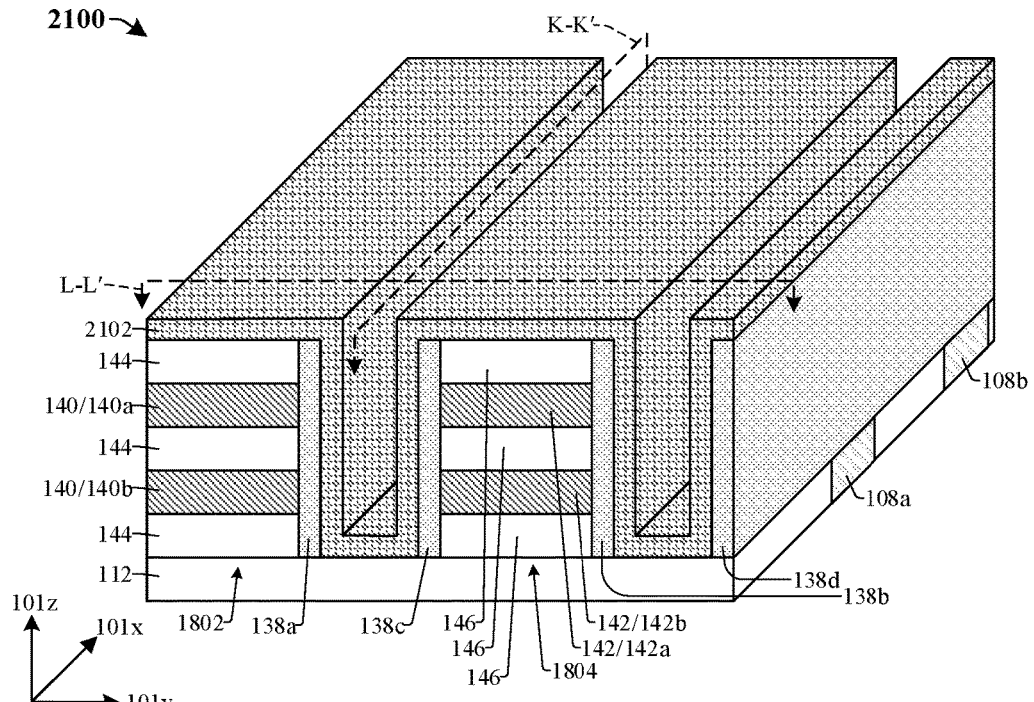
Figure 21B:
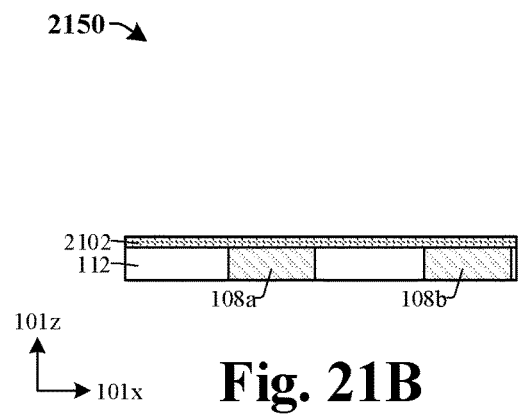
Figure 21C:
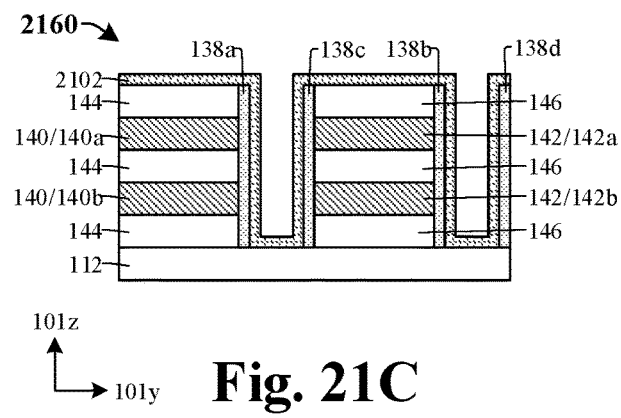

As shown in three-dimensional view 2100 of FIG. 21A, cross-sectional view 2150 of FIG. 21B, and cross-sectional view 2160 of FIG. 21C, a first semiconductor layer 2102 is conformally formed on sidewalls of the first memory film 138*a*, the second memory film 138*b*, the third memory film 138*c*, and the fourth memory film 138*d*, and also over the first and second memory gate stacks 1802, 1804.

In some embodiments, the first semiconductor layer 2102 may, for example, be formed by depositing silicon, germanium, silicon germanium, gallium arsenide, or some other suitable material by a CVD process, a PVD process, an ALD process, an epitaxy process, or some other suitable process.

Figure 22A:
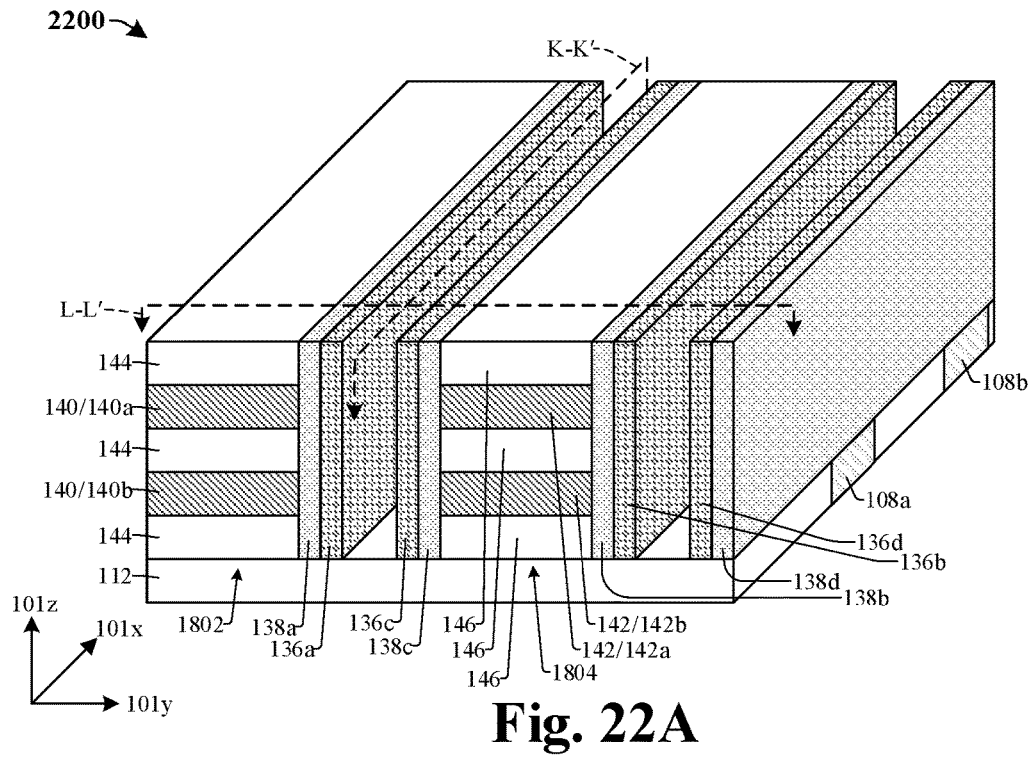
Figure 22B:
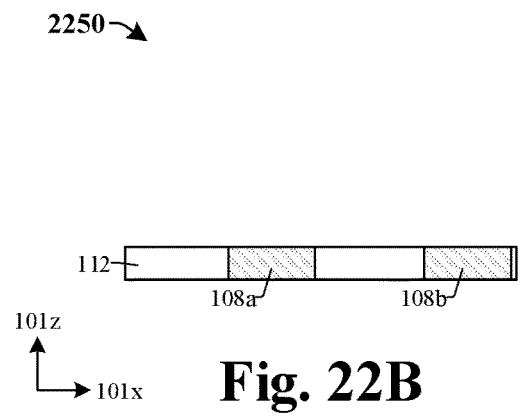
Figure 22C:
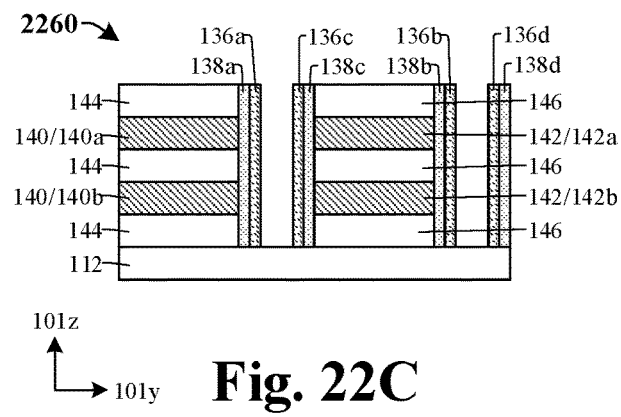

As shown in three-dimensional view 2200 of FIG. 22A, cross-sectional view 2250 of FIG. 22B, and cross-sectional view 2260 of FIG. 22C, the first semiconductor layer (e.g., 2102 of FIGS. 21A-C) is etched to form a first memory channel layer 136*a*, a second memory channel layer 136*b*, a third memory channel layer 136*c*, and a fourth memory channel layer 136*d* from the first semiconductor layer. The etching removes the first semiconductor layer from top surfaces of the lower global line dielectric layer 112, the first global source line 108*a*, the second global source line 108*b*, the first memory gate stack 1802, and the second memory gate stack 1804.

In some embodiments, the etching may, for example, comprise a dry etching process or some other suitable process.

Figure 23A:
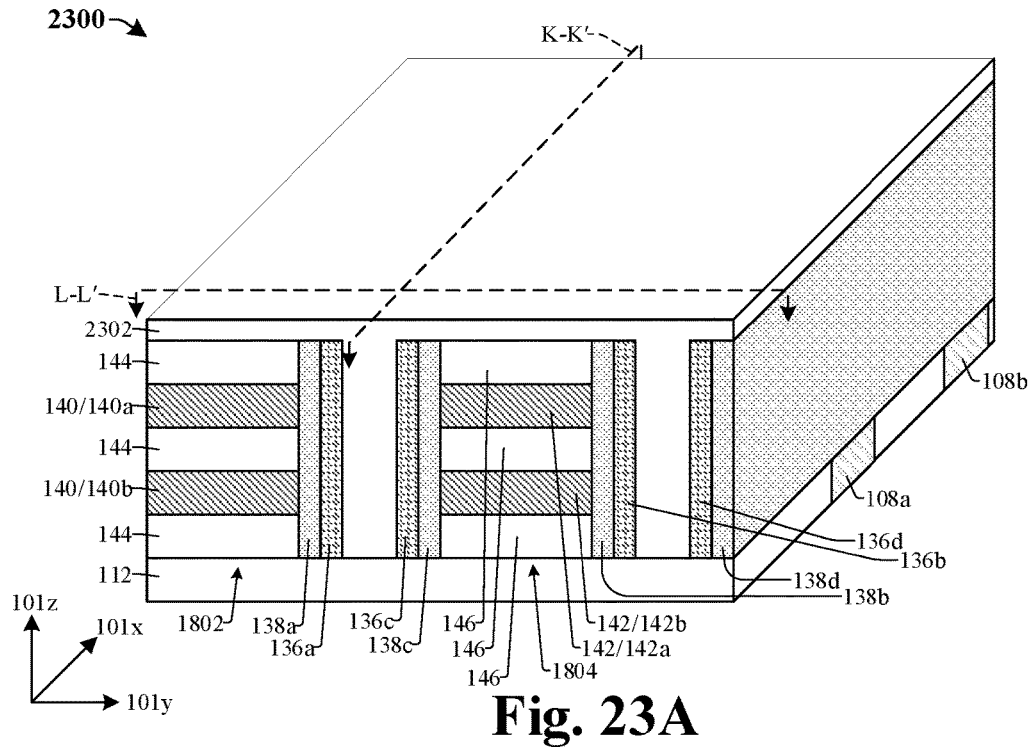
Figure 23B:
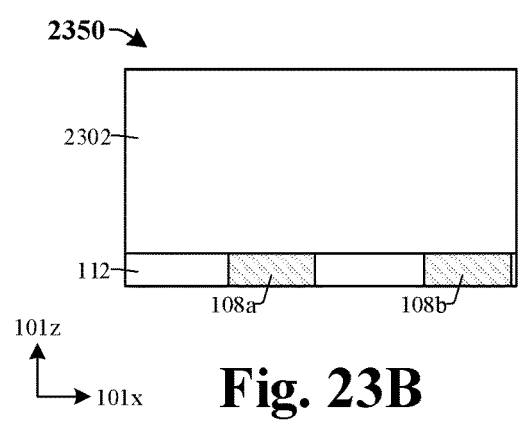
Figure 23C:
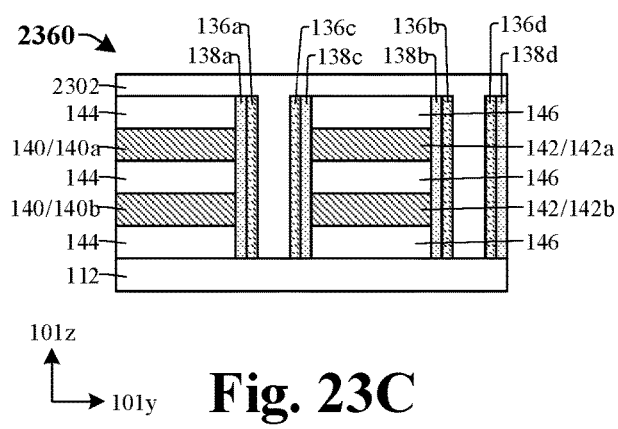

As shown in three-dimensional view 2300 of FIG. 23A, cross-sectional view 2350 of FIG. 23B, and cross-sectional view 2360 of FIG. 23C, a second dielectric layer 2302 formed over the first and second memory gate stacks, between sidewalls of the first memory channel layer 136*a* and the third memory channel layer 136*c*, and between sidewalls of the second memory channel layer 136*b* and the fourth memory channel layer 136*d*.

In some embodiments, the second dielectric layer 2302 may, for example, be formed by depositing silicon dioxide, silicon nitride, silicon oxynitride, or some other suitable material by a CVD process, a PVD process, an ALD process, or some other suitable process.

Figure 24A:
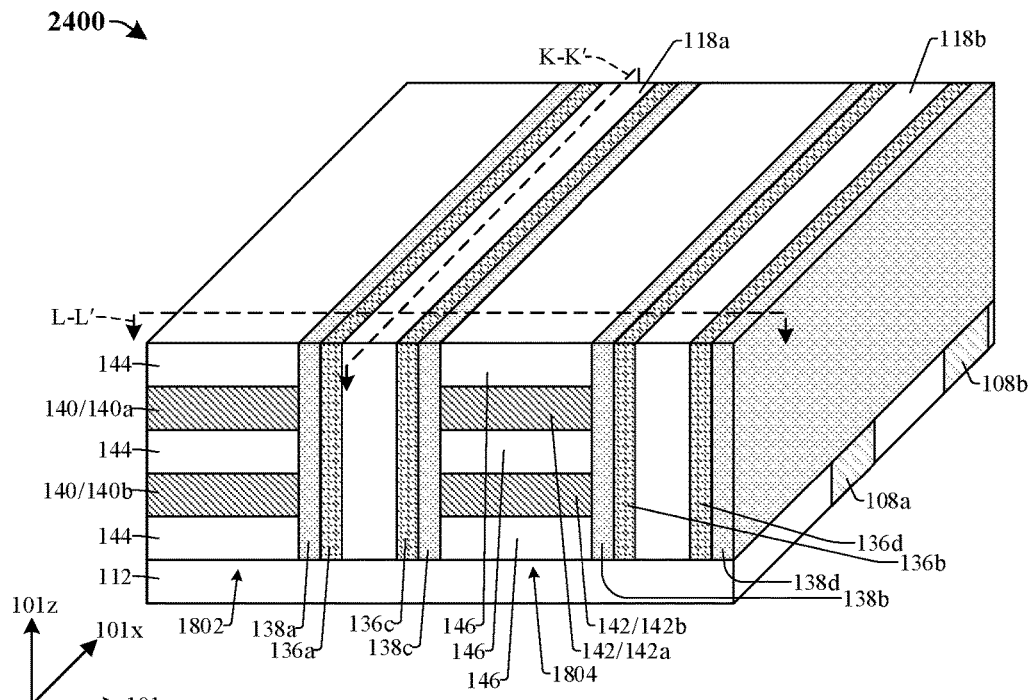
Figure 24B:
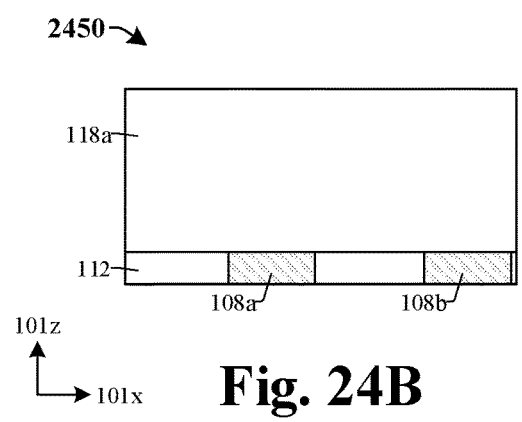
Figure 24C:
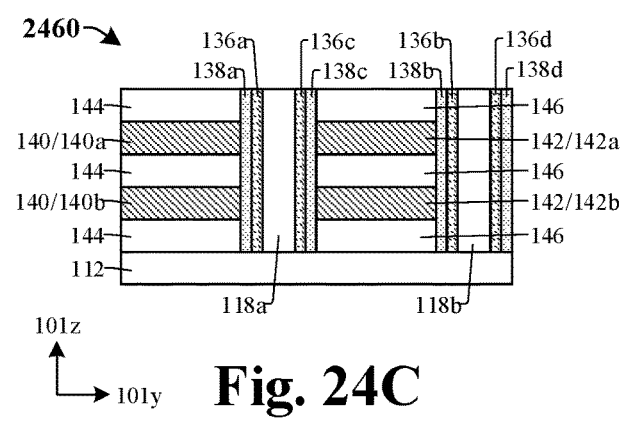

As shown in three-dimensional view 2400 of FIG. 24A, cross-sectional view 2450 of FIG. 24B, and cross-sectional view 2460 of FIG. 24C, the second dielectric layer (e.g., 2302 of FIGS. 23A-C) is removed from top surfaces of the first memory gate stack 1802, the second memory gate stack 1804, the first memory channel layer 136*a*, the second memory channel layer 136*b*, the third memory channel layer 136*c*, the fourth memory channel layer 136*d*, the first memory film 138*a*, the second memory film 138*b*, the third memory film 138*c*, and the fourth memory film 138*d*. The removal process forms a first local line dielectric layer 118*a* and a second local line dielectric layer 118*b* from the second dielectric layer.

In some embodiments, removing the second dielectric layer may, for example, comprise a planarization process (e.g., a chemical mechanical planarization (CMP) or the like), an etching process (e.g., a dry etching process or the like), or some other suitable process.

Figure 25A:
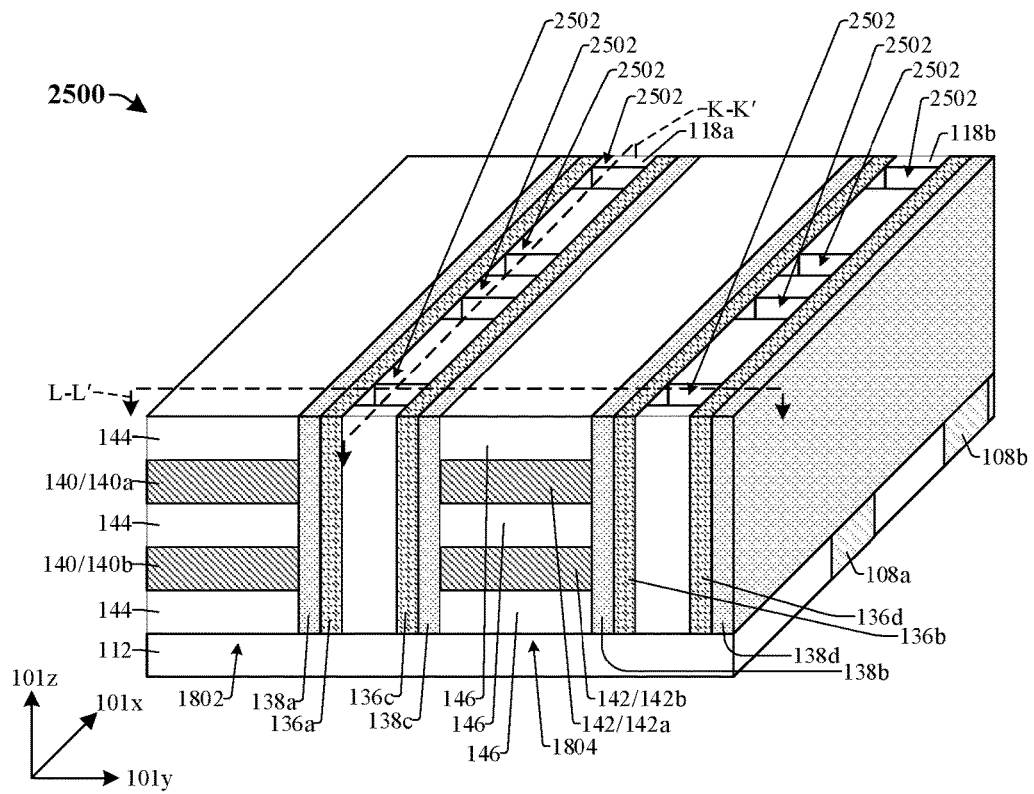
Figure 25B:
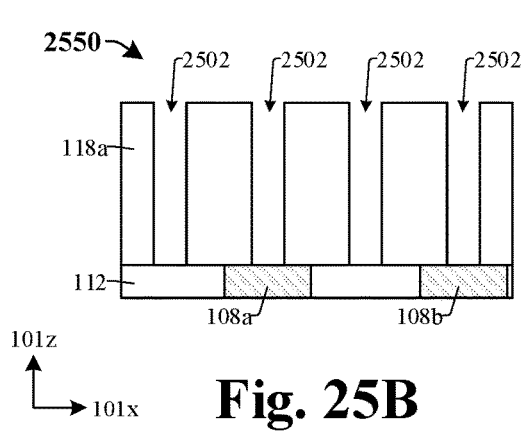
Figure 25C:
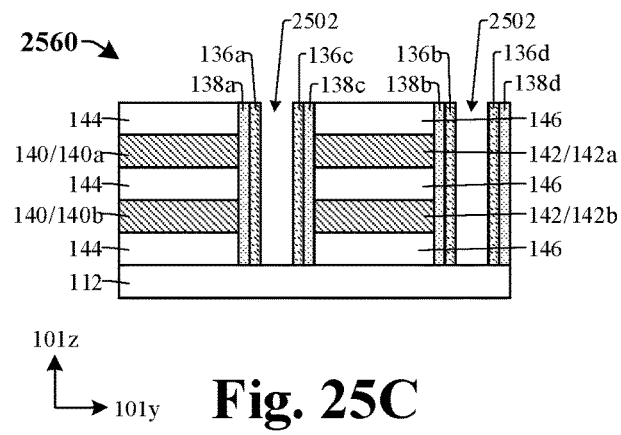

As shown in three-dimensional view 2500 of FIG. 25A, cross-sectional view 2550 of FIG. 25B, and cross-sectional view 2560 of FIG. 25C, the first local line dielectric layer 118*a* and the second local line dielectric layer 118*b* are patterned to form a plurality of local line openings 2502 in the first local line dielectric layer 118*a* and the second local line dielectric layer 118*b*.

In some embodiments, the patterning may, for example, comprise forming a masking layer (not shown), and subsequently etching the first local line dielectric layer 118*a* and the second local line dielectric layer 118*b* according to the masking layer. The masking layer may, for example, be or comprise a photoresist mask, a hard mask, or some other suitable layer. The etching may, for example, comprise a dry etching process or some other suitable process.

Figure 26A:
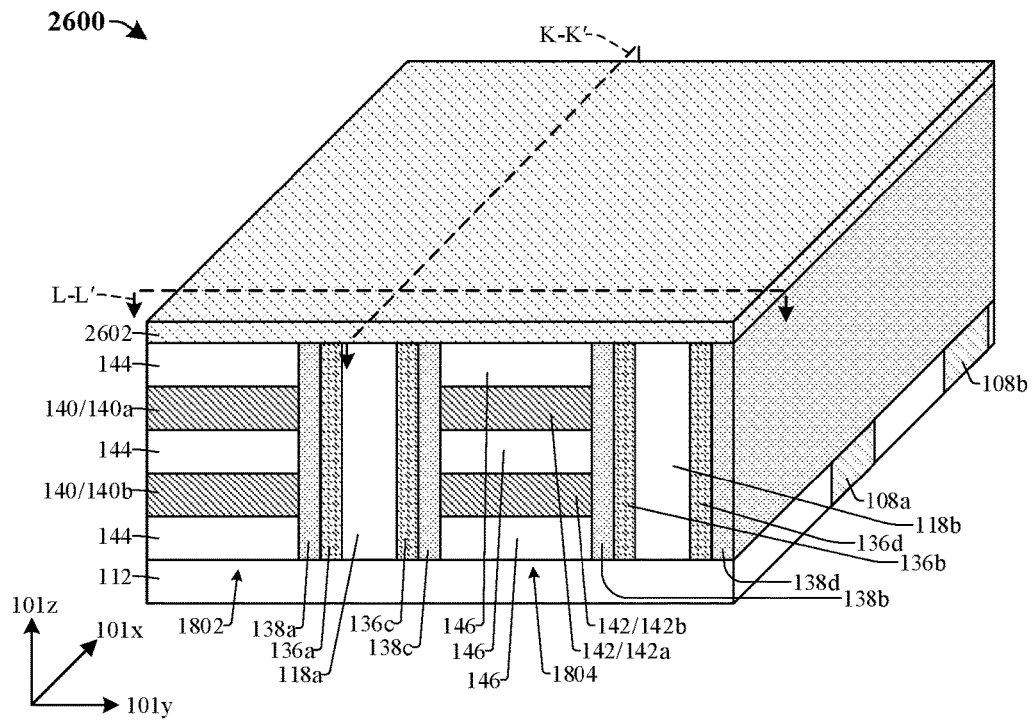
Figure 26B:
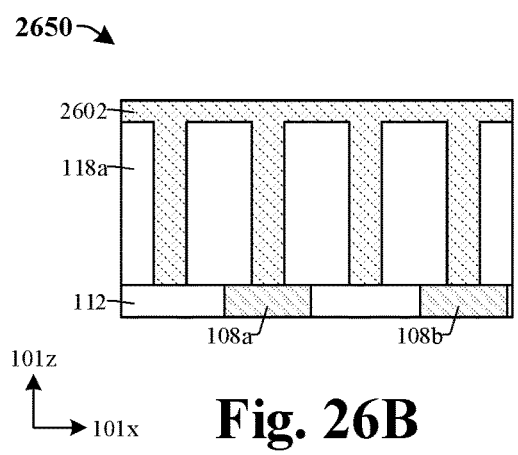
Figure 26C:
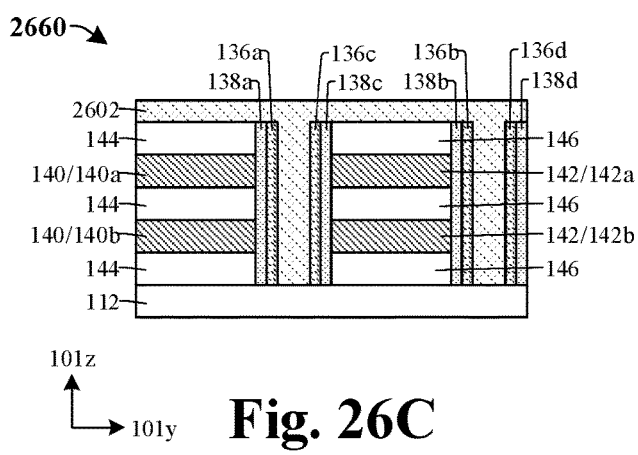

As shown in three-dimensional view 2600 of FIG. 26A, cross-sectional view 2650 of FIG. 26B, and cross-sectional view 2660 of FIG. 26C, a second conductive layer 2602 is formed over and in the plurality of local line openings (e.g., 2502 of FIGS. 25A-C).

In some embodiments, the second conductive layer 2602 may, for example, be formed by depositing tungsten, copper, or some other suitable metal by a sputtering process, an ELD process, an ECP process, or some other suitable process. In some other embodiments, the second conductive layer 2602 may, for example, be formed by depositing doped silicon or some other doped semiconductor by a CVD process, a PVD process, an ALD process, an epitaxy process, or some other suitable process.

Figure 27A:
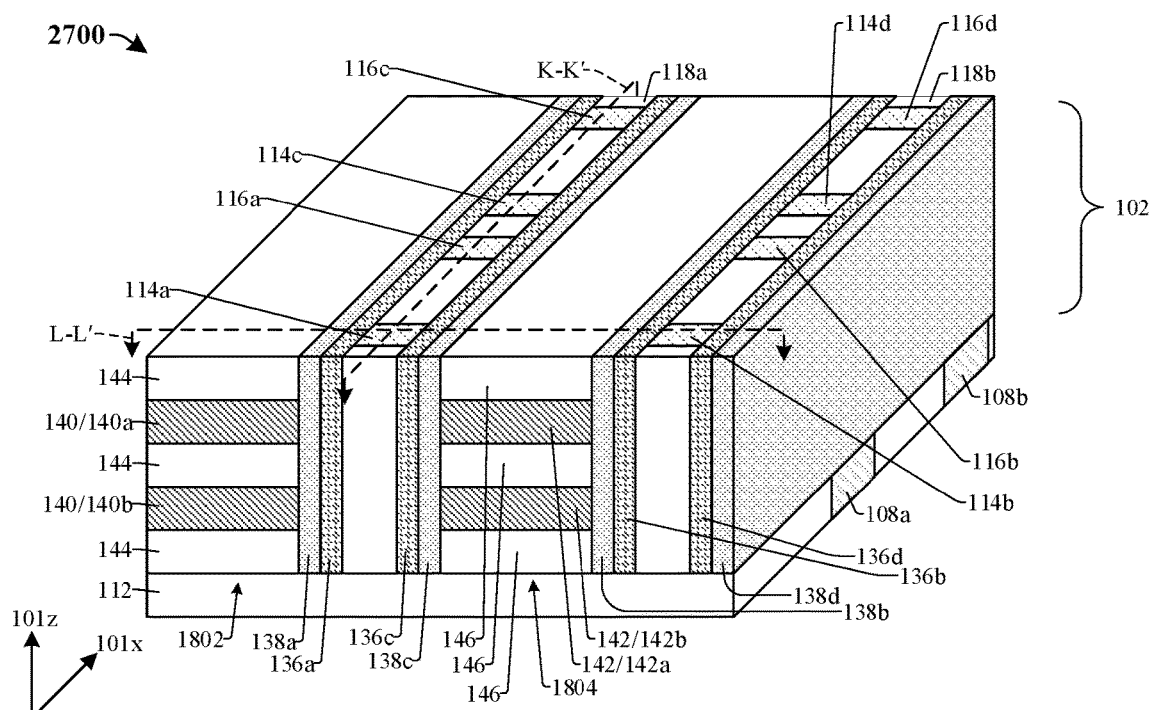
Figure 27B:
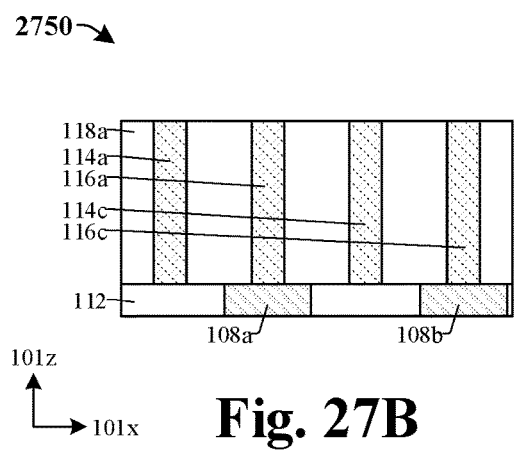
Figure 27C:
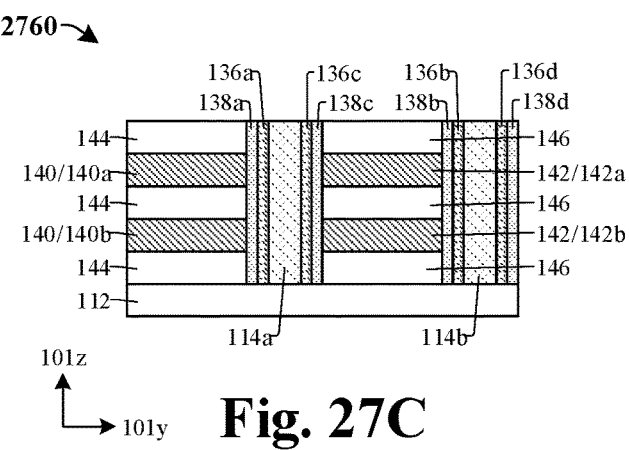

As shown in three-dimensional view 2700 of FIG. 27A, cross-sectional view 2750 of FIG. 27B, and cross-sectional view 2760 of FIG. 27C, the second conductive layer (e.g., 2602 of FIGS. 26A-C) is removed from top surfaces of the first memory gate stack 1802, the second memory gate stack 1804, the first memory channel layer 136*a*, the second memory channel layer 136*b*, the third memory channel layer 136*c*, the fourth memory channel layer 136*d*, the first memory film 138*a*, the second memory film 138*b*, the third memory film 138*c*, the fourth memory film 138*d*, the first local line dielectric layer 118*a*, and second local line dielectric layer 118*b*. The removal process forms a plurality of local lines (e.g., a first local bit line 114*a*, a first local source line 116*a*, a second local bit line 114*b*, a second local source line 116*b*, a third local bit line 114*c*, a third local source line 116*c*, a fourth local bit line 114*d*, and fourth local source line 116*d*) from the second conductive layer.

In some embodiments, removing the second conductive layer may, for example, comprise a planarization process (e.g., a CMP or the like), an etching process (e.g., a dry etching process or the like), or some other suitable process. In some embodiments, this step completes the formation of the three-dimensional memory array 102.

Figure 28A:
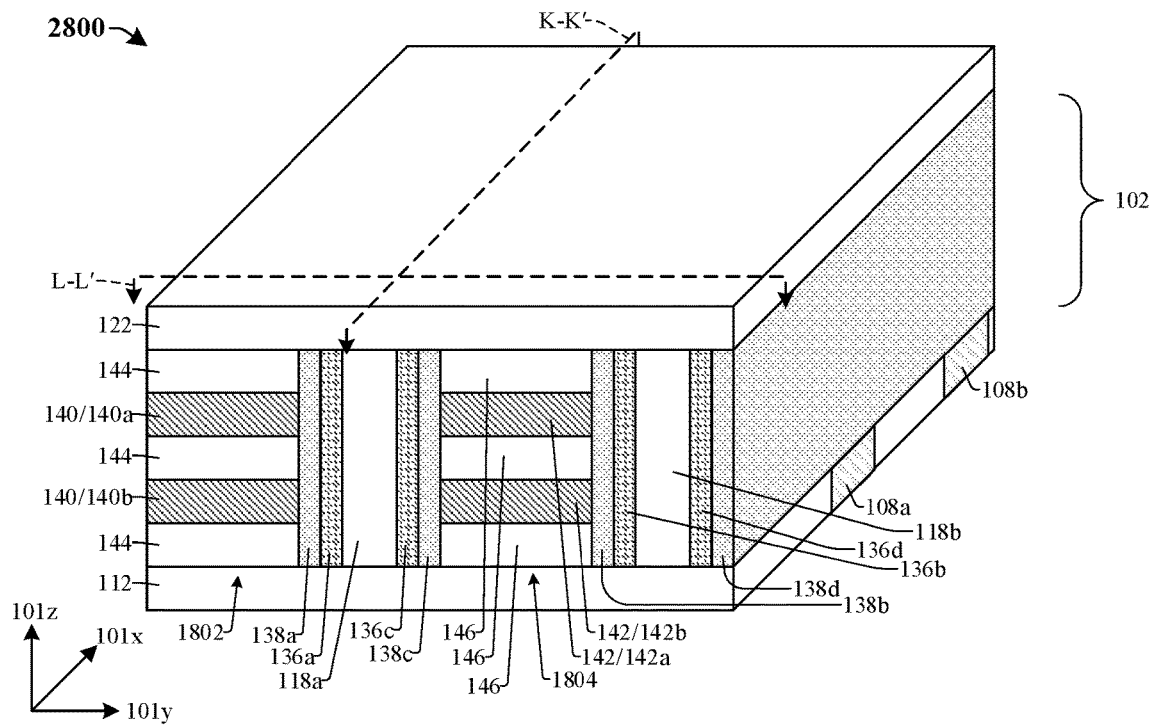
Figure 28B:
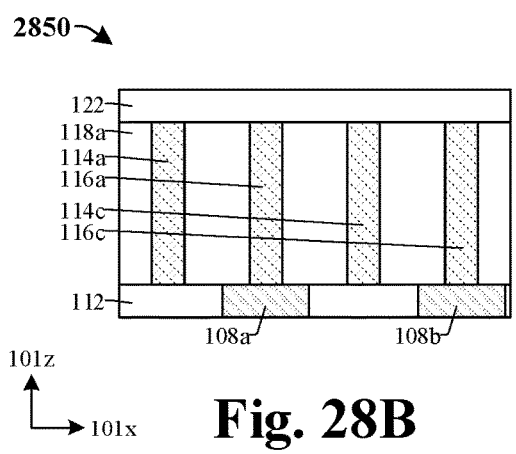
Figure 28C:
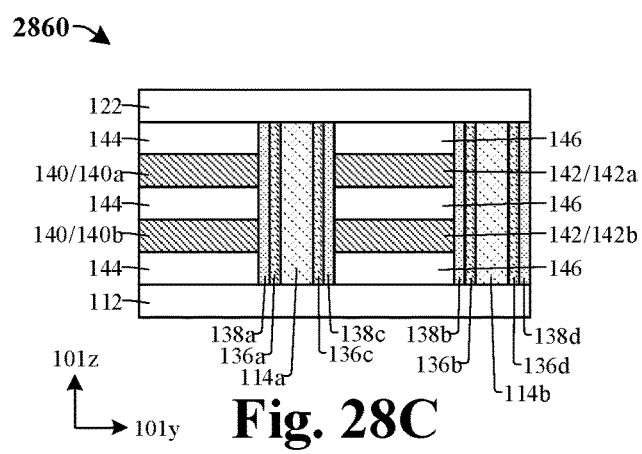

As shown in three-dimensional view 2800 of FIG. 28A, cross-sectional view 2850 of FIG. 28B, and cross-sectional view 2860 of FIG. 28C, a lower selector dielectric layer 122 is formed over the three-dimensional memory array 102.

In some embodiments, the lower selector dielectric layer 122 may, for example, be formed by depositing silicon dioxide, silicon nitride, silicon oxynitride, or some other suitable material by a CVD process, a PVD process, an ALD process, or some other suitable process.

Figure 29A:
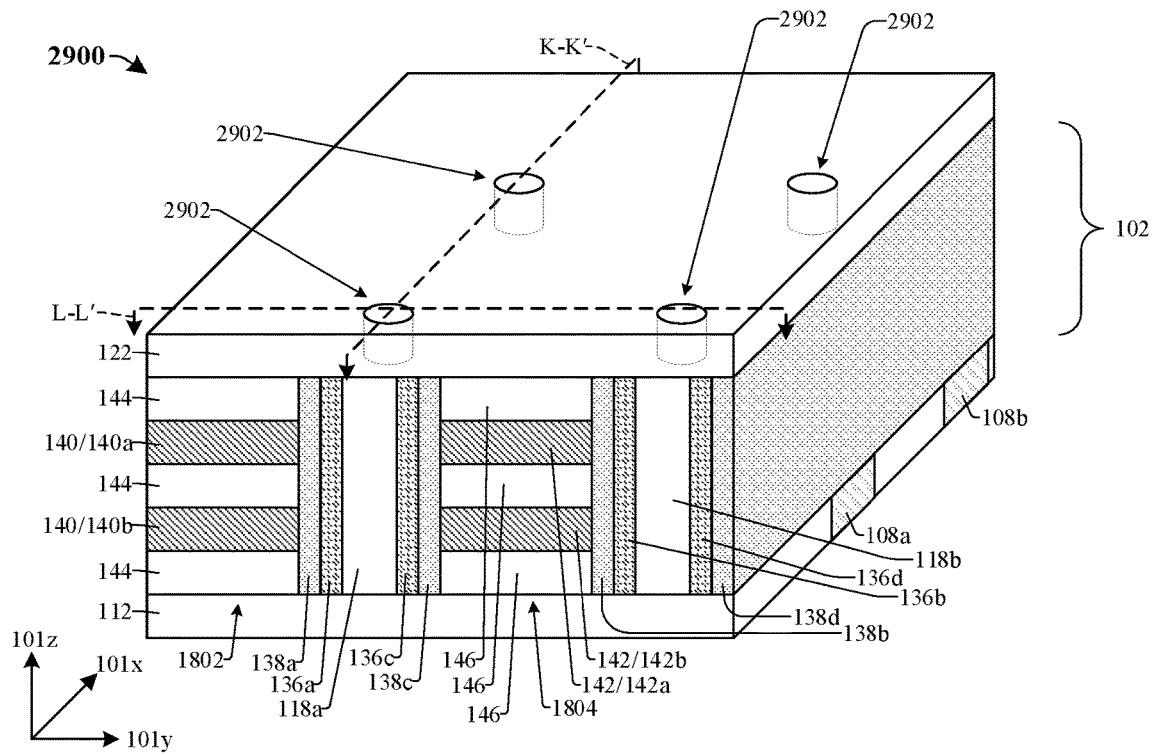
Figure 29B:
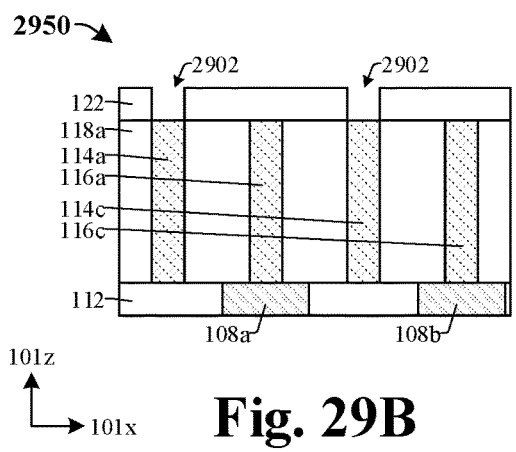
Figure 29C:
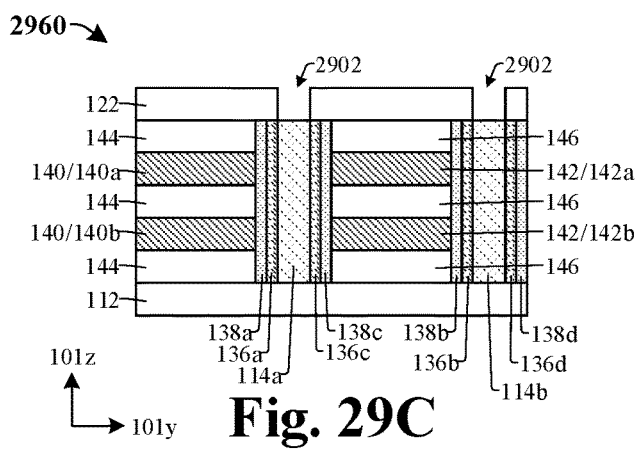

As shown in three-dimensional view 2900 of FIG. 29A, cross-sectional view 2950 of FIG. 29B, and cross-sectional view 2960 of FIG. 29C, the lower selector dielectric layer 122 is patterned to form a plurality of lower source/drain openings 2902 in the lower selector dielectric layer 122. The lower source/drain openings 2902 are directly over the local bit lines (e.g., 114*a*, 114*b*, etc.) of the three-dimensional memory array 102.

In some embodiments, the patterning may, for example, comprise forming a masking layer (not shown) over the lower selector dielectric layer 122, and subsequently etching the lower selector dielectric layer 122 according to the masking layer. The masking layer may, for example, be or comprise a photoresist mask, a hard mask, or some other suitable layer. The etching may, for example, comprise a dry etching process or some other suitable process.

Figure 30A:
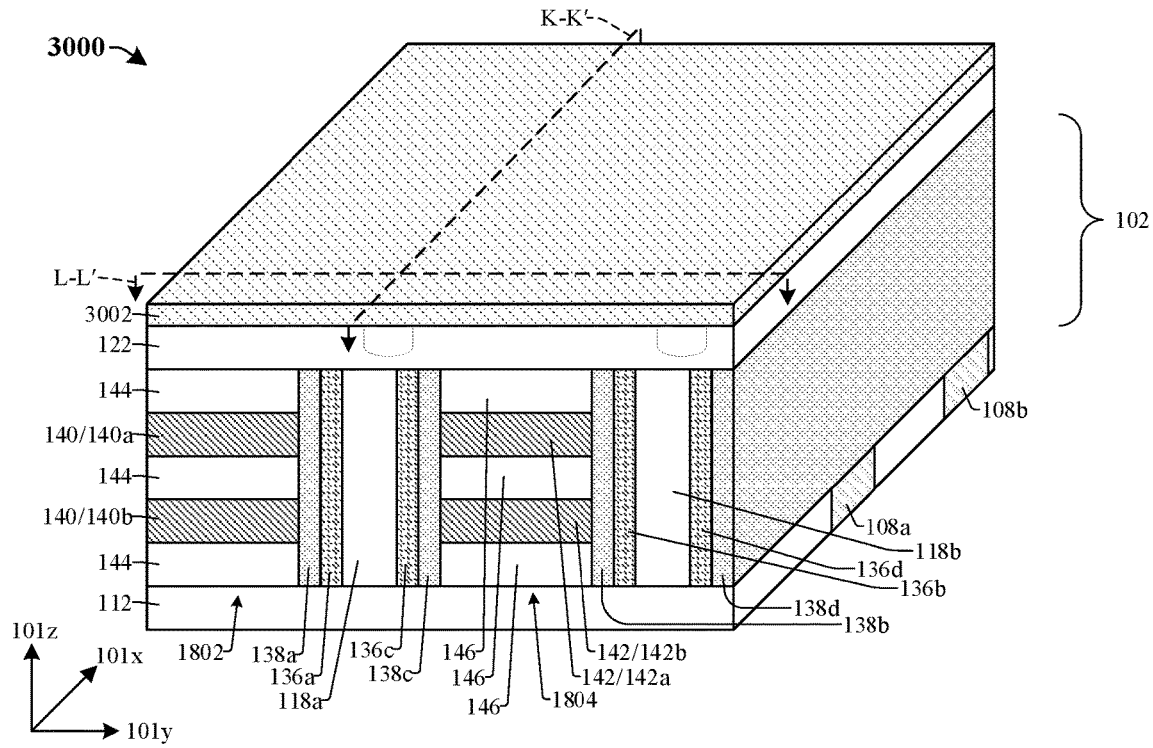
Figure 30B:
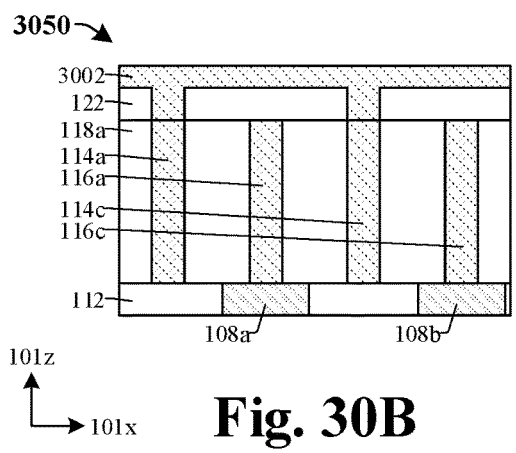
Figure 30C:
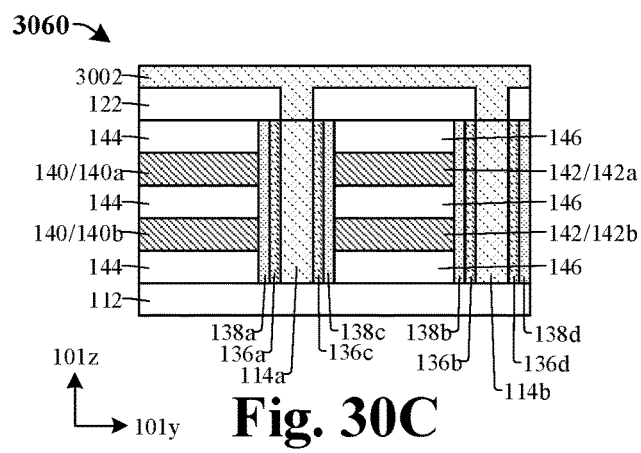

As shown in three-dimensional view 3000 of FIG. 30A, cross-sectional view 3050 of FIG. 30B, and cross-sectional view 3060 of FIG. 30C, a third conductive layer 3002 is formed over the lower selector dielectric layer 122 and in the plurality of lower source/drain openings 2902.

In some embodiments, the third conductive layer 3002 may, for example, be formed by depositing tungsten, copper, or some other suitable metal by a sputtering process, an ELD process, an ECP process, or some other suitable process. In some other embodiments, the third conductive layer 3002 may, for example, be formed by depositing doped silicon or some other doped semiconductor by a CVD process, a PVD process, an ALD process, an epitaxy process, or some other suitable process.

Figure 31A:
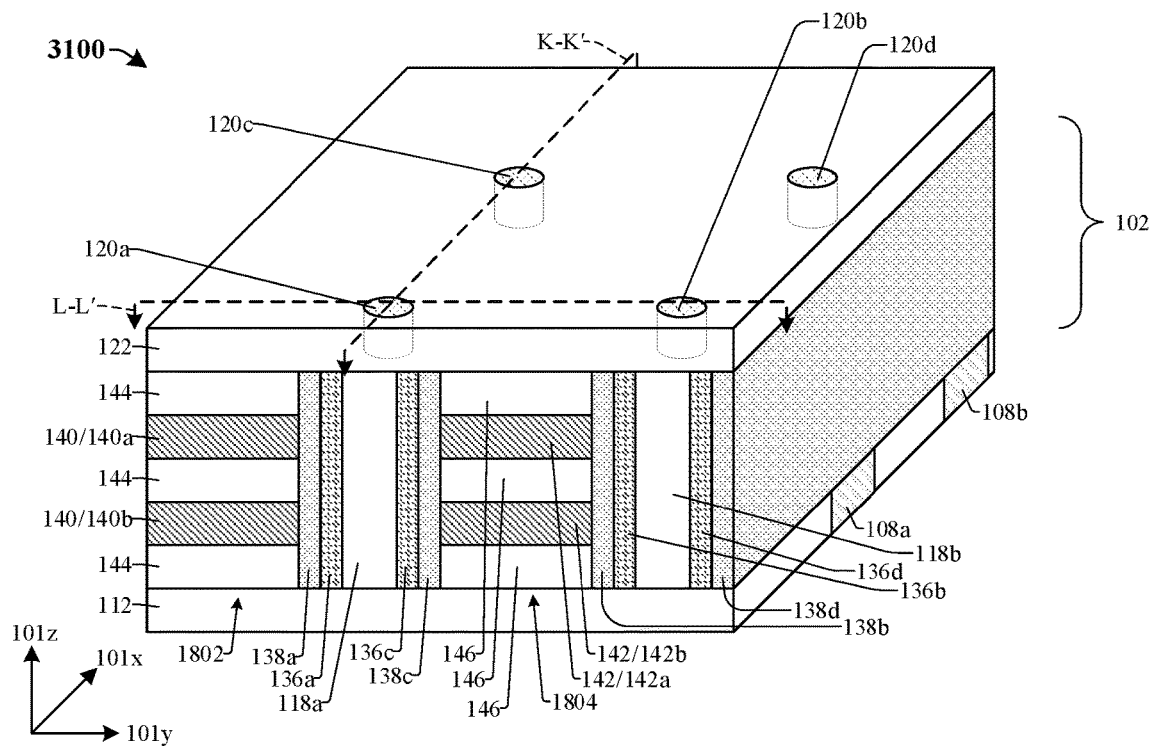
Figure 31B:
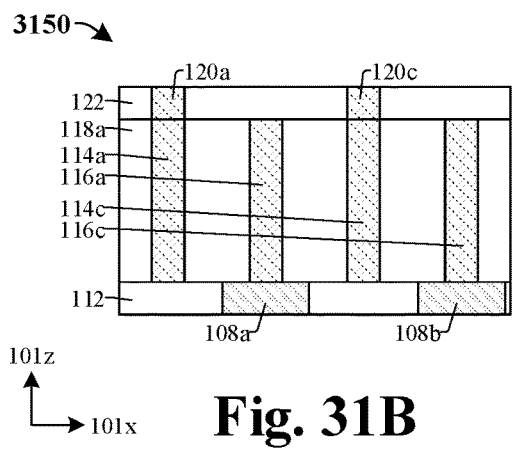
Figure 31C:
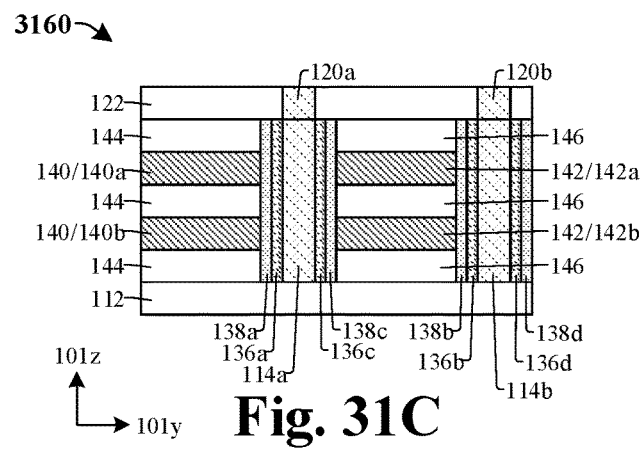

As shown in three-dimensional view 3100 of FIG. 31A, cross-sectional view 3150 of FIG. 31B, and cross-sectional view 3160 of FIG. 31C, the third conductive layer (e.g., 3002 of FIGS. 30A-C) is removed from a top surface of the lower selector dielectric layer 122. The removal process forms a plurality of lower source/drain electrodes (e.g., a first lower source/drain electrode 120*a*, a second lower source/drain electrode 120*b*, a third lower source/drain electrode 120*c*, and a fourth lower source/drain electrode 120*d*) from the third conductive layer.

In some embodiments, removing the third conductive layer may, for example, comprise a planarization process (e.g., a CMP or the like), an etching process (e.g., a dry etching process or the like), or some other suitable process.

Figure 32A:
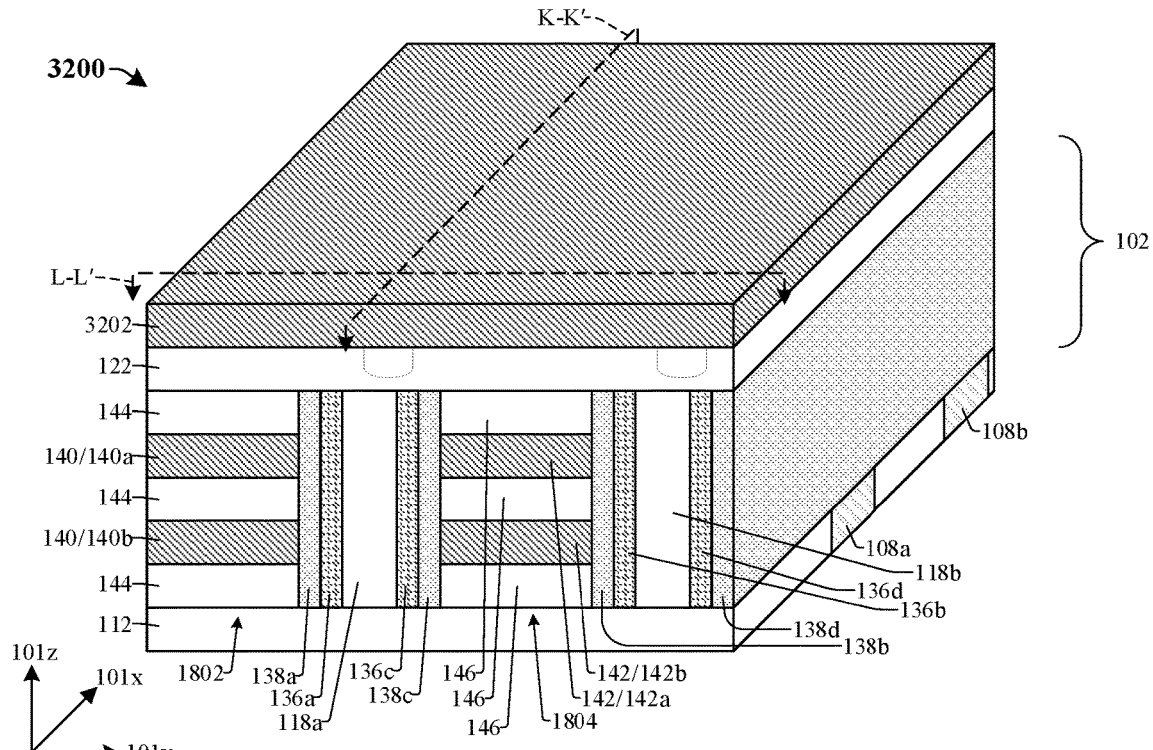
Figure 32B:
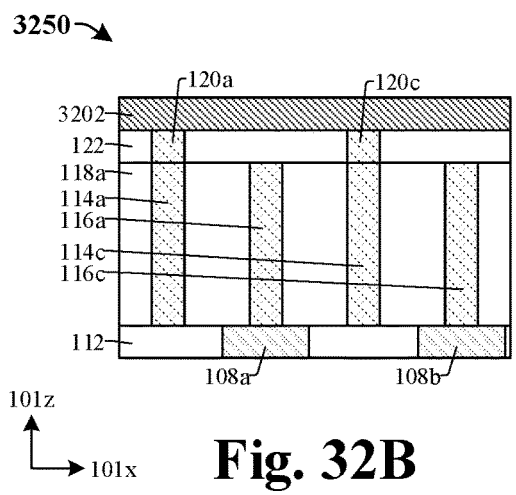
Figure 32C:
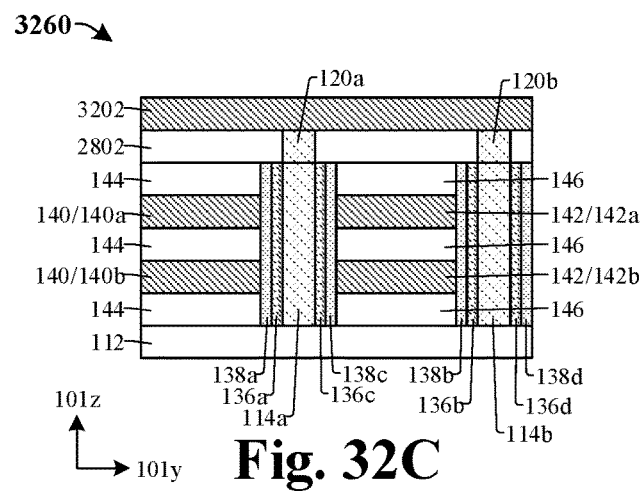

As shown in three-dimensional view 3200 of FIG. 32A, cross-sectional view 3250 of FIG. 32B, and cross-sectional view 3260 of FIG. 32C, a fourth conductive layer 3202 is formed over the lower selector dielectric layer 122 and over the plurality of lower source/drain electrodes.

In some embodiments, the fourth conductive layer 3202 may, for example, be formed by depositing tungsten, copper, or some other suitable material by a sputtering process, an ELD process, an ECP process, or some other suitable process.

Figure 33A:
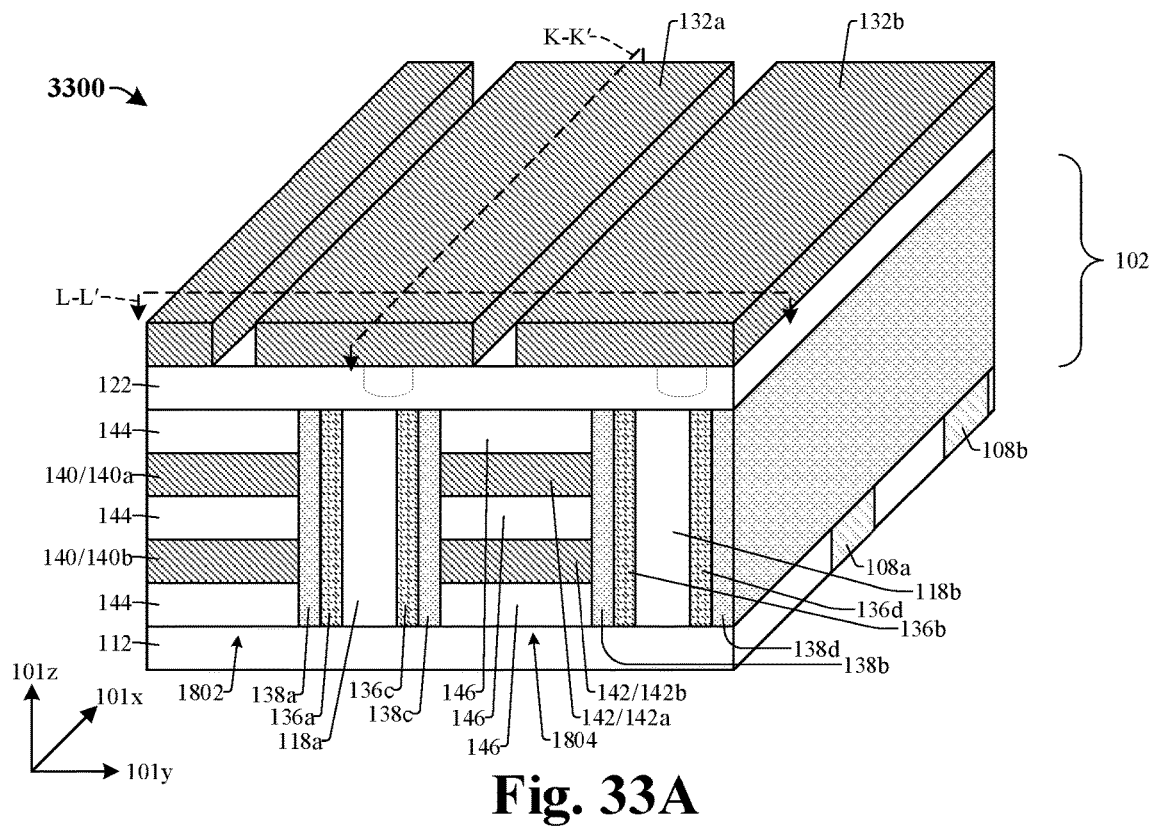
Figure 33B:
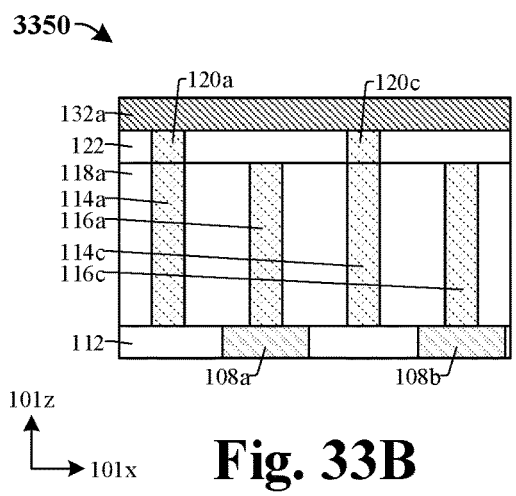
Figure 33C:
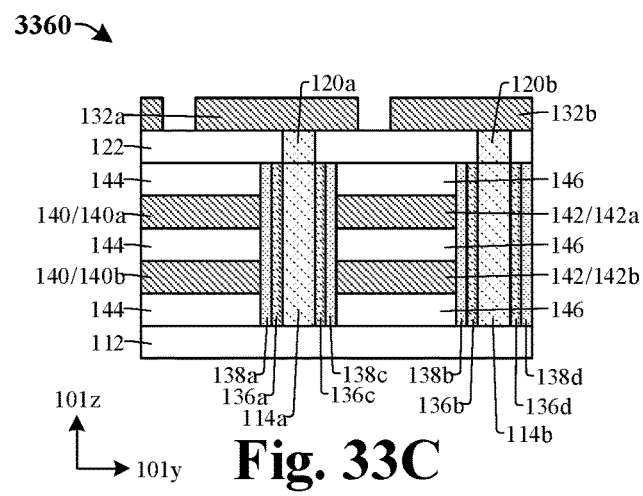

As shown in three-dimensional view 3300 of FIG. 33A, cross-sectional view 3350 of FIG. 33B, and cross-sectional view 3360 of FIG. 33C, the fourth conductive layer (e.g., 3202 of FIGS. 32A-C) is patterned to form a first selector gate 132*a* and a second selector gate 132*b* from the fourth conductive layer.

In some embodiments, the patterning may, for example, comprise forming a masking layer (not shown) over the fourth conductive layer, and subsequently etching the fourth conductive layer according to the masking layer. The masking layer may, for example, be or comprise a photoresist mask, a hard mask, or some other suitable layer. The etching may, for example, comprise a dry etching process or some other suitable process.

Figure 34A:
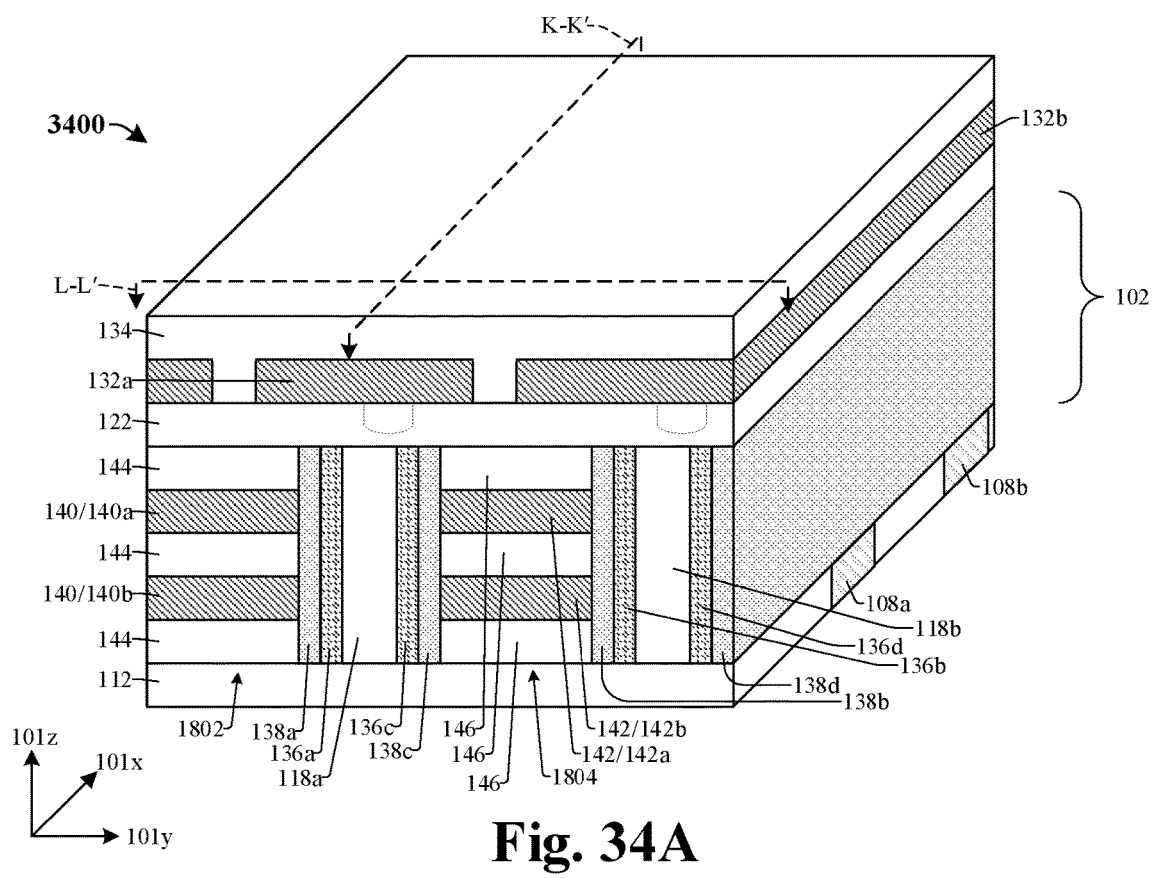
Figure 34B:
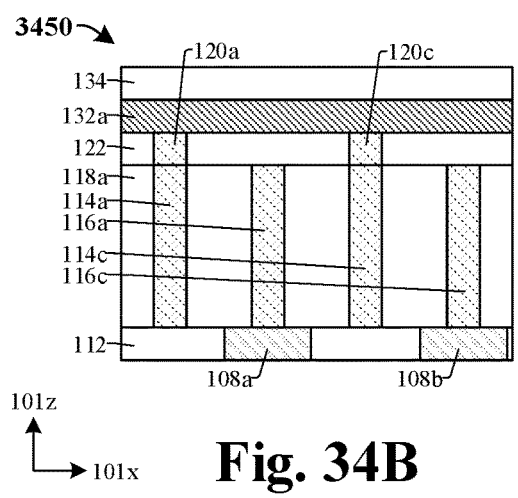
Figure 34C:
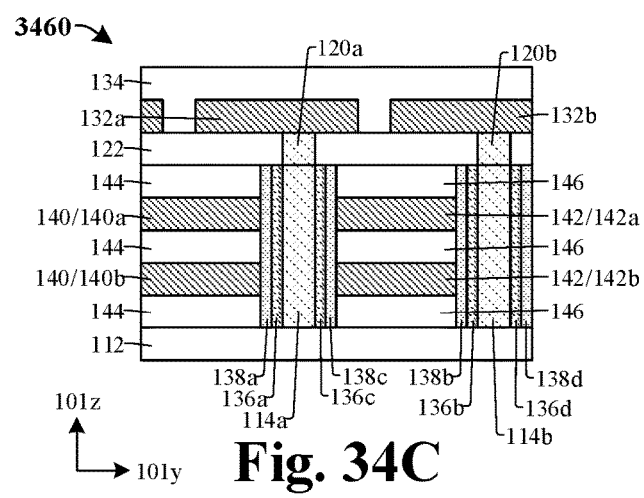

As shown in three-dimensional view 3400 of FIG. 34A, cross-sectional view 3450 of FIG. 34B, and cross-sectional view 3460 of FIG. 34C, an upper selector dielectric layer 134 is formed over the first selector gate 132*a*, over the second selector gate 132*b*, and between the selector gates.

In some embodiments, the upper selector dielectric layer 134 may, for example, be formed by depositing the upper selector dielectric layer 134 and subsequently planarizing a top surface of the upper selector dielectric layer 134. The upper selector dielectric layer 134 may be deposited as silicon dioxide, silicon nitride, silicon oxynitride, or some other suitable material and/or may be deposited by a CVD process, a PVD process, an ALD process, or some other suitable process. The planarization may, for example, be performed by a CMP or some other suitable process.

As shown in three-dimensional view 3500 of FIG. 35A, cross-sectional view 3550 of FIG. 35B, and cross-sectional view 3560 of FIG. 35C, the upper selector dielectric layer 134 and the selector gates (e.g., the first selector gate 132*a* and the second selector gate 132*b*) are patterned to form a plurality of channel openings 3502 in the upper selector dielectric layer 134 and in the selector gates. The channel openings 3502 extend through the upper selector dielectric layer 134 and through the selector gates to top surfaces of the lower source/drain electrodes (e.g., 120*a*-120*d*).

In some embodiments, the patterning may, for example, comprise forming a masking layer (not shown) over the upper selector dielectric layer 134, and subsequently etching the upper selector dielectric layer 134 according to the masking layer. The masking layer may, for example, be or comprise a photoresist mask, a hard mask, or some other suitable layer. The etching may, for example, comprise a dry etching process or some other suitable process.

Figure 36A:
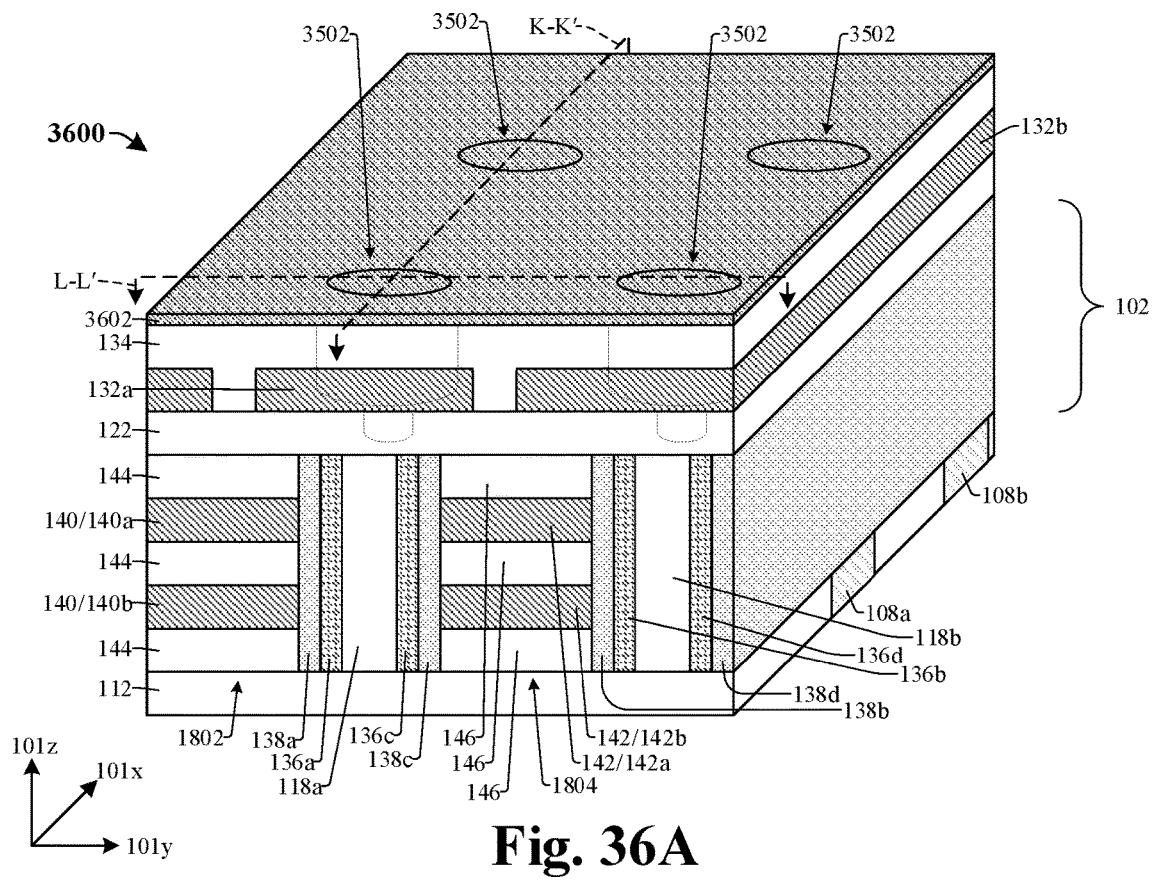
Figure 36B:
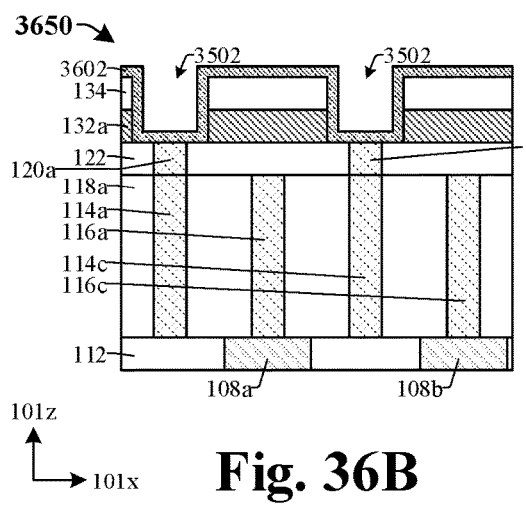
Figure 36C:
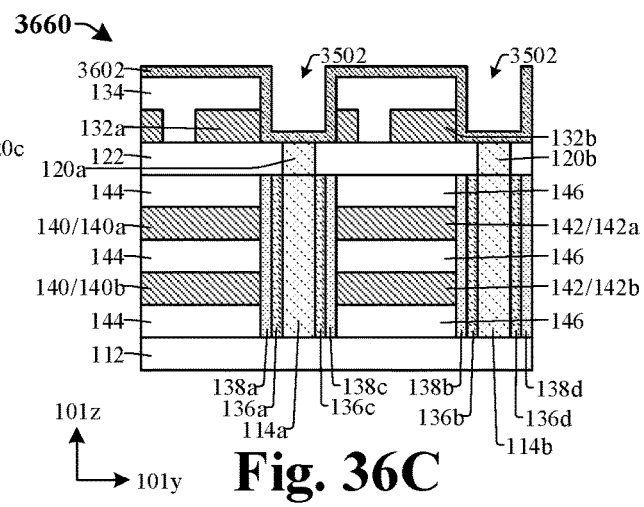

As shown in three-dimensional view 3600 of FIG. 36A, cross-sectional view 3650 of FIG. 36B, and cross-sectional view 3660 of FIG. 36C, a third dielectric layer 3602 is conformally formed over the upper selector dielectric layer 134 and in first portions of the plurality of channel openings 3502. In other words, the third dielectric layer 3602 is formed on sidewalls of the selector gates (e.g., 132*a* and 132*b*) and on sidewalls of the upper selector dielectric layer 134.

In some embodiments, the third dielectric layer 3602 may, for example, be formed by depositing silicon dioxide, aluminum oxide, hafnium oxide, or some other suitable material by a CVD process, a PVD process, an ALD process, or some other suitable process.

Figure 37A:
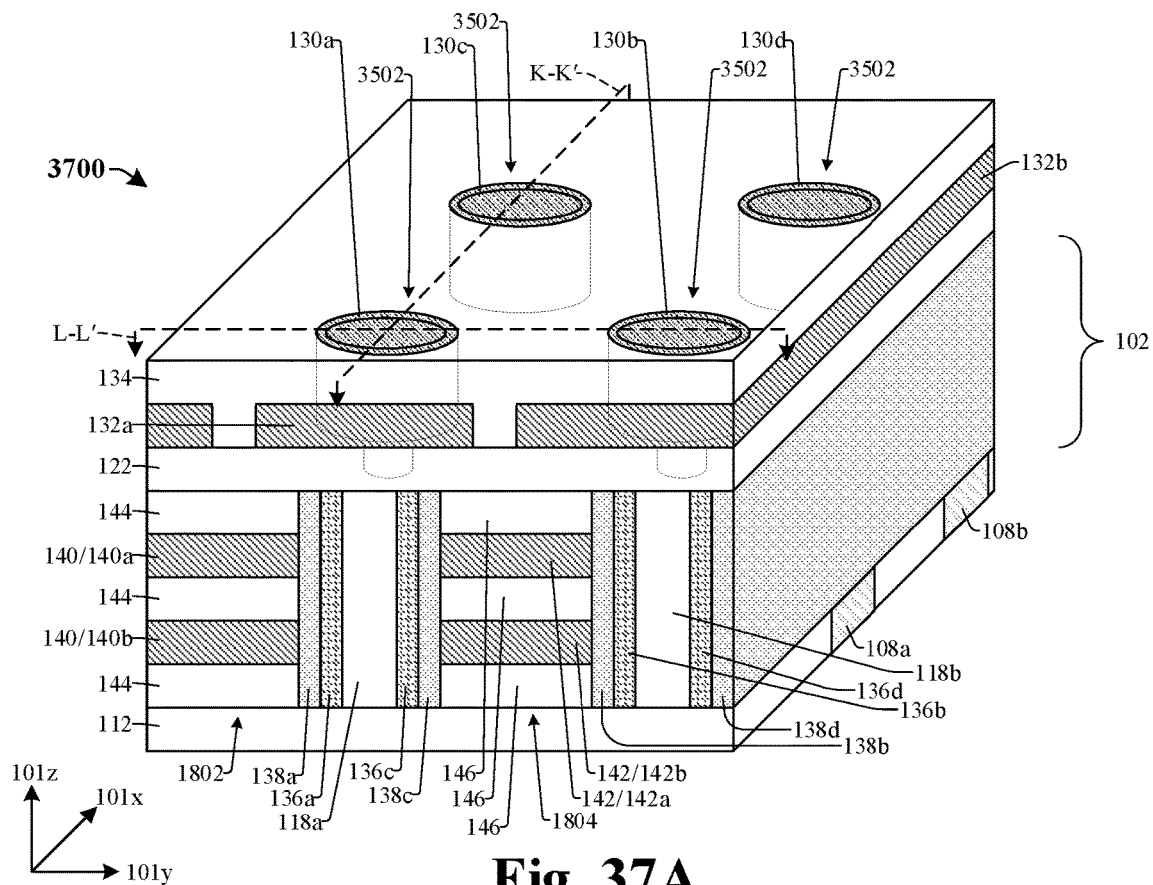
Figure 37B:
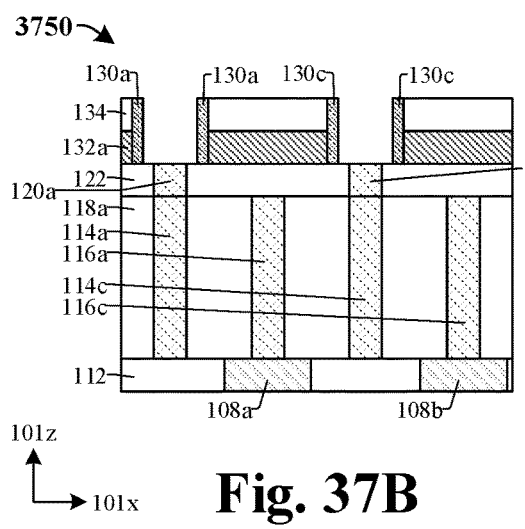
Figure 37C:
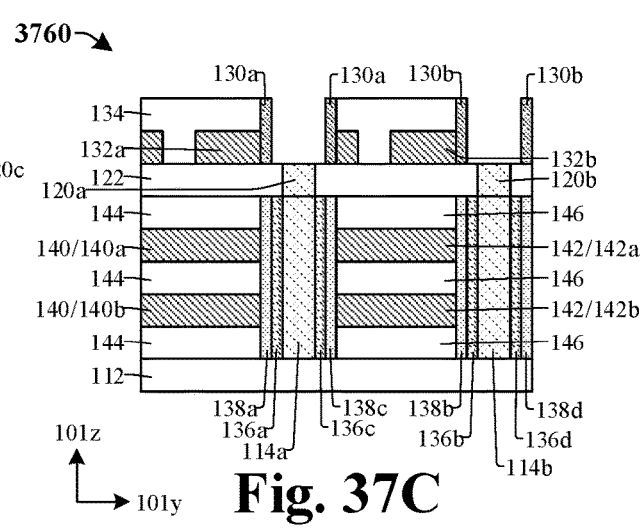

As shown in three-dimensional view 3700 of FIG. 37A, cross-sectional view 3750 of FIG. 37B, and cross-sectional view 3760 of FIG. 37C, the third dielectric layer (e.g., 3602 of FIGS. 36A-C) is removed from a top surface of the upper selector dielectric layer 134 and from top surfaces of the lower source/drain electrodes (e.g., 120*a*-*d*). The removal process forms a plurality of selector gate dielectric layers (e.g., a first selector gate dielectric layer 130*a*, a second selector gate dielectric layer 130*b*, a third selector gate dielectric layer 130*c*, and a fourth selector gate dielectric layer 130*d*) from the third dielectric layer.

In some embodiments, the removal process may, for example, comprise a dry etching process or some other suitable process.

Figure 38A:
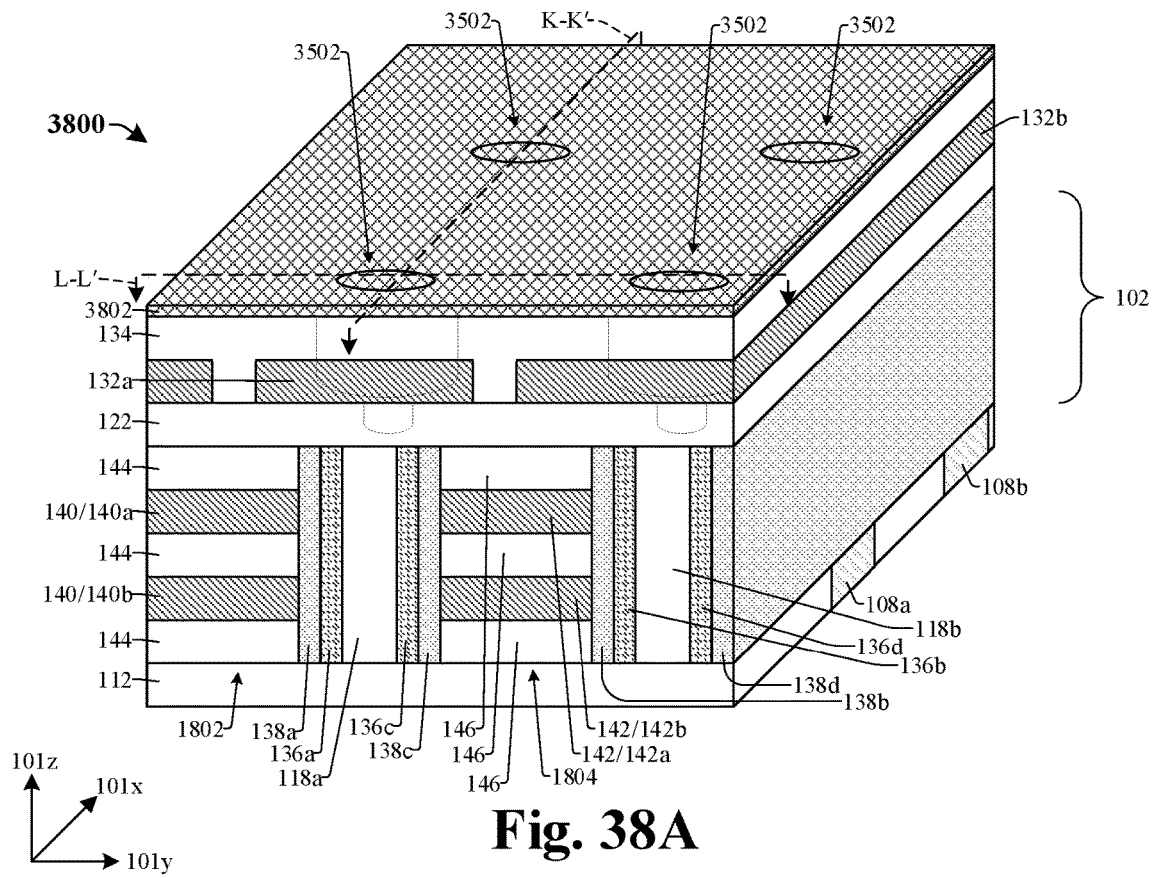
Figure 38B:
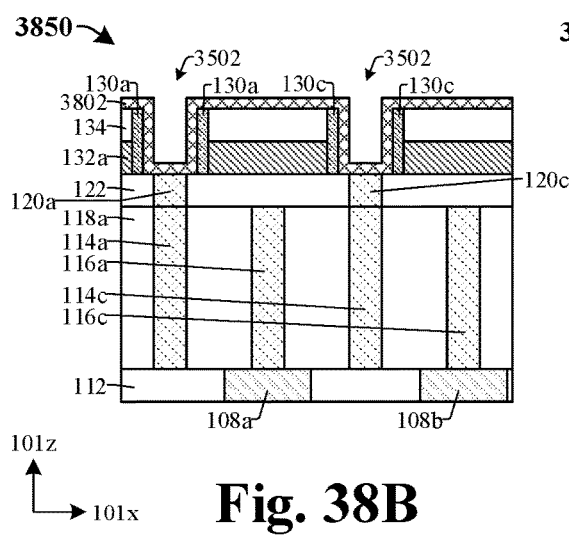
Figure 38C:
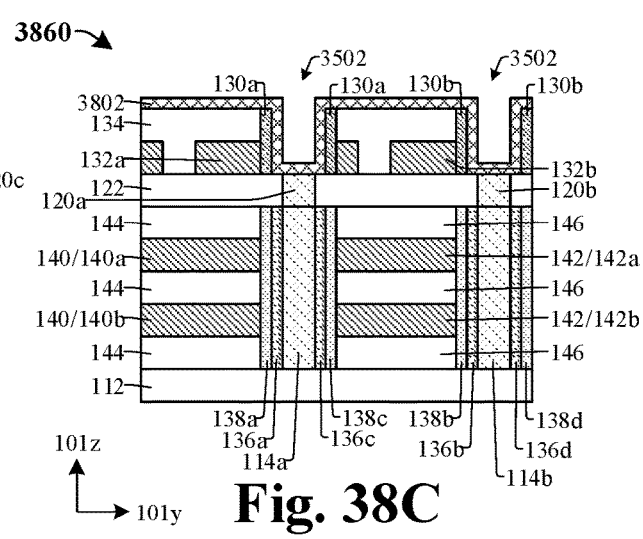

As shown in three-dimensional view 3800 of FIG. 38A, cross-sectional view 3850 of FIG. 38B, and cross-sectional view 3860 of FIG. 38C, a second semiconductor layer 3802 is conformally formed over the upper selector dielectric layer 134 and in second portions of the plurality of channel openings 3502. In other words, the second semiconductor layer 3802 is formed on sidewalls of the selector gate dielectric layers (e.g., 130*a*-*d*) and on top surfaces of the lower source/drain electrodes (e.g., 120*a*-*d*).

In some embodiments, the second semiconductor layer 3802 may, for example, be formed by depositing silicon, germanium, silicon germanium, gallium arsenide, or some other suitable material by a CVD process, a PVD process, an ALD process, an epitaxy process, or some other suitable process.

Figure 39A:
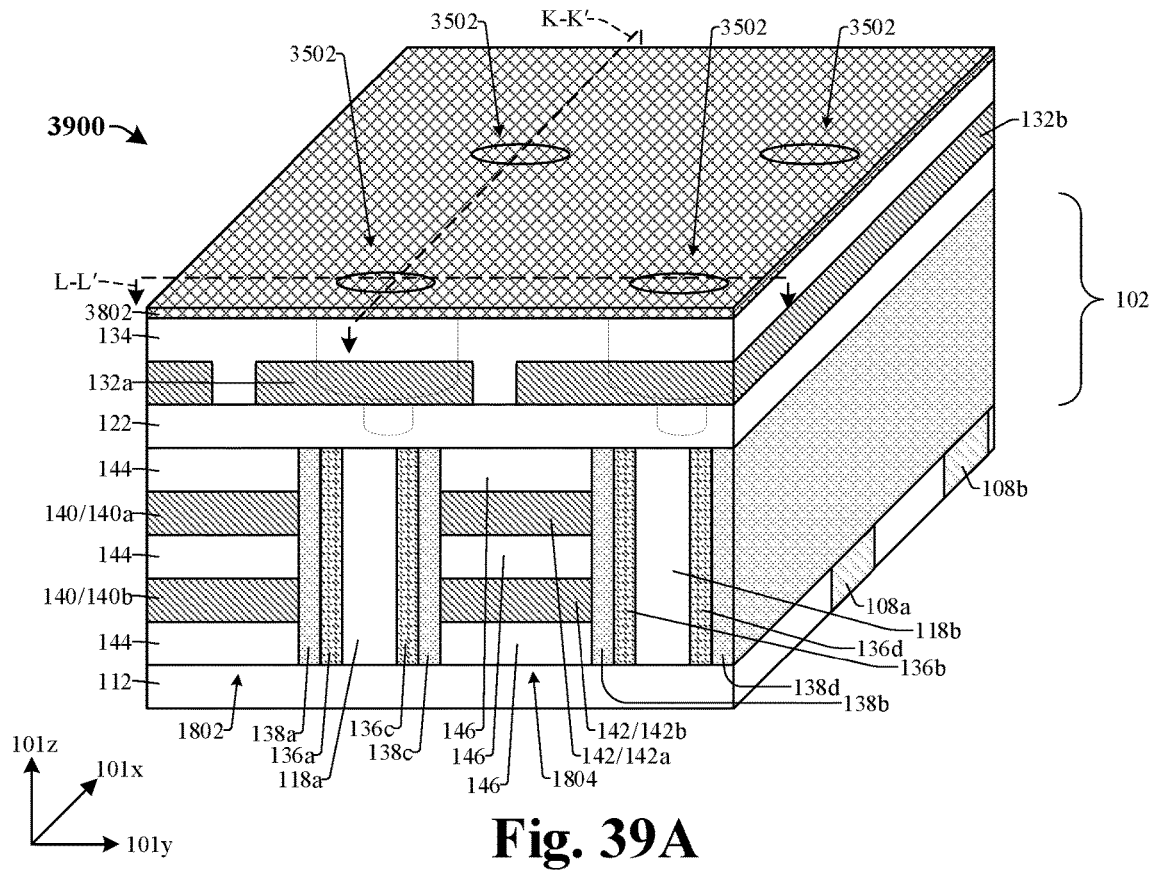
Figure 39B:
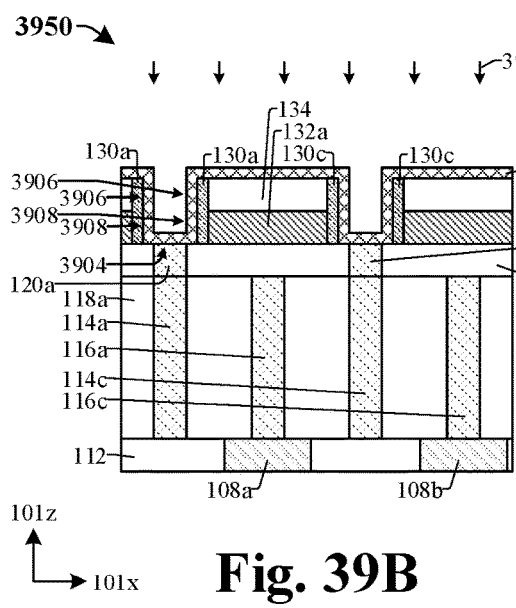
Figure 39C:
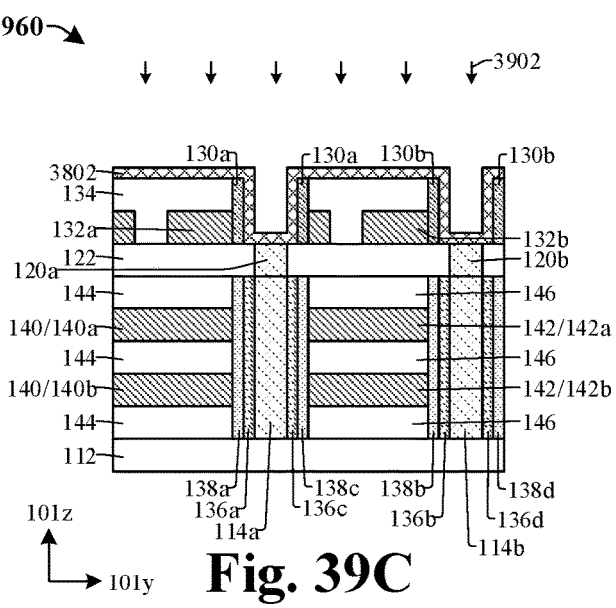

As shown in three-dimensional view 3900 of FIG. 39A, cross-sectional view 3950 of FIG. 39B, and cross-sectional view 3960 of FIG. 39C, an implantation process (e.g., illustrated by arrows 3902) is performed on the second semiconductor layer 3802 to dope the second semiconductor layer 3802. For example, in some embodiments, the implantation process dopes a first region (e.g., 3904 of FIG. 39B) of the second semiconductor layer 3802 and a second region (e.g., 3906 of FIG. 39B) of the second semiconductor layer 3802 more highly than a third region (e.g., 3908) of the second semiconductor layer 3802 to form a first lower source/drain region (e.g., from the first region), a first upper source/drain region (e.g., from the second region), and a channel region (e.g., from the third region) in the second semiconductor layer 3802.

In some embodiments, the implantation process may, for example, be or comprise an ion implantation process or some other suitable process.

Figure 40A:
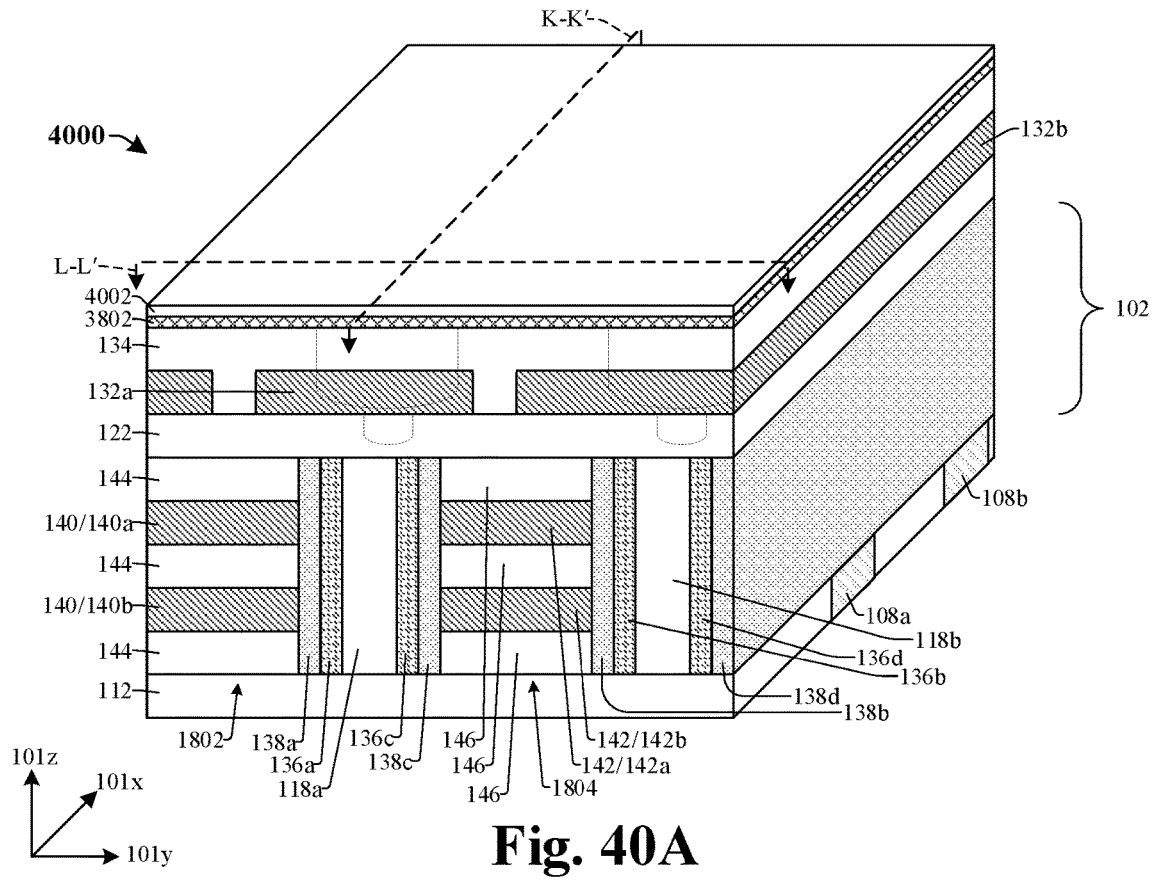
Figure 40B:
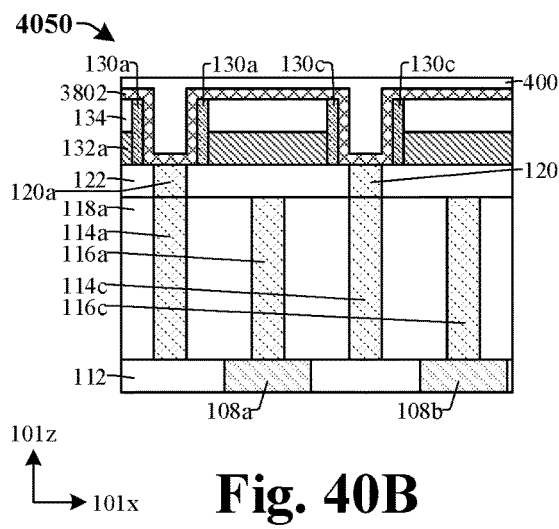
Figure 40C:
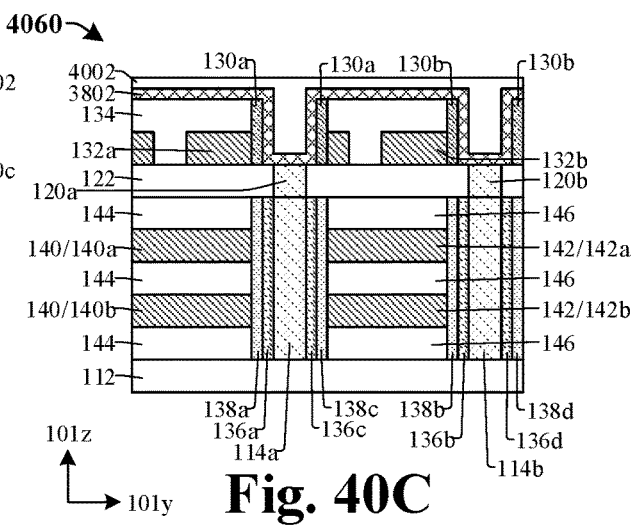

As shown in three-dimensional view 4000 of FIG. 40A, cross-sectional view 4050 of FIG. 40B, and cross-sectional view 4060 of FIG. 40C, a fourth dielectric layer 4002 is formed over the second semiconductor layer 3802 and in remaining portions of the plurality of channel openings (e.g., 3502 of FIGS. 39A-D). In other words, the fourth dielectric layer 4002 is formed between sidewalls of the second semiconductor layer 3802 and on top surfaces of the second semiconductor layer 3802.

In some embodiments, the fourth dielectric layer 4002 may, for example, be formed by depositing silicon dioxide, silicon nitride, silicon oxynitride, or some other suitable material by a CVD process, a PVD process, an ALD process, or some other suitable process.

Figure 41A:
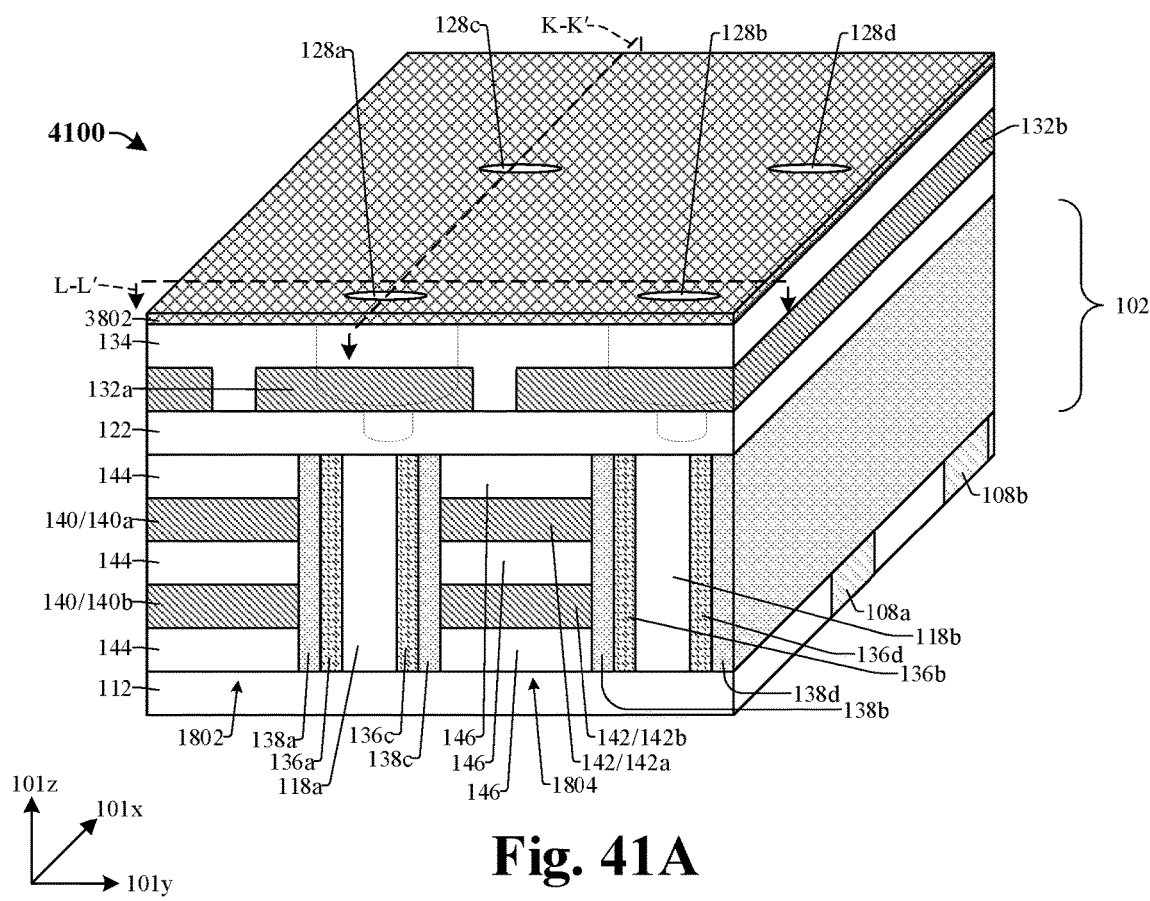
Figure 41B:
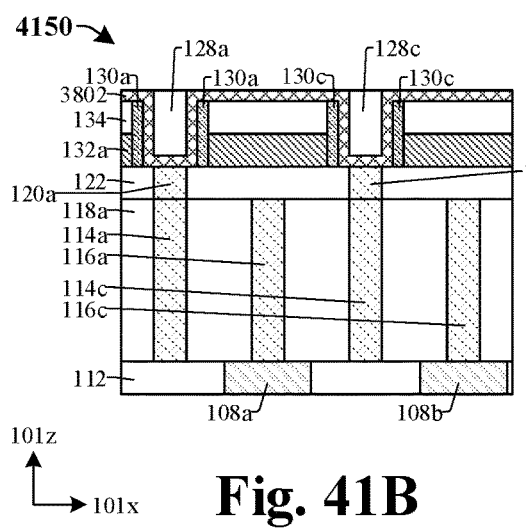
Figure 41C:
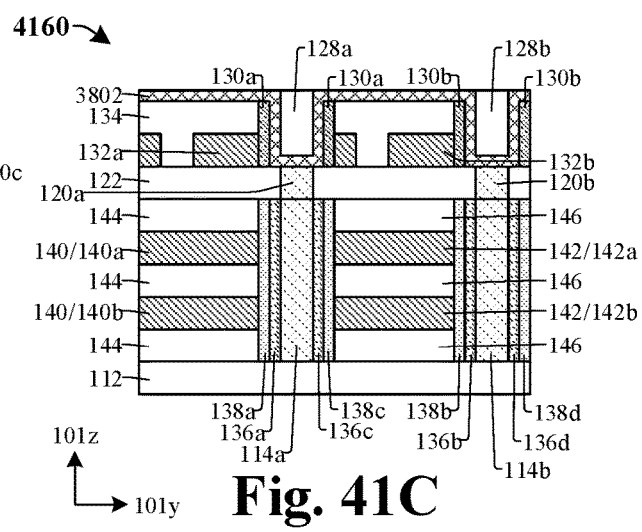

As shown in three-dimensional view 4100 of FIG. 41A, cross-sectional view 4150 of FIG. 41B, and cross-sectional view 4160 of FIG. 41C, the fourth dielectric layer (e.g., 4002 of FIGS. 40A-C) is removed from a top surface of the second semiconductor layer 3802. The removal process forms a plurality of selector spacers (e.g., a first selector spacer 128a, a second selector spacer 128b, a third selector spacer 128c, and a fourth selector spacer 128d) from the fourth dielectric layer.

In some embodiments, removing the fourth dielectric layer may, for example, comprise a wet etching process, a dry etching process, or some other suitable process.

As shown in three-dimensional view 4200 of FIG. 42A, cross-sectional view 4250 of FIG. 42B, and cross-sectional view 4260 of FIG. 42C, the plurality of selector spacers (e.g., 128a-128d) are recessed such that top surfaces of the selector spacers are below top surfaces of the upper selector dielectric layer 134. In some embodiments, the top surfaces of the selector spacers are approximately disposed at a same height as top surfaces of the selector gates (e.g., 132a and 132b) as a result of the recessing. The recessing forms a plurality of upper source/drain openings 4202 directly over the selector spacers and between sidewalls of the second semiconductor layer 3802.

In some embodiments, recessing the plurality of selector spacers may, for example, comprise a wet etching process, a dry etching process, or some other suitable process. In some embodiments, the recessing process illustrated in FIGS. 42A-C and the removal process illustrated in FIGS. 41A-C may be achieved using a single etching process. In some other embodiments, the recessing process illustrated in FIGS. 42A-C and the removal process illustrated in FIGS. 41A-C may be achieved using separate etching processes.

Figure 42A:
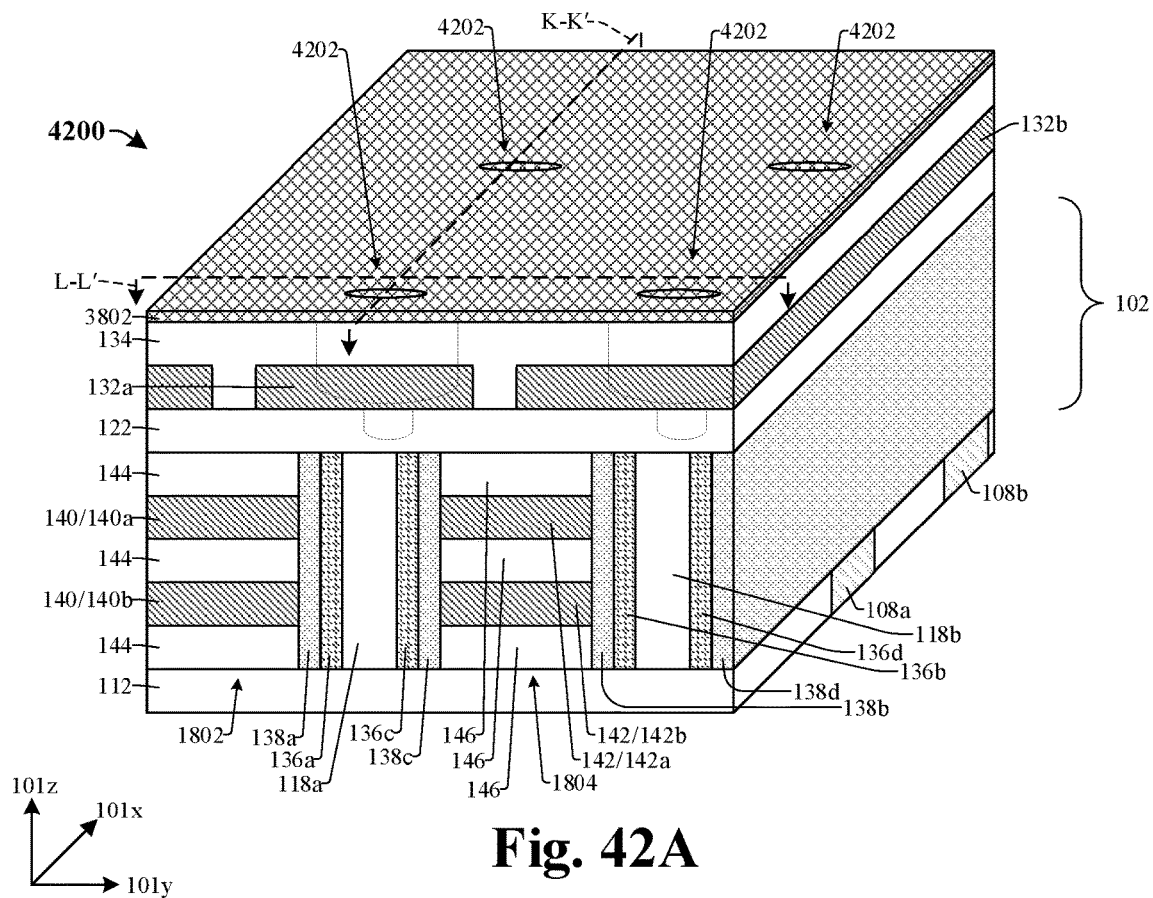
Figure 42B:
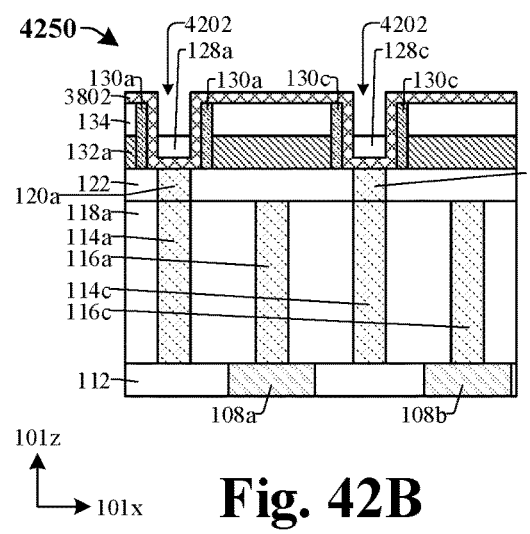
Figure 42C:
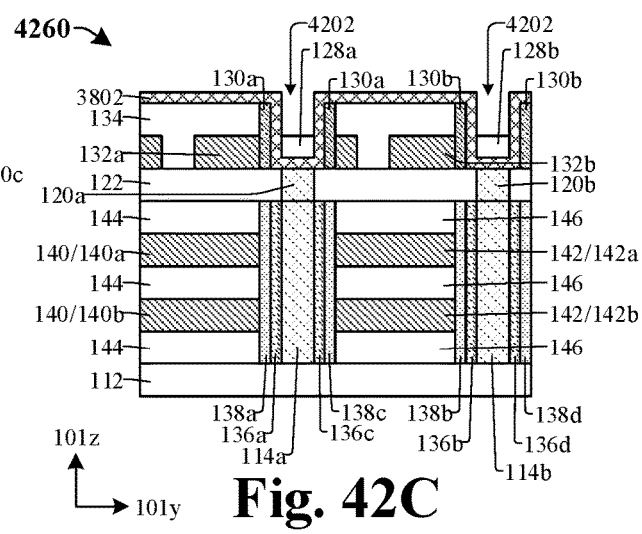
Figure 43A:
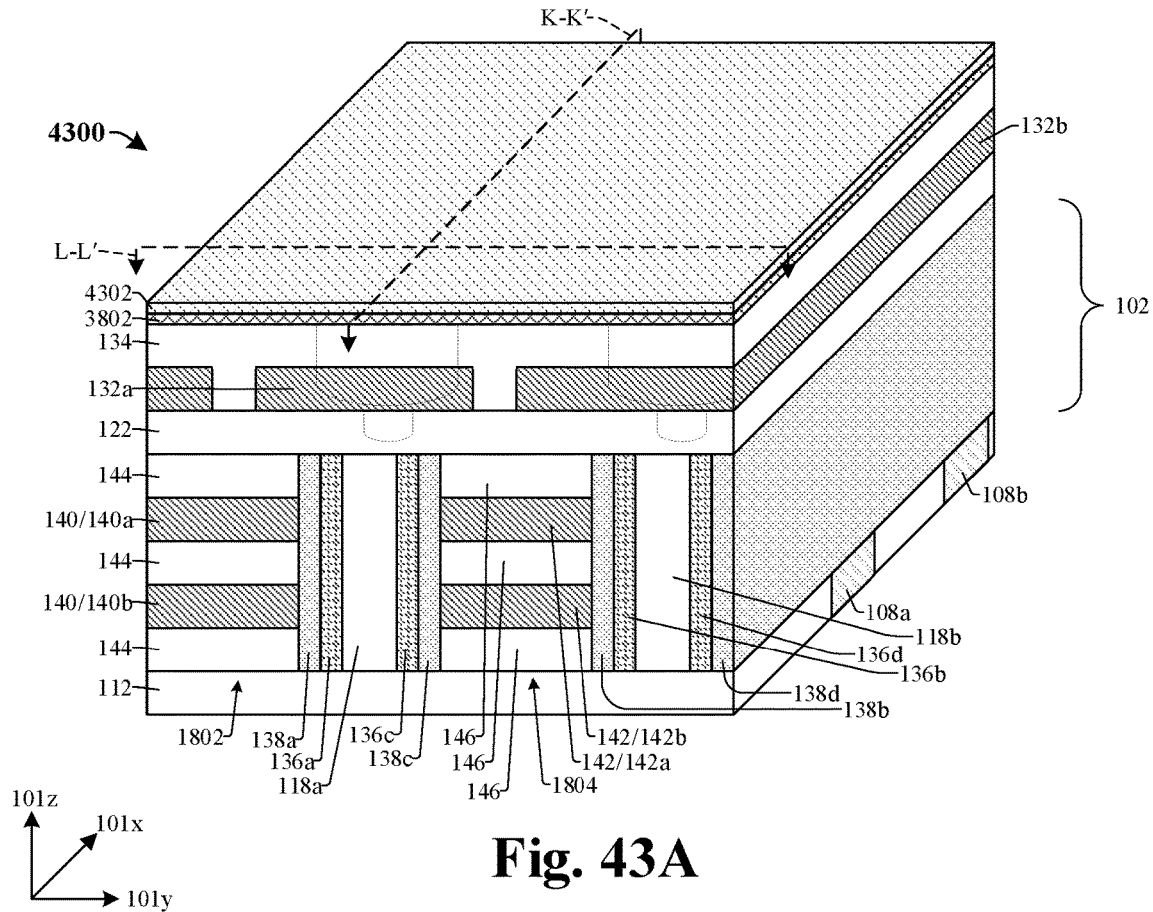
Figure 43B:
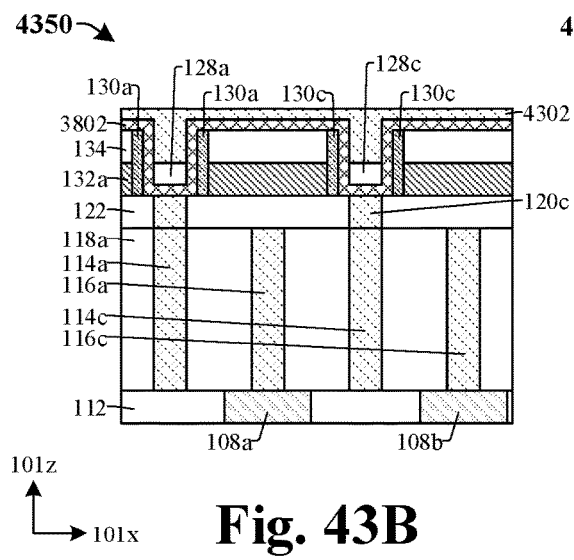
Figure 43C:
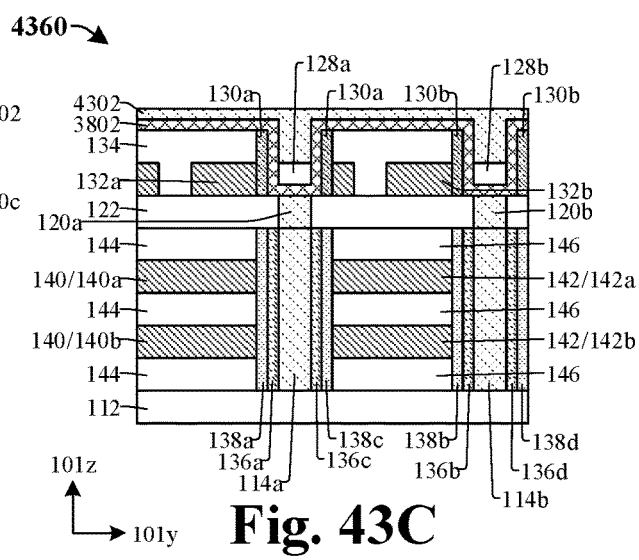

As shown in three-dimensional view 4300 of FIG. 43A, cross-sectional view 4350 of FIG. 43B, and cross-sectional view 4360 of FIG. 43C, a fifth conductive layer 4302 is formed over the second semiconductor layer 3802 and in the plurality of upper source/drain openings (e.g., 4202 of FIGS. 42A-C). In other words, the fifth conductive layer 4302 is formed between sidewalls of the second semiconductor layer 3802 and on top surfaces of the selector spacers (e.g., 128a-128d).

In some embodiments, the fifth conductive layer 4302 may, for example, be formed by depositing tungsten, copper, or some other suitable metal by a sputtering process, an ELD process, an ECP process, or some other suitable process. In some other embodiments, the fifth conductive layer 4302 may, for example, be formed by depositing doped silicon or some other doped semiconductor by a CVD process, a PVD process, an ALD process, an epitaxy process, or some other suitable process.

As shown in three-dimensional view 4400 of FIG. 44A, cross-sectional view 4450 of FIG. 44B, and cross-sectional view 4460 of FIG. 44C, the second semiconductor layer (e.g., 3802 of FIGS. 43A-C) and the fifth conductive layer (e.g., 4302 of FIGS. 43A-C) are removed from over the upper selector dielectric layer 134. The removal process forms a plurality of selector channel layers (e.g., a first selector channel layer 126a, a second selector channel layer 126b, a third selector channel layer 126c, and a fourth selector channel layer 126d) from the second semiconductor layer, and forms a plurality of upper source/drain electrodes (e.g., a first upper source/drain electrode 124a, a second upper source/drain electrode 124b, a third upper source/drain electrode 124c, and a fourth upper source/drain electrode 124d) from the fifth conductive layer.

In some embodiments, the removal process may, for example, comprise a planarization process (e.g., a CMP or the like) or some other suitable process.

As shown in three-dimensional view 4500 of FIG. 45A, cross-sectional view 4550 of FIG. 45B, and cross-sectional view 4560 of FIG. 45C, an upper global line dielectric layer 110 is formed over the upper selector dielectric layer 134 and a first global bit line 106a and a second global bit line 106b are formed within the upper global line dielectric layer 110.

In some embodiments, the upper global line dielectric layer 110 may, for example, be formed by depositing silicon dioxide or some other suitable material by a CVD process, a PVD process, an ALD process, or some other suitable process. In some embodiments, the global bit lines (e.g., 106a and 106b) may, for example, be formed by patterning the upper global line dielectric layer 110 to form openings in the upper global line dielectric layer 110, depositing a conductive layer (e.g., copper or the like) in the openings, and planarizing (e.g., via a CMP or the like) the conductive layer to form the global bit lines.

Figure 46:
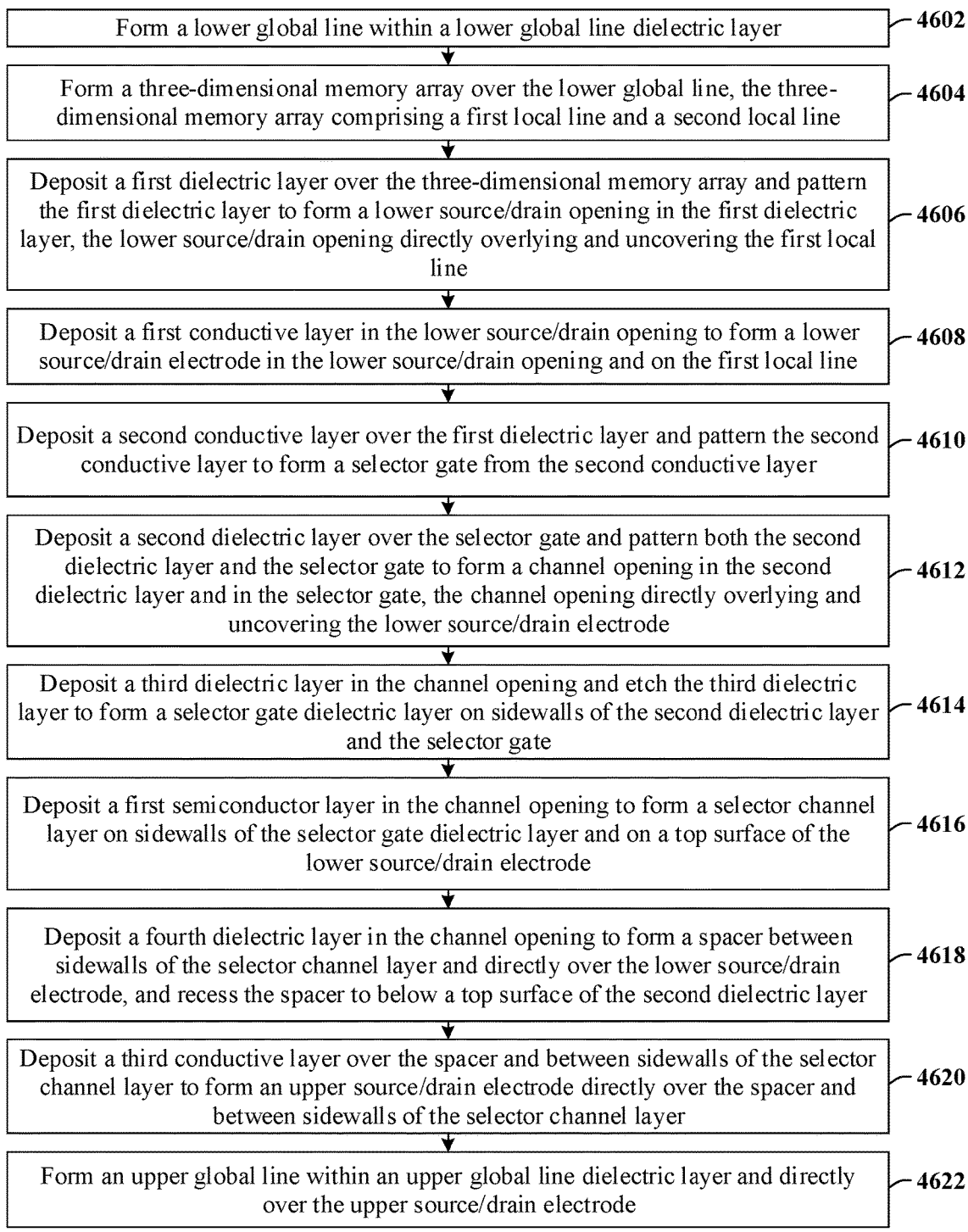
FIG. 46 illustrates a flow diagram of some embodiments of a method for forming an integrated chip comprising a selector arranged over a first local line of a three-dimensional memory array.

FIG. 46 illustrates a flow diagram of some embodiments of a method 4600 for forming an integrated chip comprising a selector arranged over a first local line of a three-dimensional memory array. While method 4600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 4602, a lower global line is formed within a lower global line dielectric layer. FIGS. 17A-C illustrate views 1700, 1750, and 1760 of some embodiments corresponding to act 4602.

At 4604, a three-dimensional memory array is formed over the lower global line, the three-dimensional memory array comprising a first local line and a second local line. FIGS. 17A-C through FIGS. 27A-C illustrate views 1700, 1750, and 1760 through 2700, 2750, and 2760 of some embodiments corresponding to act 4604.

At 4606, a first dielectric layer is deposited over the three-dimensional memory array and the first dielectric layer is patterned to form a lower source/drain opening in the first dielectric layer, the lower source/drain opening directly overlying and uncovering the first local line. FIGS. 28A-C and FIGS. 29A-C illustrate views 2800, 2850, 2860, 2900, 2950, and 2960 of some embodiments corresponding to act 4606.

At 4608, a first conductive layer is deposited in the lower source/drain opening to form a lower source/drain electrode in the lower source/drain opening and on the first local line. FIGS. 30A-C and FIGS. 31A-C illustrate views 3000, 3050, 3060, 3100, 3150, and 3160 of some embodiments corresponding to act 4608.

At 4610, a second conductive layer is deposited over the first dielectric layer and the second conductive layer is patterned to form a selector gate from the second conductive layer. FIGS. 32A-C and FIGS. 33A-C illustrate views 3200, 3250, 3260, 3300, 3350, and 3360 of some embodiments corresponding to act 4610.

At 4612, a second dielectric layer is deposited over the selector gate and both the second dielectric layer and the selector gate are patterned to form a channel opening in the second dielectric layer and in the selector gate, the channel opening directly overlying and uncovering the lower source/drain electrode. FIGS. 34A-C and FIGS. 35A-C illustrate views 3400, 3450, 3460, 3500, 3550, and 3560 of some embodiments corresponding to act 4612.

At 4614, a third dielectric layer is deposited in the channel opening and the third dielectric layer is etched to form a selector gate dielectric layer on sidewalls of the second dielectric layer and the selector gate. FIGS. 36A-C and FIGS. 37A-C illustrate views 3600, 3650, 3660, 3700, 3750, and 3760 of some embodiments corresponding to act 4614.

At 4616, a first semiconductor layer is deposited in the channel opening to form a selector channel layer on sidewalls of the selector gate dielectric layer and on a top surface of the lower source/drain electrode. FIGS. 38A-C and FIGS. 39A-C illustrate views 3800, 3850, 3860, 3900, 3950, and 3960 of some embodiments corresponding to act 4616.

At 4618, a fourth dielectric layer is deposited in the channel opening to form a spacer between sidewalls of the selector channel layer and directly over the lower source/drain electrode, and the spacer is recessed to below a top surface of the second dielectric layer. FIGS. 40A-C through FIGS. 42A-C illustrate views 4000, 4050, and 4060 through 4200, 4250, and 4260 of some embodiments corresponding to act 4618.

At 4620, a third conductive layer is deposited over the spacer and between sidewalls of the selector channel layer to form an upper source/drain electrode directly over the spacer and between sidewalls of the selector channel layer. FIGS. 43A-C and FIGS. 44A-C illustrate views 4300, 4350, 4360, 4400, 4450, and 4460 of some embodiments corresponding to act 4620.

At 4622, an upper global line is formed within an upper global line dielectric layer and directly over the upper source/drain electrode. FIGS. 45A-C illustrate views 4500, 4550, and 4560 of some embodiments corresponding to act 4622.

Thus, the present disclosure relates to an integrated chip comprising a first bit line selector arranged over a first local bit line of a three-dimensional memory array for improving a performance of the integrated chip.

Accordingly, in some embodiments, the present disclosure relates to an integrated chip comprising a three-dimensional memory array. The three-dimensional memory array comprises a first local line and a second local line that are elongated vertically, a first memory cell extending between the first local line and the second local line, and a second memory cell directly under the first memory cell, extending between the first local line and the second local line, and coupled in parallel with the first memory cell. The first memory cell is coupled to a first word line and the second memory cell is coupled to a second word line. The first word line and the second word line are elongated horizontally. A first global line is disposed at a first height and is elongated horizontally. A first selector extends vertically from the first local line to the first global line.

In other embodiments, the present disclosure relates to an integrated chip comprising a first local line and a second local line elongated vertically. The second local line is adjacent to the first local line and is separated from the first local line. A first memory channel layer extends horizontally from the first local line to the second local line. A first memory gate is directly over, and vertically separated from, a second memory gate. The first memory gate and the second memory gate extend along the first memory channel layer from alongside the first local line to alongside the second local line. A first global line is elongated horizontally. The first global line is separated from the first local line. A first selector extends vertically between the first local line and the first global line.

In yet other embodiments, the present disclosure relates to a method for forming an integrated chip. The method comprises forming a three-dimensional NOR memory array. The three-dimensional NOR memory array comprises a first local line and a second local line. A lower source/drain electrode is formed in a first dielectric layer and directly over the first local line. A selector gate is formed over the lower source/drain electrode. A second dielectric layer is deposited over the selector gate. Both the second dielectric layer and the selector gate are patterned to form a channel opening in the second dielectric layer and in the selector gate. The channel opening directly overlies and uncovers the lower source/drain electrode. A selector gate dielectric layer is formed in the channel opening on sidewalls of the second dielectric layer and on sidewalls of the selector gate. A first semiconductor layer is deposited in the channel opening to form a selector channel layer on sidewalls of the selector gate dielectric layer and on a top surface of the lower source/drain electrode. A spacer is formed in the channel opening between sidewalls of the selector channel layer and directly over the lower source/drain electrode. An upper source/drain electrode is formed directly over the spacer and between the sidewalls of the selector channel layer. An upper global line is formed directly over the upper source/drain electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a three-dimensional memory array comprising a first local line and a second local line that are elongated vertically, a first memory cell extending between the first local line and the second local line, and a second memory cell directly under the first memory cell, extending between the first local line and the second local line, and coupled in parallel with the first memory cell, wherein the first memory cell is coupled to a first word line and the second memory cell is coupled to a second word line, and wherein the first word line and the second word line are elongated horizontally;
   a first global line disposed at a first height and elongated horizontally; and
   a first selector extending vertically from the first local line to the first global line, wherein the first selector is a gate-all-around transistor.

2. The integrated chip of claim 1, wherein the first selector is configured to selectively isolate the first local line from the first global line.

3. The integrated chip of claim 1, further comprising:
   a second global line disposed at a second height different from the first height and elongated horizontally, wherein the second global line is on the second local line.

4. The integrated chip of claim 1, further comprising:
   a second global line elongated horizontally; and
   a second selector extending vertically from the second local line to the second global line, wherein the second selector is configured to selectively isolate the second local line from the second global line.

5. The integrated chip of claim 4, wherein the second global line is disposed at the first height and is adjacent to the first global line.

6. The integrated chip of claim 4, wherein the second global line is disposed at a second height different from the first height.

7. The integrated chip of claim 1, wherein the three-dimensional memory array is a three-dimensional NOR memory array.

8. The integrated chip of claim 1, wherein the gate-all-around transistor comprises a lower source/drain electrode, an upper source/drain electrode over the lower source/drain electrode, a selector channel layer extending from the lower source/drain electrode to the upper source/drain electrode and laterally surrounding the upper source/drain electrode, a selector gate dielectric layer laterally surrounding the selector channel layer, and a selector gate laterally surrounding the selector gate dielectric layer.

9. An integrated chip comprising:
   a first local line and a second local line elongated vertically, wherein the second local line is adjacent to the first local line and is separated from the first local line;
   a first memory channel layer extending horizontally from the first local line to the second local line;
   a first memory gate and a second memory gate, wherein the first memory gate is directly over, and vertically separated from, the second memory gate, wherein the first memory gate and the second memory gate extend along the first memory channel layer from alongside the first local line to alongside the second local line;
   a first global line elongated horizontally, the first global line separated from the first local line; and
   a first selector extending vertically between the first local line and the first global line.

10. The integrated chip of claim 9, wherein the first selector comprises a first lower source/drain electrode, a first upper source/drain electrode directly over, and vertically separated from, the first lower source/drain electrode, a first selector channel layer extending vertically from the first lower source/drain electrode to the first upper source/drain electrode and laterally surrounding the first upper source/drain electrode, a first selector gate dielectric layer laterally surrounding the first selector channel layer, and a first selector gate laterally surrounding the first selector gate dielectric layer.

11. The integrated chip of claim 10, wherein the first lower source/drain electrode is on a top surface of the first local line.

12. The integrated chip of claim 10, wherein a bottom surface of the first local line is on the first upper source/drain electrode.

13. The integrated chip of claim 10, wherein the first selector channel layer and the first selector gate dielectric layer are ring shaped.

14. The integrated chip of claim 10, further comprising:
   a first selector spacer directly over the first lower source/drain electrode and directly under the first upper source/drain electrode.

15. The integrated chip of claim 9, further comprising:
   a third local line and a fourth local line elongated vertically; and
   a second selector extending vertically between the third local line and the first global line.

16. The integrated chip of claim 9, further comprising:
   a third local line and a fourth local line elongated vertically;
   a second global line elongated horizontally; and
   a second selector extending vertically between the third local line and the second global line.

17. The integrated chip of claim 16, wherein the first selector comprises a first selector gate and the second selector comprises the first selector gate.

18. An integrated chip comprising:
   a three-dimensional memory array comprising a first local line and a second local line;
   a lower source/drain electrode between sidewalls of a first dielectric layer, wherein the first local line is on a first side of the lower source/drain electrode;
   a selector gate over the first dielectric layer and the lower source/drain electrode;
   a second dielectric layer over the selector gate;
   a selector gate dielectric layer between sidewalls of the selector gate and between sidewalls of the second dielectric layer;
   a selector channel layer between sidewalls of the selector gate dielectric layer and over the lower source/drain electrode;

a spacer between sidewalls of the selector channel layer, over the selector channel layer, and over the lower source/drain electrode;
an upper source/drain electrode between the sidewalls of the selector channel layer and over the spacer; and
a global line on a second side of the lower source/drain electrode, opposite the first side.

19. The integrated chip of claim 18, wherein the lower source/drain electrode is directly over the first local line, and wherein the global line is directly over the upper source/drain electrode.

20. The integrated chip of claim 18, wherein the lower source/drain electrode is directly over the global line, and wherein the first local line is directly over the upper source/drain electrode.

* * * * *